(12) United States Patent
Noguchi et al.

(10) Patent No.: US 7,078,934 B2
(45) Date of Patent: Jul. 18, 2006

(54) LEVEL CONVERSION CIRCUIT

(75) Inventors: Yukihiro Noguchi, Gifu (JP);
Shoichiro Matsumoto, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/754,926

(22) Filed: Jan. 12, 2004

(65) Prior Publication Data

US 2004/0140829 A1    Jul. 22, 2004

Related U.S. Application Data

(63) Continuation of application No. PCT/JP02/07026, filed on Jul. 10, 2002.

(51) Int. Cl.
*H03K 19/094* (2006.01)

(52) U.S. Cl. ............................ 326/68; 326/80; 326/81

(58) Field of Classification Search .................. 326/68, 326/75, 80–81, 63; 327/333
See application file for complete search history.

(56) References Cited

U.S. PATENT DOCUMENTS

| | | |
|---|---|---|
| 4,486,670 A | 12/1984 | Chan et al. |
| 5,387,828 A | 2/1995 | Nakano |
| 6,344,764 B1 * | 2/2002 | Tanzawa ..................... 327/333 |

FOREIGN PATENT DOCUMENTS

| | | |
|---|---|---|
| JP | 1-176115 | 7/1989 |
| JP | 1-231418 | 9/1989 |
| JP | 1-253309 | 10/1989 |
| JP | 03-291013 | 12/1991 |
| JP | 4-97616 | 3/1992 |
| JP | 6-37624 | 2/1994 |
| JP | 6-177744 | 6/1994 |
| JP | 6-204850 | 7/1994 |
| JP | 9-205351 | 8/1997 |
| JP | 2000-286694 | 10/2000 |
| JP | 2001-320268 | 11/2001 |

OTHER PUBLICATIONS

Office Action for Corresponding Korean Patent Application 10-2004-7000337 dated Aug. 31, 2005.

* cited by examiner

*Primary Examiner*—Anh Q. Tran
(74) *Attorney, Agent, or Firm*—McDermott Will & Emery LLP

(57) ABSTRACT

The source of a p-channel MOSFET of a level conversion unit is connected to a supply terminal which receives supply voltage VDD. The drain is connected to an output node NO and the gate is connected to an input node I2. The source of a n-channel MOSFET is connected to an input node I2, the drain is connected to the output node NO and the gate is connected to the supply terminal which receives the supply voltage VDD. Input signals CLK1 and CLK2 change complementarily and difference of voltage between the high level and low level of the signals is smaller than difference between the supply voltage VDD and the ground voltage.

7 Claims, 39 Drawing Sheets

LEVEL CONVERSION CIRCUIT

This application is a Continuation of International Application No. PCT/JP02/07026, filed Jul. 10, 2002.

BACKGROUND OF THE INVENTION

1. Field of the Invention

The present invention relates to a level conversion technology, and it particularly relates to level conversion circuits which convert the voltage amplitude of an input signal to another voltage amplitude.

2. Description of the Related Art

Chips which are called "system on silicon" have been developed as integrated circuits utilizing bulk silicon in recent years, which have microprocessors or memories together with logic circuits on a same chip. Technologies to fabricate the chips are accordingly being developed nowadays, which enable to manufacture a chip that has various circuits with as fine design rules as possible.

The circuits are, however, designed according to respectively different design rules. It is, therefore, unavoidable to integrate the circuits which have the different design rules on a same chip. As a result, a chip comes to have the circuits which operate with different supply voltages and it is required to convert the level of voltage at the interface of each circuit. Moreover, level conversion circuits are naturally required to operate at high speed because pursuing high-speed operation is one original object of providing various circuits on one chip.

Thin film transistors which are made of polycrystalline silicon are generally utilized for display devices such as liquid crystal display, organic EL (Electro Luminescence) and so forth. Level conversion circuits are normally structured by thin film transistors made of polycrystalline silicon in providing the level conversion circuits and these display devices on a same substrate. The characteristics of elements often shift from designed values in manufacturing transistors, such as threshold voltage or the like. Providing level conversion circuits which can accurately operate is required though the characteristics of elements widely shift from the designed values particularly in fabricating thin film transistors made of polycrystalline silicon. Level conversion circuits which can operate even when input signals with small amplitude are given are also required for these display devices, from the view point of power saving and pursuing high-definition.

FIG. 1 is a circuit diagram showing the first example of a known level conversion circuit. A level conversion circuit 800 comprises two p-channel MOSFETs (Metal Oxide Semiconductor Field Effect Transistors) 801, 802 and two n-channel MOSFETs 803, 804. The p-channel MOSFET 801 is connected between a supply terminal which receives supply voltage VDD and an output node N11 and the p-channel MOSFET 802 is connected between the supply terminal and an output node N12. The n-channel MOSFET 803 is connected between the output node N11 and a ground lug and the n-channel MOSFET 804 is connected between the output node N12 and the ground lug. The gates of the p-channel MOSFETs 801 and 802 are respectively connected to the nodes N12 and N11 in a crossing manner. Input signals CLK1 and CLK2 are respectively inputted to the gates of the n-channel MOSFETs 803 and 804, which change complementarily.

The n-channel MOSFET 803 is ON and the n-channel MOSFET 804 is OFF when the input signal CLK1 becomes high and the input signal CLK2 becomes low. Accordingly, the p-channel MOSFET 802 becomes ON and the p-channel MOSFET 801 becomes OFF. As a result, the output voltage Vout of the output node N12 is increased. On the contrary, the output voltage Vout of the output node N12 is decreased when the input signal CLK1 becomes low and the input signal CLK2 becomes high.

It is necessary for the n-channel MOSFETs 803 and 804 to be ON that the voltage amplitude of the input signals CLK1 and CLK2 is larger than the threshold voltage Vtn of the n-channel MOSFETs 803 and 804. The level conversion circuit 800 is, therefore, utilized when the input signals and output signals are in small voltage ratio. The circuit 800 is, for example, suitable for being utilized in converting the signals of 3V system to the signals of 5V system, converting the signals of 2.5V system to the signals of 3V system or converting the signals of 1.8V system to the signals of 2.5V or 3.3V system.

FIG. 2 is a circuit diagram showing the second example of a known level conversion circuit. A level conversion circuit 810 comprises a bias circuit 811, a p-channel MOSFET 812 and a n-channel MOSFET 813.

The p-channel MOSFET 812 is connected between a supply terminal which receives supply voltage VDD and an output node N13. The n-channel MOSFET 813 is connected between the output node N13 and a supply terminal which receives prescribed voltage VEE. An input signal CLK is inputted to the gate of the n-channel MOSFET 812 and the bias circuit 811. The bias circuit 811 inputs the input signal to the gate of the n-channel MOSFET 813 after shifting the center level of the input signal.

The p-channel MOSFET 812 is OFF and the n-channel MOSFET 813 is ON when the input signal CLK becomes high. As a result, the output voltage Vout of the output node N13 is decreased. The p-channel MOSFET 812 is ON and the n-channel MOSFET 813 is OFF when the input signal CLK becomes low. As a result, the output voltage Vout of the output node N13 is increased.

This circuit can be set to operate even when the voltage amplitude of the input signal CLK is smaller than the threshold voltage of the n-channel MOSFET 813 because the bias circuit 811 shifts the center level of the input signal CLK.

FIG. 3 is a circuit diagram showing the third example of a known level conversion circuit. A level conversion circuit 820 comprises a clamp circuit 821 and an amplifying circuit 822 of a current mirror type. The amplifying circuit 822 of the current mirror type comprises two p-channel MOSFETs 831, 832 and two n-channel MOSFETs 833, 834. The p-channel MOSFET 831 is connected between a supply terminal which receives supply voltage VDD and an output node N14 and the p-channel MOSFET 832 is connected between the supply terminal and an output node N15. The n-channel MOSFET 833 is connected between the output node N14 and a ground lug and the n-channel MOSFET 834 is connected between the output node N15 and the ground lug. The gates of the p-channel MOSFETs 831 and 832 are connected to the output node N14. The clamp circuit 821 inputs input signals CLK1 and CLK2, which change complementarily, to the gates of the n-channel MOSFETs 833 and 834 after shifting the center level of the input signals.

The n-channel MOSFET 833 is ON and the n-channel MOSFET 834 is OFF when the input signal CLK1 becomes high and the input signal CLK2 becomes low. Accordingly, the p-channel MOSFETs 831 and 832 become ON. As a result, the output voltage Vout of the output node N15 is increased. On the contrary, the output voltage Vout of the output node N15 is decreased when the input signal CLK1 becomes low and the input signal CLK2 becomes high.

This circuit can operate even when the voltage amplitude of the input signals CLK1 and CLK2 is smaller than the threshold voltage Vtn of the n-channel MOSFETs 833 and 834 because the clamp circuit 821 shifts the center level of the input signals CLK1 and CLK2.

FIG. 4 is a circuit diagram showing the fourth example of a known level conversion circuit. A level conversion circuit 840 shown in the FIG. 4 comprises a clamp circuit 841 and an amplifying circuit 842 of a PMOS cross couple type.

The amplifying circuit 842 of the PMOS cross couple type comprises two p-channel MOSFETs 851, 852 and two n-channel MOSFETs 853, 854. The p-channel MOSFET 851 is connected between a supply terminal which receives supply voltage VDD and an output node N16 and the p-channel MOSFET 852 is connected between the supply terminal and an output node N17. The n-channel MOSFET 853 is connected between the output node N16 and a ground lug and the n-channel MOSFET 854 is connected between the output node N17 and the ground lug. The gates of the p-channel MOSFETs 851 and 852 are respectively connected to the nodes N17 and N16 in a crossing manner. The clamp circuit 841 inputs input signals CLK1 and CLK2, which change complementarily, to the gates of the n-channel MOSFETs 853 and 854 after shifting the center level of the input signals.

The n-channel MOSFET 853 is ON and the n-channel MOSFET 854 is OFF when the input signal CLK1 becomes high and the input signal CLK2 becomes low. Accordingly, the p-channel MOSFET 851 becomes OFF and the p-channel MOSFET 852 becomes ON. As a result, the output voltage Vout of the output node N17 is increased. On the contrary, the output voltage Vout of the output node N17 is decreased when the input signal CLK1 becomes low and the input signal CLK2 becomes high.

This circuit can operate even when the voltage amplitude of the input signals CLK1 and CLK2 is smaller than the threshold voltage Vtn of the n-channel MOSFETs 853 and 854 because the clamp circuit 841 shifts the center level of the input signals CLK1 and CLK2.

The level conversion circuit shown in FIG. 1 can not operate when the voltage amplitude of the input signals CLK1 and CLK2 is smaller than the threshold voltage Vtn of the n-channel MOSFETs 803 and 804.

The level conversion circuit 810 shown in FIG. 2 can operate even when the voltage amplitude of the input signal CLK is smaller than the threshold voltage Vtn of the n-channel MOSFET 813 due to the existence of the bias circuit 811. The level conversion circuits 820 and 840 shown in FIG. 3 and FIG. 4 similarly can operate when the voltage amplitude of the input signals CLK1 and CLK2 is smaller than the threshold voltage Vtn of the n-channel MOSFET 833, 834, 853 and 854 due to the existence of the clamp circuits 821 and 841.

The level conversion circuits 810, 820 and 840, however, can not operate in the case the threshold voltage Vtn of the n-channel MOSFETs shifts widely from a designed value due to irregularity caused in manufacturing process.

The duty ratios of the output voltage waveforms of the level conversion circuits 800, 810, 820 and 840 shown in FIGS. 1, 2, 3 and 4 shift from predetermined designed values in the case that threshold voltages of the p-channel MOSFETs and the n-channel MOSFETs irregularly shift from designed values while being manufactured, such as the case which the threshold voltage Vtp of the p-channel MOSFETs is higher and the threshold voltage Vtn of the n-channel MOSFETs is lower than the designed values, or the case which the threshold voltage Vtp of the p-channel MOSFETs is lower and the threshold voltage Vtn of the n-channel MOSFETs is higher than the designed values. Each duration of on and off status of pixels shifts from designed values in a plurality of display devices if the duty ratios of signals do not remain 50%, especially in utilizing the level conversion circuits for acquiring the clock signals of the display devices.

The electric charge of the gates of the p-channel MOSFETs 801 and 802 are respectively transferred from one to the other when the ON and OFF status of the n-channel MOSFETs 803 and 804 is inverted in the level conversion circuit 800 shown in FIG. 1. The operation at high speed, therefore, can not be realized because time for inverting the level of the output voltage Vout is required. The time required becomes longer if transistors which do not have high operation capacity are utilized as the p-channel MOSFETs 801 and 802, such as thin film transistors made of polycrystalline silicon. Electric power consumed increases according to the length of the time required for inverting the level of the output voltage Vout because there flows penetration current to the ground lug, which flows from supply terminal to the ground lug through the route of p-channel MOSFET 801 and n-channel MOSFET 803 or the route of p-channel MOSFET 802 and n-channel MOSFET 804.

There is also room of improvement for the level conversion circuits 820 and 840 shown in FIG. 3 and 4 because the clamp circuits 821 and 824 provided thereto generally occupy large areas.

SUMMARY OF THE INVENTION

The object of the present invention is to provide level conversion circuits which can operate with higher accuracy even when the threshold voltages of transistors have shifted from designed values due to irregularity caused in manufacturing process and also can realize high-speed operation, power saving and the diminishment of area occupied by the circuits.

An embodiment according to the present invention relates to a level conversion circuit. This circuit comprises a first transistor of a first conducive type which is connected between a supply node to which supply voltage is impressed and an output node, and a second transistor of a second conducive type which is connected between a first input node to which a first input signal is inputted and the output node. The control electrode of the second transistor is connected to the supply node. The control electrode of the first transistor is connected to a second input node to which a second input signal is inputted. An output signal is obtained from the output node.

This structure enables to control the ON status of the first and second transistors in accordance with the change of the first and second signals, and the output signal can be obtained, the high level of which depends on the supply voltage. The structure can be, therefore, realized, which can operate even when the voltage amplitude of the first input signal and second input signal is smaller than the threshold voltages of the first and second transistors.

High-speed operation can also be easily realized by this structure because the control electrode of the second transistor has stable voltage and therefore the ON status of the second transistor can be directly controlled by the first input signal. The high-speed operation shortens the transition time of the voltage of the output signal and accordingly shortens the duration for flowing of penetration current. This structure can, therefore, contribute to power saving. Moreover, this structure is advantageous in designing circuits to have small area occupied thereby because main part of this structure can be realized only by the first and second transistors.

According to an embodiment of the present invention, the single supply voltage may be set for the first and second transistors or different supply voltages may be set for each transistor. The supply voltage corresponding to the first transistor is set to a higher value than the high level of the first input signal and the supply voltage corresponding to the second transistor is set to a higher value than the high level of the second input signal. The degree of the ON status of the first and second transistors is controlled according to the difference between the supply voltages and the voltage of the first and second input signals. Then the first input signal is converted to an output signal which corresponds to the supply voltage.

According to another embodiment, the supply voltage is set to a higher value than the high level of the first input signal and the degree of the ON status of the first transistor is controlled according to the difference of the voltage between the supply voltage and the first input signal. Then the first input signal is converted to the output signal which corresponds to the supply voltage.

According to still another embodiment, the supply voltage is set to a higher value than the high level of the second input signal and the degree of the ON status of the second transistor is controlled according to the difference of the voltage between the supply voltage and the second input signal and then the first input signal is converted to the output signal which corresponds to the supply voltage that acts on the first transistor. "The supply voltage which acts on the first transistor" is, for example, the supply voltage which is impressed to the source of a MOSFET, when the transistor is the MOSFET.

The words "corresponds to" do not necessarily mean that the output signal and the supply voltage are identical but it is sufficient if the output signal is a function of the supply voltage. The high level of the output signal is, for example, increased to a higher value than the high level of the input signal if the supply voltage is a relatively high value.

Hereunder, in a case that a circuit has from first to fourth transistors, a single supply voltage may be set for the transistors in common or different supply voltages may be respectively set for the first transistor and third transistor when referring to the "supply voltage" or the "first supply voltage", and the "second supply voltage". This manner of thinking regarding the supply voltage is effective throughout this specification even when there is not obviously mentioned if the single supply voltage is set or the different voltages are respectively set for the transistors. This is because to describe this discrimination of the supply voltages is excessively troublesome rather than beneficial for those skilled in the art. Similar manner of thinking is also effective in referring to "ground voltage".

According to another embodiment of the present invention, the control electrode of the second transistor is connected to the supply node via a control circuit which decreases the supply voltage by a prescribed value. The control electrode of the first transistor may similarly be connected to the second input node via a control circuit which increases the voltage of the second input node by a prescribed value. These control circuits enable to avoid situation that the difference between the supply voltage and the voltage of first input node or the difference between the supply voltage and the voltage of the second input node is too large for the second or first transistor to be OFF to the necessary extent. Both the first and second transistors generally can be always kept to be ON and the output signal can be converted to more higher or lower voltage according to the degree of the ON status of the transistors, namely by the "tug of war" between the transistors. This is because transistors can be considered as resistor elements, the resistance of which is equivalent to the ON status resistance thereof. This method is suitable for circuits to operate at high speed because the time to transfer the status of transistors from complete OFF to ON is not required. The voltage of the output signal, however, can not be transferred to the necessary extent if the ON status of the transistor is excessively strong at the timing the transistor should originally be OFF. The control circuit is, therefore, provided with moderate setting in order to adjust the control voltage to the preferred value.

The first and second nodes may be a single common node. In this case, moreover, the level conversion circuit may also comprise a control circuit which inverts the first input signal that is inputted to the common node, and the output signal of the control circuit may impressed to the control electrode of the first transistor instead of the second input signal. The meaning of the "common node" comprises both cases that:

1) the common node is a physically single node; and 2) the first input signal is commonly inputted to both of physically two nodes. Namely, the node stands for physical and logical meanings, and this is effective throughout this specification.

This embodiment can contribute to reduce the size of the level conversion circuits because the second input signal is not necessary and the input signals to the circuits are reduced. This idea of the common node is effective in any embodiments described hereafter.

Still another embodiment of the present invention also relates to a level conversion circuit. This circuit comprises a first transistor of a first conductive type which is connected between a supply node and a first output node, a second transistor of a second conductive type which is connected between a first input node to which a first input signal is inputted and the first output node, a third transistor of the first conductive type which is connected between the supply node and a second output node, and a fourth transistor of the second conductive type which is connected between a second input node to which a second input signal is inputted and the second output node. The control electrodes of the second and fourth transistors are connected to the supply node and the control electrodes of the first and third transistors are respectively connected to the second output node and the first output. An output signal is obtained from the first or second output node in this structure.

Preferred level conversion can be easily realized because the first and third transistors can be more accurately controlled regardless of the threshold voltage thereof, according to this structure. The duty ratios of the output signals tend to match to each other, which are respectively outputted from the circuit structured by the first and second transistors and the circuit structured by the third and fourth transistors even when there is difference between the duty ratios of the signals. This is because the output signal of one circuit is utilized as the control signal of the other circuit and therefore they are complemented by each other. Accordingly, it can be expected that the circuit can, therefore, infallibly operate even in the case that the threshold voltages of the four transistors have shifted from designed values due to irregularity caused in manufacturing process.

Yet another embodiment of the present invention also relates to a level conversion circuit. This circuit comprises a first transistor of a first conductive type which is connected between a supply node and a first output node, a second transistor of a second conductive type which is connected between a first input node to which a first input signal is inputted and the first output node, a third transistor of the first conductive type which is connected between the supply node and a second output node, and a fourth transistor of the second conductive type which is connected between a second input node to which a second input signal is inputted and the second output node. The control electrodes of the second and fourth transistors are respectively connected to the second output node and the first output node, and the control electrodes of the first and third transistors are respectively connected to the second input node and the first input node. An output signal is obtained from the first or second output node.

Preferred level conversion can be easily realized because the second and fourth transistors can be infallibly controlled regardless of the threshold voltage thereof, according to this structure. Moreover, the above-described complementing effect of duty ratios can also be obtained.

A prescribed reference voltage signal may be inputted as the second signal in the level conversion circuits described above. The reference voltage signal may be a fixed voltage signal and the value of the voltage is higher than the ground voltage and lower than the supply voltage. The value is, for example, a mean value between the ground voltage and the supply voltage.

Yet another embodiment of the present invention also relates to a level conversion circuit. The circuit comprises any two level conversion circuits of the above-described level conversion circuits, to which respectively inputted are the mutually replaced first signal and second signal, and also comprises a differential amplifying circuit of a cross couple type or an amplifying circuit of a current mirror type which utilizes the output signals of those two level conversion circuits as input signals. These amplifying circuits are structured by two routes for electric current which respectively have two transistors and each point which connects the two transistor is connected to the output nodes from which output signals are finally acquired. The above-described improvement regarding the duty ratios can also be acquired in this structure.

Yet another embodiment of the present invention also relates to a level conversion circuit. This circuit is provided with a first transistor and a second transistor. The transistors are connected in series between supply voltage and prescribed voltage, the difference of the voltage between which is larger than the amplitude of an input signal, so that there might be voltage division effect by resistors that the intermediate voltage between the supply voltage and the prescribed voltage is generated according to the ratio of the ON status resistance of the transistors. The first transistor becomes strong ON status when the input signal is high while the second transistor becomes weak ON or OFF status because the difference between the voltage of the input signal and the supply voltage is small. The second transistor becomes strong ON status when the input signal is low while the first transistor becomes weak ON or OFF status because the difference between the voltage of a signal inverted from the input signal and the supply voltage is small. According to this structure, intermediate voltage can be acquired as an output signal, which is generated due to the voltage division effect by resistors. The prescribed voltage described above is voltage which has significant difference from the supply voltage, such as, for example, ground voltage or the voltage of the input signal at the low or high level.

Yet another object of the present invention also relates to a level conversion circuit. This circuit is provided with a first transistor and a second transistor. The first and second transistors are connected in series in this order between first supply voltage and prescribed voltage, the difference of voltage between which is larger than the amplitude of an input signal, so that there might be the voltage division effect by resistors between the first supply voltage and the prescribed voltage by the ON status resistance of the first and second transistors. This circuit is also provided with a third transistor and a fourth transistor. The third and fourth transistors are connected in series in this order between second supply voltage and the prescribed voltage, the difference of voltage between which is larger than the amplitude of a signal inverted from the input signal, so that there might be the voltage division effect by resistors between the second supply voltage and the prescribed voltage by the ON status resistance of the third and fourth transistors. The first and fourth transistors become strong ON status and the second and third transistors become weak ON or OFF status when the input signal is high. The second and third transistors become strong ON status and the first and fourth transistors become weak ON or OFF status when the input signal is low. According to this structure, intermediate voltage generated from the voltage division effect by resistors by the first and second transistors is utilized to control the third or fourth transistor and intermediate voltage generated from the voltage division effect by resistors by the third and fourth transistors is utilized to control the first or second transistor and then one of the intermediate voltages is obtained as an output signal.

It is also preferable the structure that the second and third transistors become the weak ON or OFF status according to the difference between the voltage of the input signal and the first and second supply voltages when the input signal is high, and the first and fourth transistors become the weak ON or OFF status according to the difference between the voltage of the signal inverted from the input signal and the first and second voltages when the input signal is low.

Yet another embodiment of the present invention also relates to a level conversion circuit. This circuit comprises a p-channel field effect transistor which is connected between an output node and a supply node to which supply voltage is impressed, which is higher than the high level of an input signal, and a n-channel field effect transistor which is connected between a first input node to which the input signal is inputted and the output node. The gate of the n-channel field effect transistor is connected to a supply node and the gate of the p-channel field effect transistor is connected to a second input node to which the inversion signal of the input signal is inputted. Then an output signal is obtained from the output node.

Yet another embodiment of the present invention also relates to a level conversion circuit. This circuit comprises a first transistor which is a p-channel field effect transistor connected between a first supply node to which first supply voltage is impressed and a first output node, a second transistor which is a n-channel field effect transistor connected between a first input node to which a first input signal is inputted and the first output node, a third transistor which is a p-channel field effect transistor connected between a second supply node to which second supply voltage is impressed and a second output node, and a fourth transistor connected between a second input node to which a second input signal is inputted and the second output node. In this structure, moreover, 1) the gates of the second and fourth transistors are respectively connected to the first or second supply node and the gates of the first and third transistors are respectively connected to the second and first output nodes and an output signal is acquired from the first or second output node, or 2) the gates of the second and fourth transistors are respectively connected to the second and first output nodes and the gates of the first and third transistors are respectively connected to the second and first input nodes and the output signal is acquired from the first or second node.

The first supply node and second supply node may be a single node or separate nodes, also in this structure. The gates of the second and fourth transistors, moreover, may be respectively connected to one of the first supply node and the second supply node via control circuits which respectively decrease the first or second supply voltage by a prescribed value. A prescribed reference voltage signal may also be inputted as the second input signal.

Yet another embodiment of the present invention also relates to a level conversion circuit. The circuit comprises a first transistor of a first conductive type connected between a supply node to which supply voltage is impressed and a first output node, a second transistor of a second conductive type connected between a first input node to which a first input signal is inputted and the first output node, a third transistor of the first conductive type connected between the supply node and a second output node, and a fourth transistor of the second conductive type connected between a second input node to which a second input signal is inputted and the second output node. The control electrodes of the second and fourth transistors are connected to the supply node via control circuits which decrease the supply voltage by a prescribed value and the control electrodes of the first and third transistors are respectively connected to the second and first output nodes. An output signal is accordingly obtained from the first or second output node. The level conversion circuit can appropriately operate when supply voltage at various ranges is impressed by providing the control circuit.

In any level conversion circuit described above, the output signal may be adjusted to have target voltage Vm=(VG+VDD)/2 as the center of the amplitude thereof when the ground voltage and the supply voltage are respectively described as VG and VDD. The circuit may also be provided with a buffer circuit which has the target voltage Vm as the central point of operation, and the amplitude of the output of which covers from the voltage close to the ground voltage to the voltage close to the supply voltage. Modified output signal may be obtained by passing the output signal through the buffer circuit.

Any transistor or all transistors described above may be made of polycrystalline semiconductor. It is often required to form circuits on transparent glass substrate in utilizing the level conversion circuits according to the present invention for the driver circuits of liquid crystal display devices or other display devices. Polycrystalline type semiconductor is favorable for utilizing in such a case or the like because the polycrystalline semiconductor has relatively high performance and the thin film thereof can be easily formed on the glass. Moreover, polycrystalline semiconductor is advantageous from the viewpoint of operation speed.

Any level conversion circuit described above may be incorporated into a prescribed semiconductor device or the like. The semiconductor device, for example, comprises sensors, transistors for selection which select a sensor, peripheral circuits which operate the sensors via the transistors for selection and level conversion circuits which convert the level of a prescribed signal and input the converted signal to the peripheral circuits. The display device, for example, comprises display elements, transistors for selection which select a display element, peripheral circuits which operate the display elements via the transistors for selection and level conversion circuits which convert the level of a prescribed signal and input the converted signal to the peripheral circuits. The display elements may be liquid crystal display elements or organic electro luminescence elements. The liquid crystal elements, transistors for selection, peripheral circuits and level conversion circuits may be formed on an insulated-substrate. The transistors for selection and the transistors from the first to the fourth of the level conversion circuits may be thin film transistors. In any case, the devices can operate more accurately even when the threshold voltages of the transistors have shifted from designed values due to irregularity caused in manufacturing process. It also becomes easy to operate the devices at high speed, to save the electric power consumed by the devices and to design the devices to occupy less area.

It is to be noted that any arbitrary combination of the above-described structural components and the expressions of this invention replaced or substituted in part or whole between a method, an apparatus and a system are all effective as and encompassed by the present embodiments.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Embodiment 1

Figure 5:
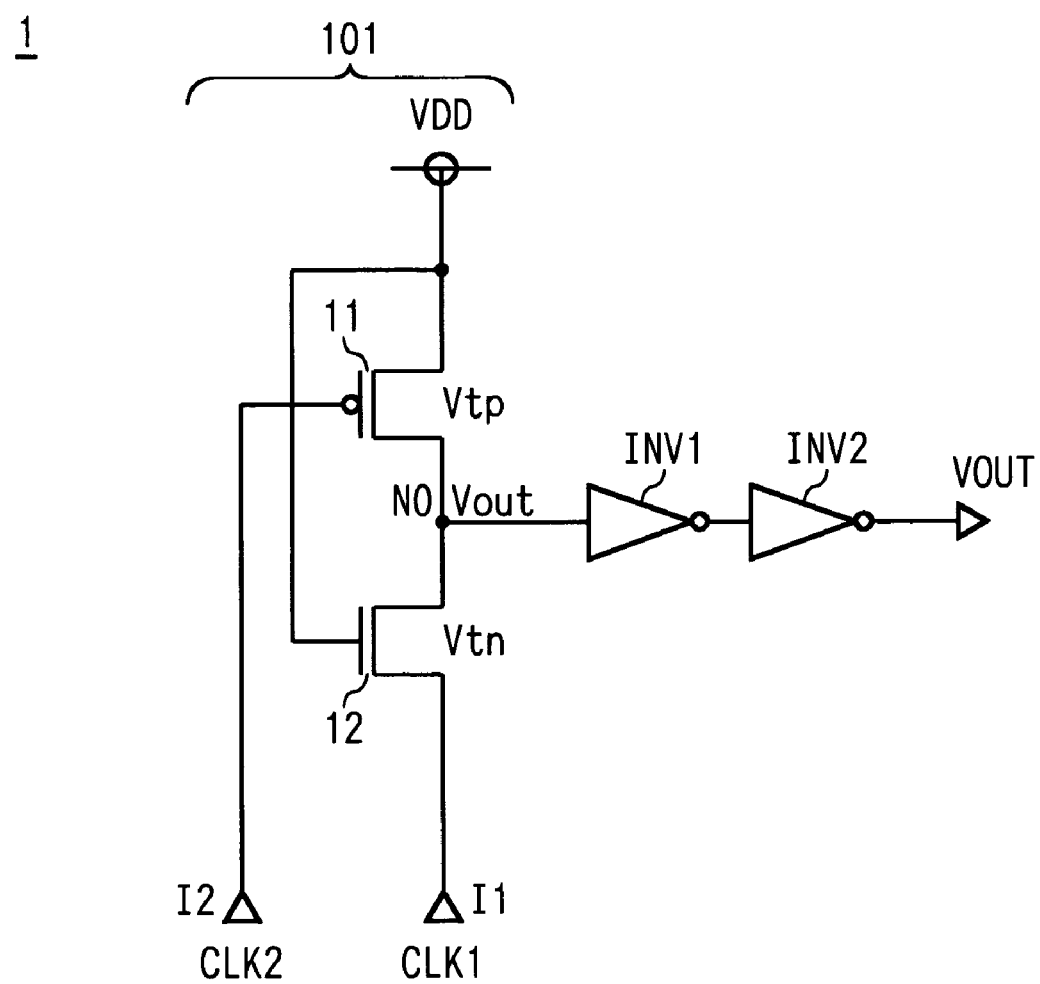
FIG. 5 is a circuit diagram showing the structure of a level conversion circuit according to an embodiment 1 of the present invention.

FIG. 5 is a circuit diagram showing the structure of a level conversion circuit according to a first embodiment of the present invention. In FIG. 5, a level conversion circuit 1 comprises a level conversion unit 101 and drive inverters INV1 and INV2 which are utilized as drivers. The level conversion unit 101 comprises a p-channel MOSFET (Metal-Oxide-Semiconductor Field Effect Transistor) 11 and a n-channel MOSFET 12. The drive inverters INV1 and INV2 are respectively structured by a CMOS circuit which is structured by a p-channel MOSFET and a n-channel MOSFET.

The source of the p-channel MOSFET 11 is connected to a supply terminal which receives supply voltage VDD, the drain is connected to an output node NO and the gate is connected to an input node I2. The source of the n-channel MOSFET 12 is connected to an input node I1, the drain is connected to the output node NO and the gate is connected to the supply terminal which receives the supply voltage VDD.

Input signals CLK1 and CLK2 are inputted to the input nodes I1 and I2, the high level and low level of which change complementarily. The difference of voltage between the high level and low level of the input signals CLK1 and CLK2 is smaller than the difference of voltage between the supply voltage VDD and ground voltage. According to this embodiment, the low level of the input signals CLK1 and CLK2 is the ground voltage. The high level is lower than the supply voltage VDD and higher than the ground voltage.

Hereunder describes the operation of the level conversion circuit 5. The p-channel MOSFET 11 becomes OFF or weak ON status according to whether the absolute value of the threshold voltage Vtp of the p-channel MOSFET 11 is smaller than the absolute value of the difference between the voltage of the CLK2 at the high level, which is the voltage of the gate, and the supply voltage which is the voltage of the source, when the CLK1 is low and the CLK2 is high. The n-channel MOSFET 12 becomes strong ON status because the voltage of the source is the low level of the CLK1 and the voltage of the gate is the supply voltage. The ON status resistance of the p-channel MOSFET 11 is, therefore, higher than that of the n-channel MOSFET 12. Voltage Vout of the output node NO becomes lower because it reflects the low-level of the CLK1 which is the voltage of the source of the n-channel MOSFET 12.

The p-channel MOSFET 11 becomes strong ON status because the voltage of the gate is the low level of the CLK2 and the voltage of the gate is the supply voltage, when the CLK1 is high and the CLK2 is low. The n-channel MOSFET 12 becomes OFF or weak ON status according to whether the absolute value of the threshold voltage Vtn of the n-channel MOSFET 12 is smaller than the absolute value of the difference between the voltage of CLK1 at the high level, which is the voltage of the source, and the supply voltage, which is the voltage of the gate. The ON status resistance of the p-channel MOSFET 11 is, therefore, lower than that of the n-channel MOSFET 12. The voltage Vout of the output node NO becomes higher because it reflects the supply voltage which is the voltage of the source of the p-channel MOSFET 11. The drive inverters INV1 and INV2 convert the output voltage Vout to output voltage VOUT which changes between the supply voltage VDD and the ground voltage.

Hereunder describes the result of simulation on the characteristic of the level conversion circuit according to this embodiment, which assumes that the level conversion circuit is structured by thin film transistors made of polycrystalline silicon. The speediness of the operation of the level conversion circuit 1 shown in FIG. 5 was firstly examined.

Generally, the threshold voltage Vtp of a p-channel transistor is, for example, (−0.9 plus or minus 0.1) V and the threshold voltage of a n-channel transistor is, for example, (0.7 plus or minus 0.1) V when the transistor is made of bulk silicon. On the other hand, the threshold voltage Vtp of a p-channel transistor is, for example, (−2.0 plus or minus 1 to 1.5) V and the threshold voltage of a n-channel transistor is, for example, (1.5 plus or minus 1) V when the transistor is a thin film transistor made of polycrystalline silicon. Thus the threshold voltages of thin film transistors made of polycrystalline silicon sift more widely from designed values than transistors made of bulk silicon in manufacturing process.

Figure 6:
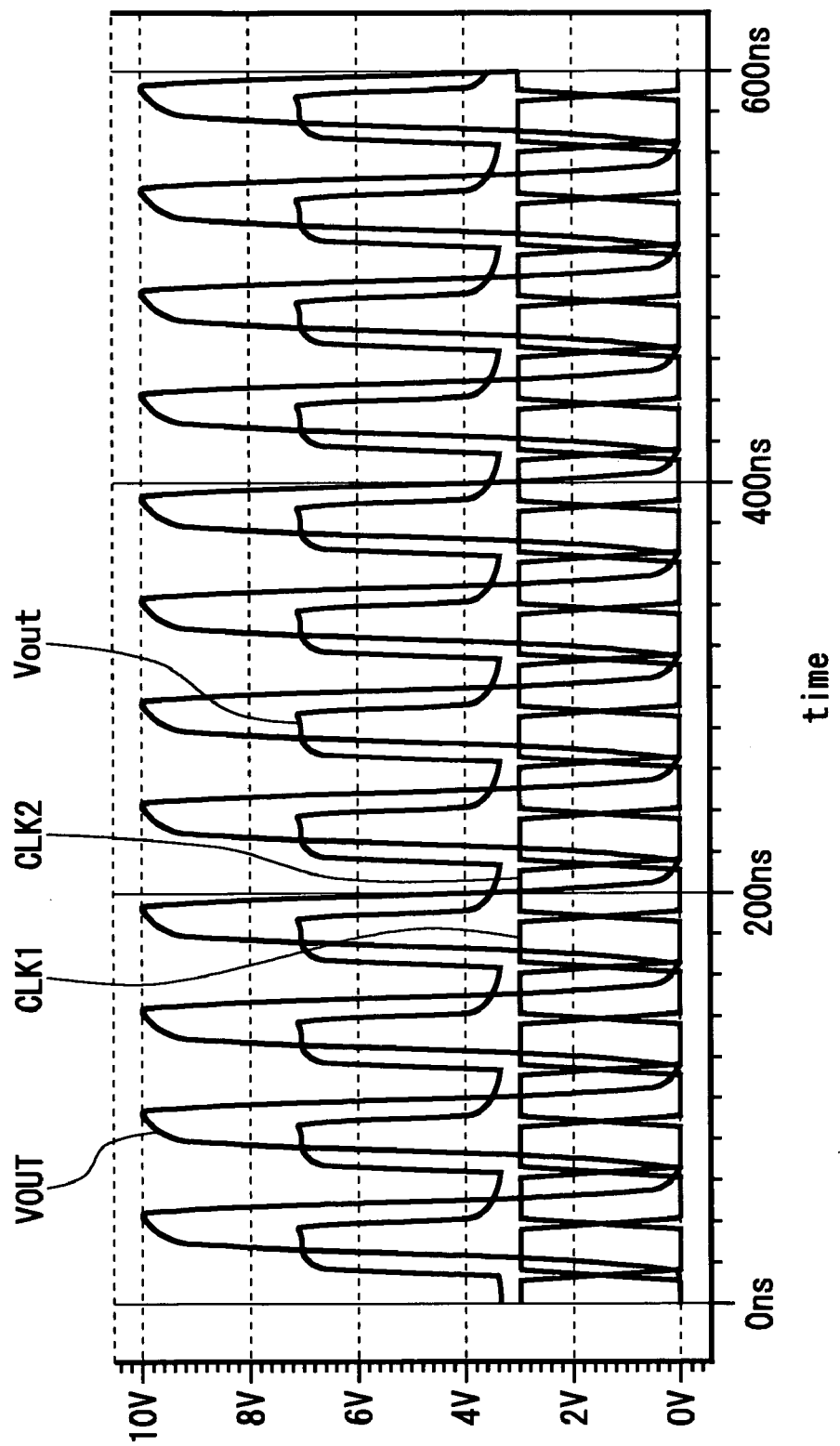
FIG. 6 is a waveform diagram of voltage showing the result of simulation which assumes that thin film transistors made of polycrystalline silicon are utilized in the embodiment 1.

FIG. 6 shows the result of the simulation. The frequency of the input signals CLK1 and CLK2 is set to 20 MHz, the amplitude of the input voltage is set to 3.0V and the supply voltage VDD is set to 10V in order to examine the characteristic of high-speed operation. In the FIG. 6 are shown the waveforms of the input signals CLK1 and CLK2, the output voltage VOUT and the output voltage Vout of the output node NO. It is confirmed from the result of the simulation shown in FIG. 6 that the output voltage VOUT can be obtained with the duty ratio of 50% in response to the input signals CLK1 and CLK2. Thus the level conversion circuit 1 can operate at high speed when the circuit 1 is structured by thin film transistors made of polycrystalline silicon.

The simulation on the waveforms of the voltages is described next, which assumes that the threshold voltages of the p-channel MOSFET and the n-channel MOSFET of the level conversion circuit shifted from designed values due to irregularity caused in manufacturing process. The frequency of the input signals CLK1 and CLK2 is set to 2 MHz in order to examine the operation at practical speed, in this simulation.

Figure 7:
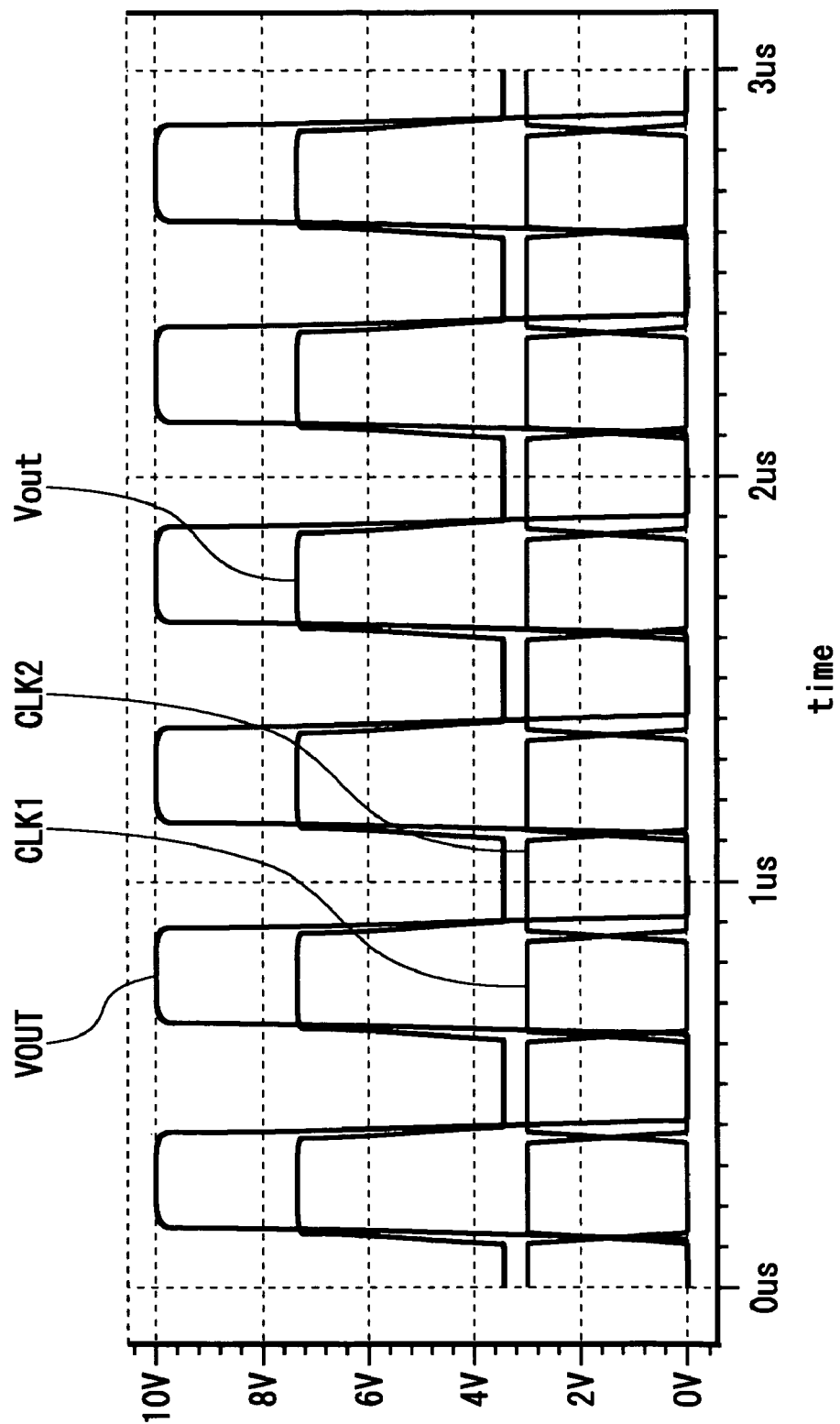
FIG. 7 is a waveform diagram of voltage showing the result of simulation which assumes that the threshold voltages of a p-channel MOSFET and a n-channel MOSFET are smaller than designed values in the embodiment 1.

FIG. 7 shows the result of simulation which assumes that the threshold voltages of the p-channel MOSFET and the n-channel MOSFET are lower than the designed values. The threshold parameter (threshold voltage) of the p-channel MOSFET is set to −0.5V and the threshold parameter (threshold voltage) of the n-channel MOSFET is set to 0.5V in the simulation of FIG. 7.

Figure 8:
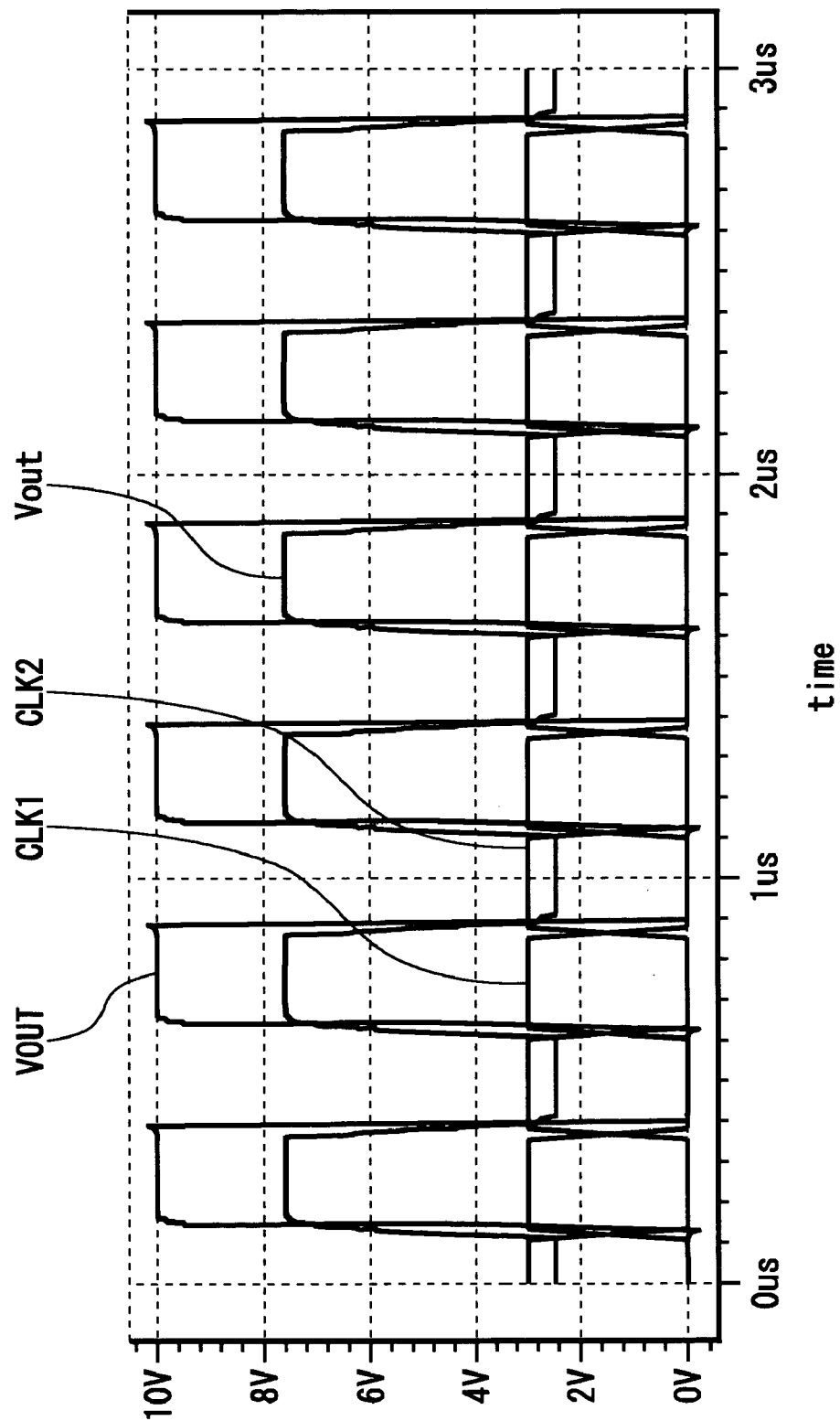
FIG. 8 is a waveform diagram of voltage showing the result of simulation which assumes that the threshold voltages of the p-channel MOSFET and the n-channel MOSFET are equal to the designed values in the embodiment 1.

FIG. 8 shows the result of simulation which assumes that the threshold voltages of the p-channel MOSFET and the n-channel MOSFET are equal to the designed values. The threshold parameter of the p-channel MOSFET is set to −2.0V and the threshold parameter of the n-channel MOSFET is set to 1.5V in the simulation of FIG. 8.

Figure 9:
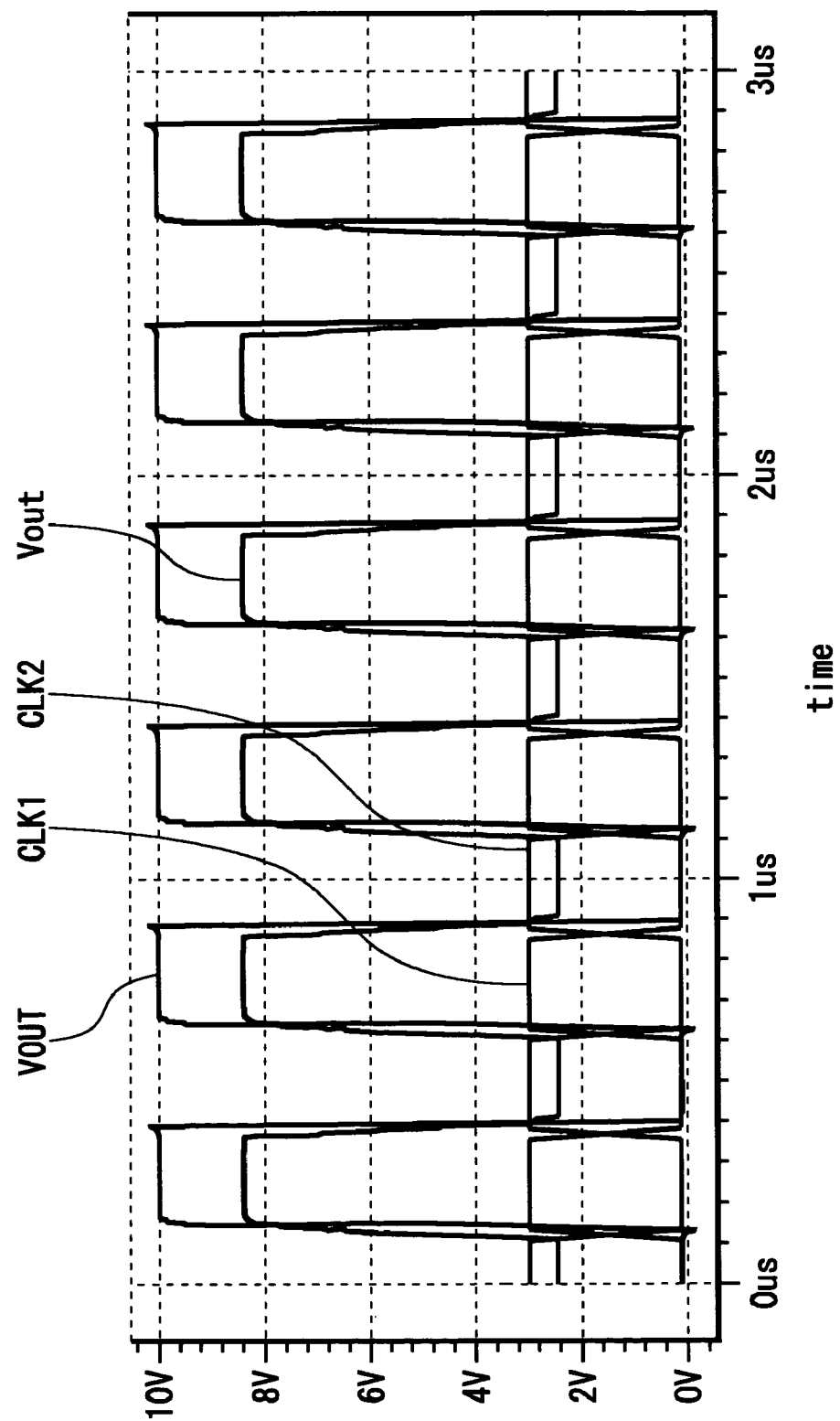
FIG. 9 is a waveform diagram of voltage showing the result of simulation which assumes that the threshold voltages of the p-channel MOSFET and the n-channel MOSFET are larger than the designed values in the embodiment 1.

FIG. 9 shows the result of simulation which assumes that the threshold voltages of the p-channel MOSFET and the n-channel MOSFET are higher than the designed values. The threshold parameter of the p-channel MOSFET is set to −3.5V and the threshold parameter of the n-channel MOSFET is set to 2.5V in the simulation of FIG. 9.

It is confirmed from the result shown in the FIG. 7, FIG. 8 and FIG. 9 that the output voltage VOUT can be obtained with the duty ratio of 50% in response to the input signals CLK1 and CLK2 even when the threshold voltages of the p-channel MOSFET and n-channel MOSFET shifted widely from the designed values.

The level conversion circuit 1 according to this embodiment can operate even when the voltage amplitude of the input signals CLK1 and CLK2 is smaller than the threshold voltages of p-channel MOSFET 11 and n-channel MOSFET 12 because the degree of the ON status of the p-channel MOSFET 11 and n-channel MOSFET 12 is controlled by the input signals CLK1 and CLK2, which are basically kept to be ON. The output voltage Vout, moreover, can be obtained in accordance with the change of the level of the input signals CLK1 and CLK2 even in the case that the threshold voltages of the p-channel MOSFET 11 and n-channel MOSFET 12 have shifted widely from the designed values. Thus the level conversion circuit 1 can operate with high accuracy in the case that the threshold voltages of the p-channel MOSFET 11 and n-channel MOSFET 12 shifted from the designed values due to irregularity caused in manufacturing process.

High-speed operation can also be realized by controlling the degree of the ON status of the p-channel MOSFET 11 and the n-channel MOSFET 12 which are basically kept to be ON. The duration of the flowing of the penetration current is, moreover, shortened because the high-speed operation shortens the transition time of the level of the output voltage Vout. Power saving can, therefore, be realized.

The level conversion circuit 1 can be structured only by the p-channel MOSFET 11 and the n-channel MOSFET 12. The area occupied by the circuit, therefore, can be diminished and the design of the circuit becomes easier because the circuit can be structured by few elements.

Figure 10:
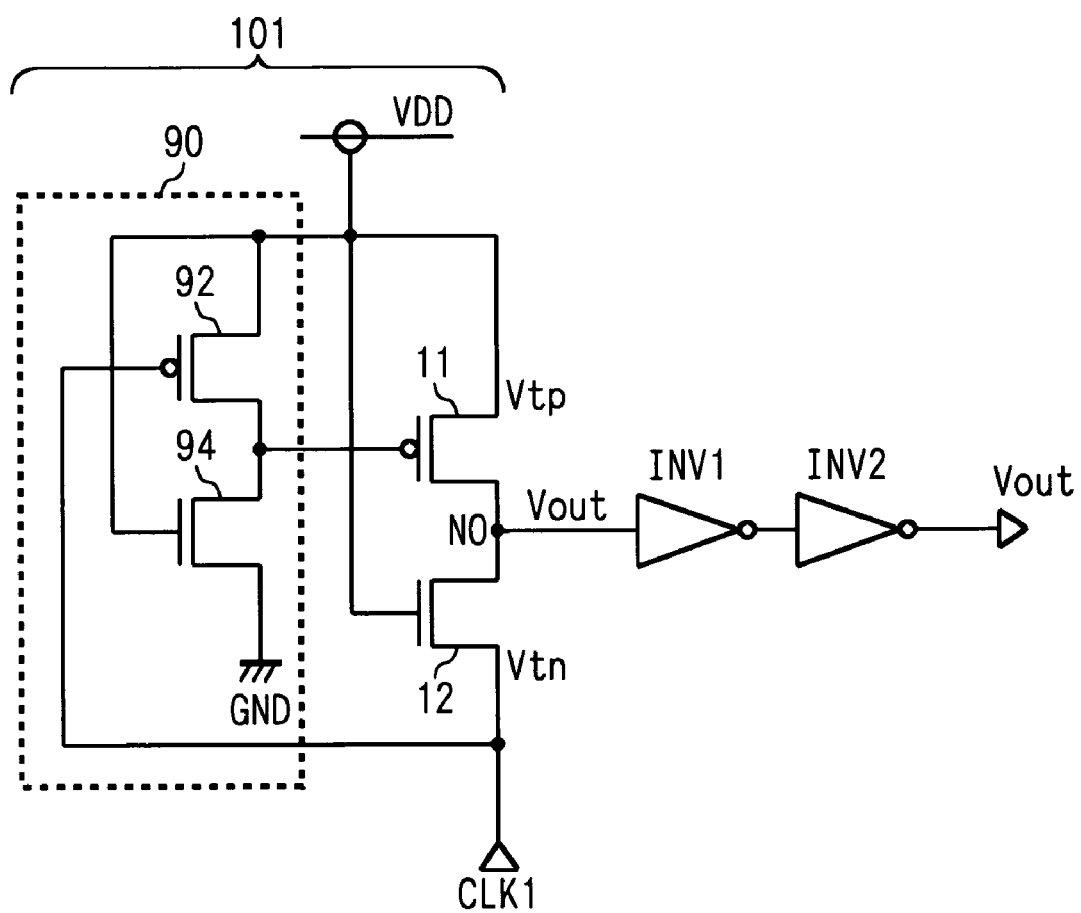
FIG. 10 is a circuit diagram showing another structure of the level conversion circuit shown in FIG. 5.

FIG. 10 shows another structure of the level conversion circuit 1 shown in FIG. 5. Hereunder will be described only the difference of the structure from that of the level conversion circuit 1 of FIG. 5. A control circuit 90 is newly provided to the level conversion unit 101. The control circuit 90 comprises a p-channel MOSFET 92 and a n-channel MOSFET 94. The source of the p-channel MOSFET 92 is connected to the supply terminal, the drain is connected to the gate of the p-channel MOSFET 11 and the drain of the n-channel MOSFET 94, the gate is connected to the input node I1. The gate of the n-channel MOSFET 94 is connected to the supply terminal and the source is earthed. This level conversion unit 101 does not have the input node I2.

According to the structure described above, the control circuit 90 serves as an inverter for the input signal CLK1. The n-channel MOSFET 94 becomes constantly strong ON status because the source is earthed and the supply voltage is impressed to the gate. The p-channel MOSFET becomes weak ON or OFF status when the input signal CLK1 is high and becomes strong ON status when the input signal CLK1 is low. An output signal of the control circuit 90 accordingly becomes low when the input signal CLK1 is high and becomes high when the input signal CLK1 is low. A signal inverted from the input signal CLK1, therefore, can be inputted to the gate of the p-channel MOSFET 11 and it can be realized function which is same as that of the circuit shown in FIG. 5. A resistor element may, moreover, be provided to the control circuit 90 instead of the n-channel MOSFET 94 and the n-channel MOSFET 94 may also be replaced by a p-channel MOSFET of which the gate is earthed.

According to this structure described above, the number of the input signals can be reduced by one as compared with FIG. 5. The number of signal pins can be reduced and the number of wirings can also be reduced in utilizing the level conversion circuit 1 in an integrated circuit because the level conversion circuit 1 does not require any other signals or voltages except the input signal CLK1, the supply voltage and the ground voltage. Cost saving and improvement in yield factor can, therefore, be realized.

Embodiment 2

Figure 11:
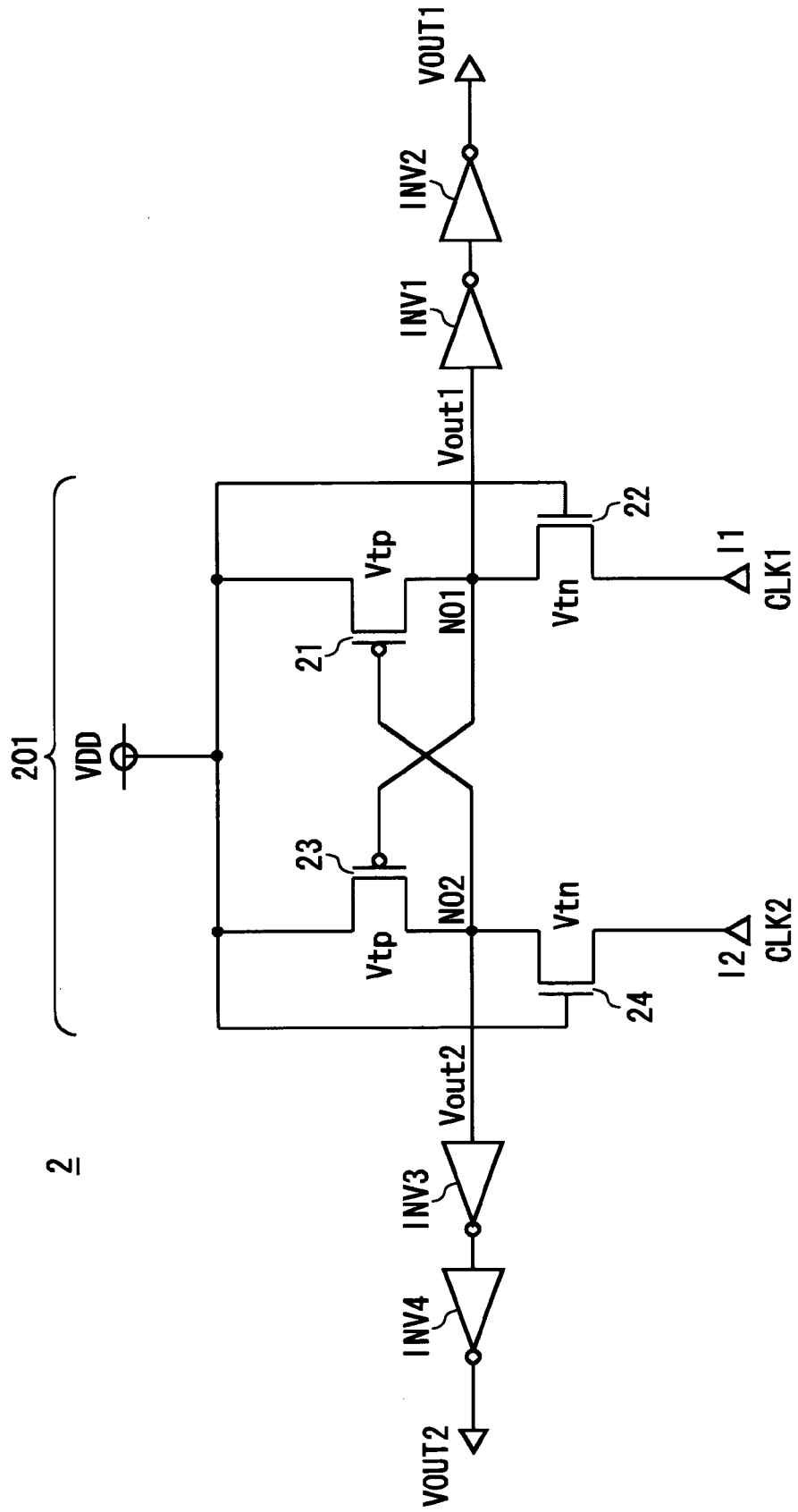
FIG. 11 is a circuit diagram showing the structure of a level conversion circuit according to an embodiment 2 of the present invention.

FIG. 11 is a circuit diagram showing the structure of a level conversion circuit according to a second embodiment of the present invention. In FIG. 11, a level conversion circuit 2 comprises a level conversion unit 201 and drive inverters INV1, INV2, INV3 and INV4. The level conversion unit 201 comprises p-channel MOSFETs 21, 23 and n-channel MOSFETs 22, 24. The drive inverters INV1, INV2, INV3 and INV4 are respectively structured by a CMOS circuit which is structured by a p-channel MOSFET and a n-channel MOSFET.

The sources of the p-channel MOSFETs 21 and 23 are connected to a supply terminal which receives supply voltage VDD, the drains are respectively connected to output nodes NO1 and NO2 and the gates are respectively connected to the output nodes NO2 and NO1. The sources of the n-channel MOSFETs 22 and 24 are respectively connected to input nodes I1 and I2, the drains are respectively connected to the output nodes NO1 and NO2 and the gates are connected to the supply terminal which receives the supply voltage VDD.

As described above, the structures of circuits in the level conversion circuit shown in FIG. 11 are mostly same as the structure of the level conversion circuit 1 shown in FIG. 5, one of which is structured by the p-channel MOSFET 21 and the n-channel MOSFET 22 and the other is structured by the p-channel MOSFET 23 and the n-channel MOSFET 24. The output nodes NO1 and NO2 of each circuit are, however, connected to the gates of the p-channel MOSFETs 21 and 23 in a crossing manner. "To be connected in a crossing manner" does not necessarily mean that signal lines are physically crossing and it is expressed in such a manner merely in figures. This consideration can be similarly mentioned hereafter. The voltage of input signals CLK1 and CLK2 and the supply voltage VDD and the relation therebetween are same as those of the first embodiment.

Hereunder describes the operation of the level conversion circuit shown in FIG. 11. The n-channel MOSFET 22 becomes strong ON status because the voltage of the source is that of the CLK1 at the low level and the voltage of the gate is the supply voltage when CLK1 is low and CLK2 is high. Voltage Vout1 of the output node NO1 becomes lower because it reflects the low level of the CLK1 which is the voltage of the source of the n-channel MOSFET 22. The p-channel MOSFET 23 comes to have the lowered voltage Vout1 of the output node NO1 as the voltage of the gate and becomes sufficiently strong ON status due to the relation between the voltage of the gate and supply voltage which is the voltage of the source. At this time, the n-channel MOSFET 24 becomes OFF or weak ON status according to whether the absolute value of the threshold voltage Vtn of the n-channel MOSFET 24 is smaller than the absolute value of the difference between the voltage of CLK2 at the high level, which is the voltage of the source, and the supply voltage, which is the voltage of the gate. The ON status resistance of the p-channel MOSFET 23, therefore, becomes sufficiently lower than that of the n-channel MOSFET 24 and then voltage Vout2 of the output node NO2 becomes higher because it reflects the supply voltage which is the voltage of the source of the p-channel MOSFET 23. The voltage Vout2 becomes sufficiently higher than the high level of the input signals CLK1 and CLK2. The p-channel MOSFET 21, therefore, becomes OFF status or sufficiently weak ON status according to whether the absolute value of the threshold voltage Vtp of the p-channel MOSFET 21 is smaller than the absolute value of the difference between the increased voltage Vout2 of the output node NO2 and the supply voltage which is the voltage of the source.

The n-channel MOSFET 24 becomes strong ON status because the voltage of the source is that of CLK2 at the low level and the voltage of the gate is the supply voltage, when the CLK1 is high and the CLK2 is low. The voltage Vout2 of the output node NO2 becomes lower because it reflects the low level of the CLK2 which is the voltage of the source of the n-channel MOSFET 24. The p-channel MOSFET 21 accordingly comes to have the lowered voltage Vout2 of the output node NO2 as the voltage of the gate and becomes sufficiently strong ON status due to the relation between the voltage of the gate and supply voltage which is the voltage of the source. At this time, the n-channel MOSFET 22 becomes OFF or weak ON status according to whether the absolute value of the threshold voltage Vtn of the n-channel MOSFET 22 is smaller than the absolute value of the difference between the voltage of CLK1 at the high level, which is the voltage of the source, and the supply voltage, which is the voltage of the gate. The ON status resistance of the p-channel MOSFET 21, therefore, becomes sufficiently lower than that of the n-channel MOSFET 22 and the voltage Vout1 of the output node NO1 becomes higher because it reflects the supply voltage which is the voltage of the source of the p-channel MOSFET 21. Then the voltage Vout1 becomes sufficiently higher than the high level of the input signals CLK1 and CLK2. The p-channel MOSFET 23, therefore, becomes OFF status or sufficiently weak ON status according to whether the absolute value of the threshold voltage Vtp of the p-channel MOSFET 23 is smaller than the absolute value of the difference between the increased voltage Vout1 of the output node NO1 and the supply voltage, which is the voltage of the source.

The drive inverters INV1 and INV2 convert the output voltage Vout1 to output voltage VOUT1 which changes between the supply voltage VDD and the ground voltage and the drive inverters INV3 and INV4 convert the output voltage Vout2 to output voltage VOUT2 which changes between the supply voltage VDD and the ground voltage.

Hereunder describes the result of simulation on the characteristic of the level conversion circuit according to this embodiment, which assumes that the level conversion circuit is structured by thin film transistors made of polycrystalline silicon. The speediness of the operation of the level conversion circuit 2 shown in FIG. 11 was firstly examined.

Figure 12A:
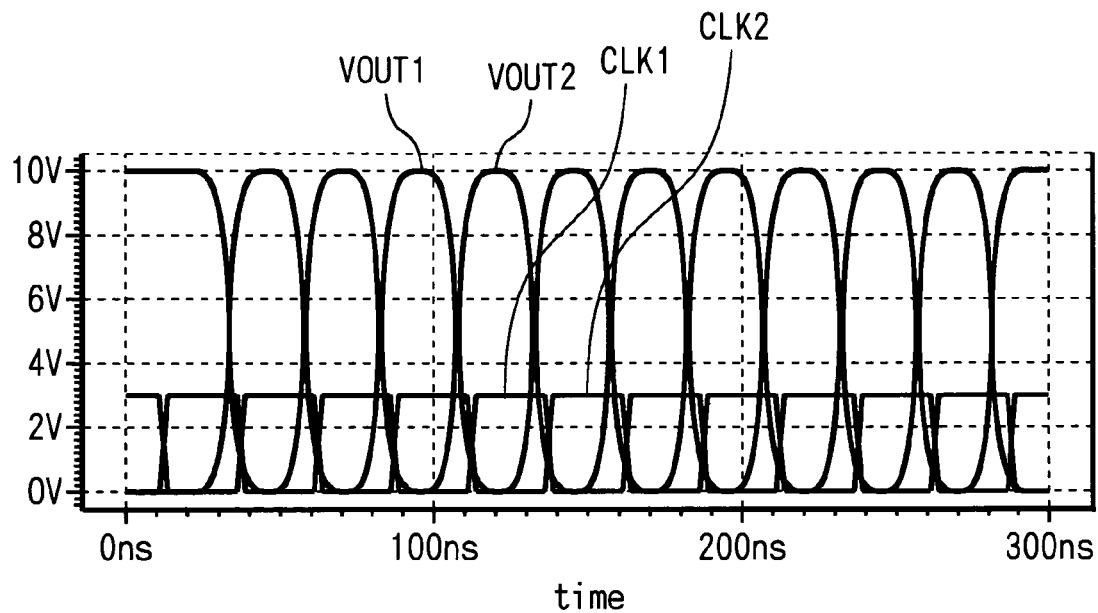
FIG. 12(a) is a waveform diagram of voltage showing the result of simulation which assumes that the thin film transistors made of the polycrystalline silicon are utilized in the embodiment 2.
Figure 12B:
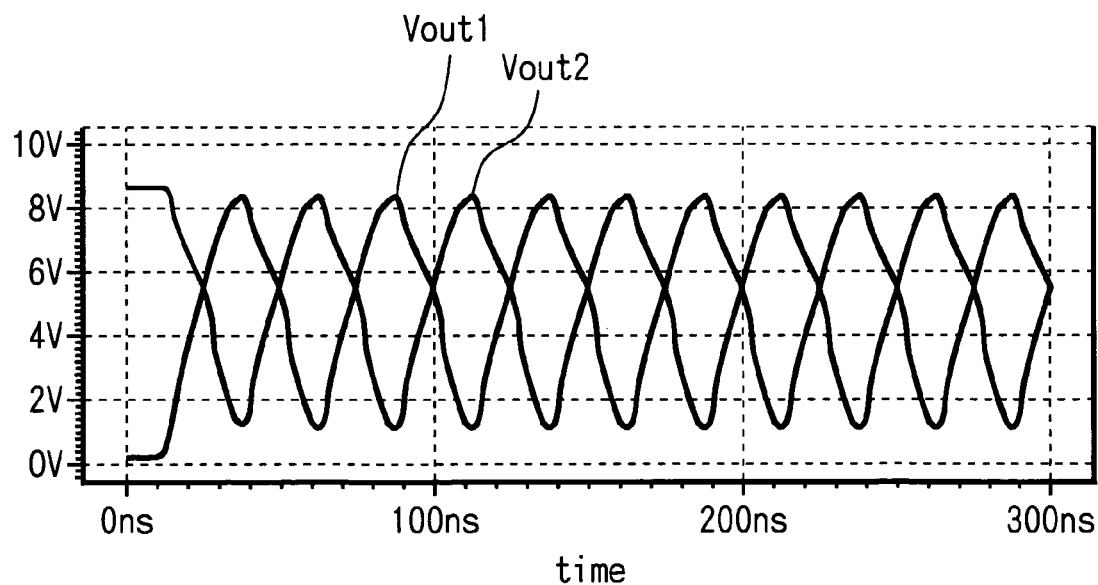
FIG. 12(b) is a waveform diagram of voltage showing the result of simulation which assumes that the thin film transistors made of the polycrystalline silicon are utilized in the embodiment 2.

FIGS. 12(a) and 12(b) show the result of the simulation. The frequency of the input signals CLK1 and CLK2 is set to 20 MHz, the amplitude of the input voltage is set to 3.0V and the supply voltage VDD is set to 10V. In the FIG. 12(a) are shown the waveforms of the input signals CLK1 and CLK2 and the output voltages VOUT1 and VOUT2 and in the FIG. 12(b) are shown the waveforms of the output voltages Vout1 and Vout2 of the output nodes NO1 and NO2.

It is confirmed from the result of the simulation shown in FIGS. 12(a) and 12(b) that the output voltages VOUT1 and VOUT2 can be obtained with the duty ratio of 50% in response to the input signals CLK1 and CLK2 even when the input signals have such high frequency as 20 MHz. Thus the level conversion circuit 2 can operate at high speed when the circuit 2 is structured by thin film transistors made of polycrystalline silicon.

The simulation on the waveforms of the voltages is described next, which assumes that the threshold voltages of the p-channel MOSFETs and the n-channel MOSFETs of the level conversion circuit have shifted from designed values due to irregularity caused in manufacturing process. The frequency of the input signals CLK1 and CLK2 is set to 2 MHz in this simulation.

Figure 13A:
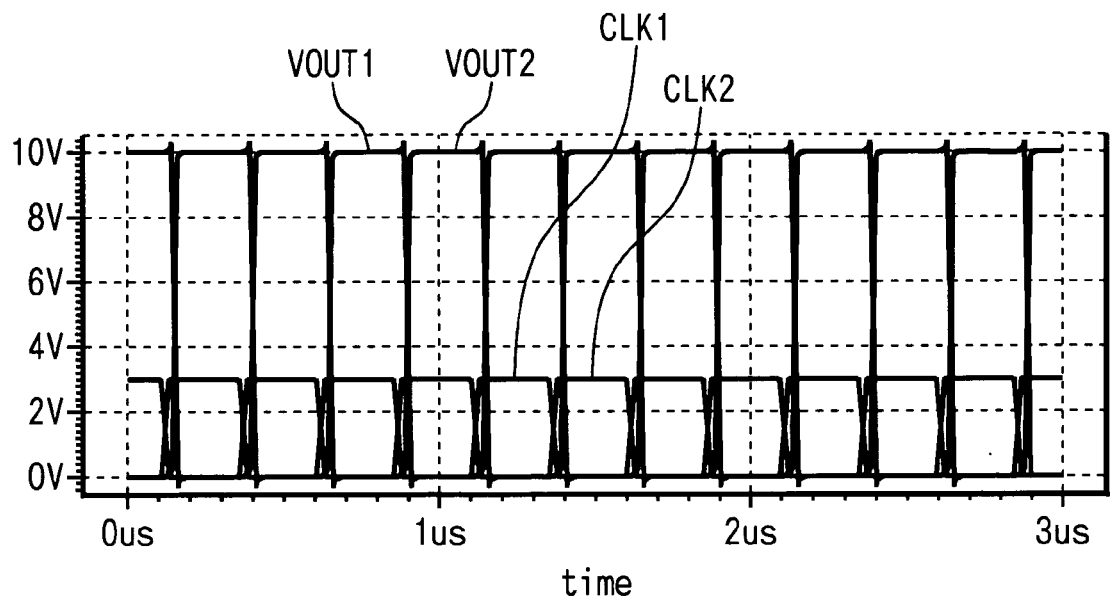
FIG. 13(a) is a waveform diagram of voltage showing the result of simulation which assumes that the threshold voltages of p-channel MOSFETs and n-channel MOSFETs are smaller than designed values in the embodiment 2.
Figure 13B:
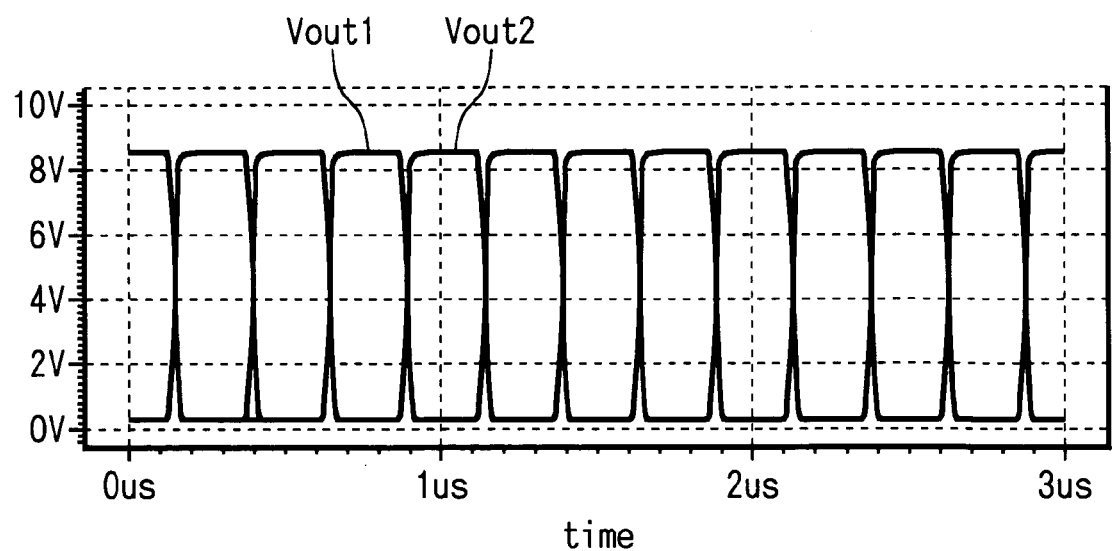
FIG. 13(b) is a waveform diagram of voltage showing the result of simulation which assumes that the threshold voltages of p-channel MOSFETs and n-channel MOSFETs are smaller than designed values in the embodiment 2.

FIGS. 13(a) and 13(b) show the result of simulation which assumes that the threshold voltages of the p-channel MOSFETs and the n-channel MOSFETs are lower than the designed values. The threshold parameter (threshold voltage) of the p-channel MOSFETs is set to −0.5V and the threshold parameter (threshold voltage) of the n-channel MOSFETs is set to 0.5V in the simulation of FIGS. 13(a) and 13(b).

Figure 14A:
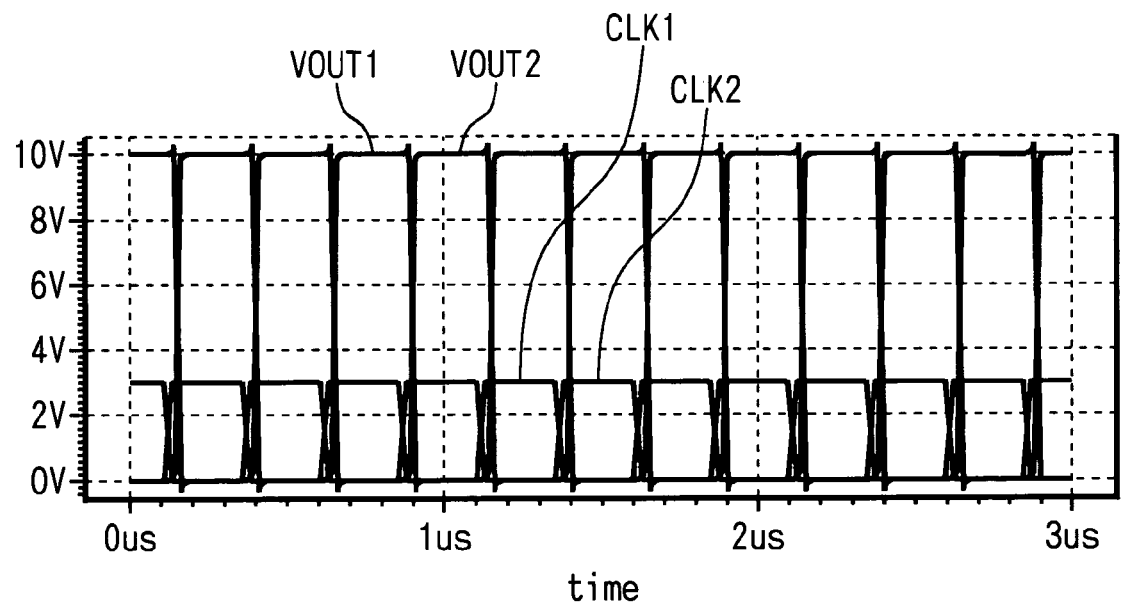
FIG. 14(a) is a waveform diagram of voltage showing the result of simulation which assumes that the threshold voltages of the p-channel MOSFETs and the n-channel MOSFETs are equal to the designed values in the embodiment 2.
Figure 14B:
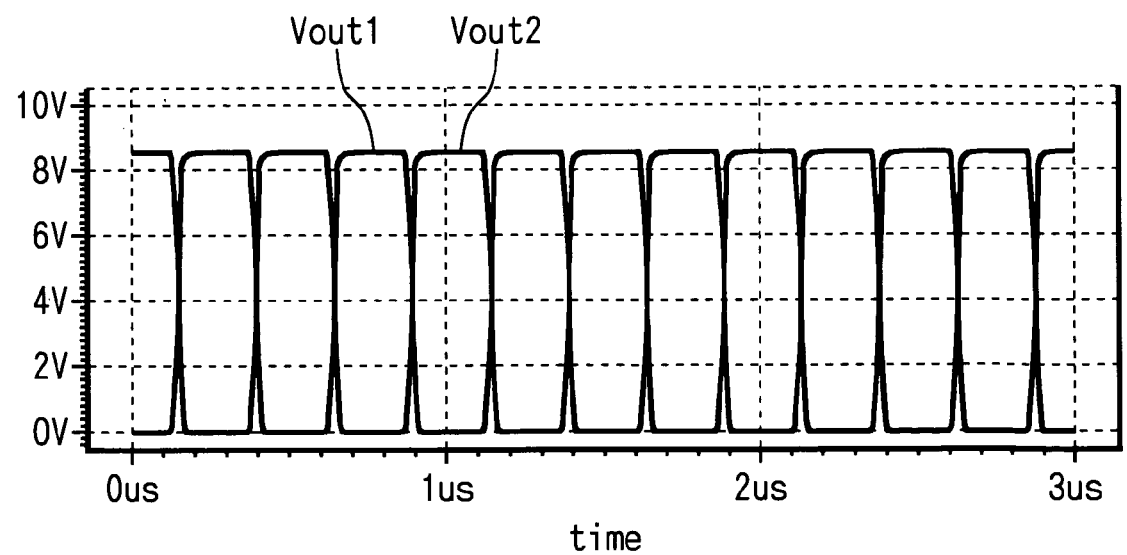
FIG. 14(b) is a waveform diagram of voltage showing the result of simulation which assumes that the threshold voltages of the p-channel MOSFETs and the n-channel MOSFETs are equal to the designed values in the embodiment 2.

FIGS. 14(a) and 14(b) show the result of simulation which assumes that the threshold voltages of the p-channel MOSFETs and the n-channel MOSFETs are equal to the designed values. The threshold parameter of the p-channel MOSFETs is set to −2V and the threshold parameter of the n-channel MOSFETs is set to 1.5V in the simulation of FIGS. 14(a) and 14(b).

Figure 15A:
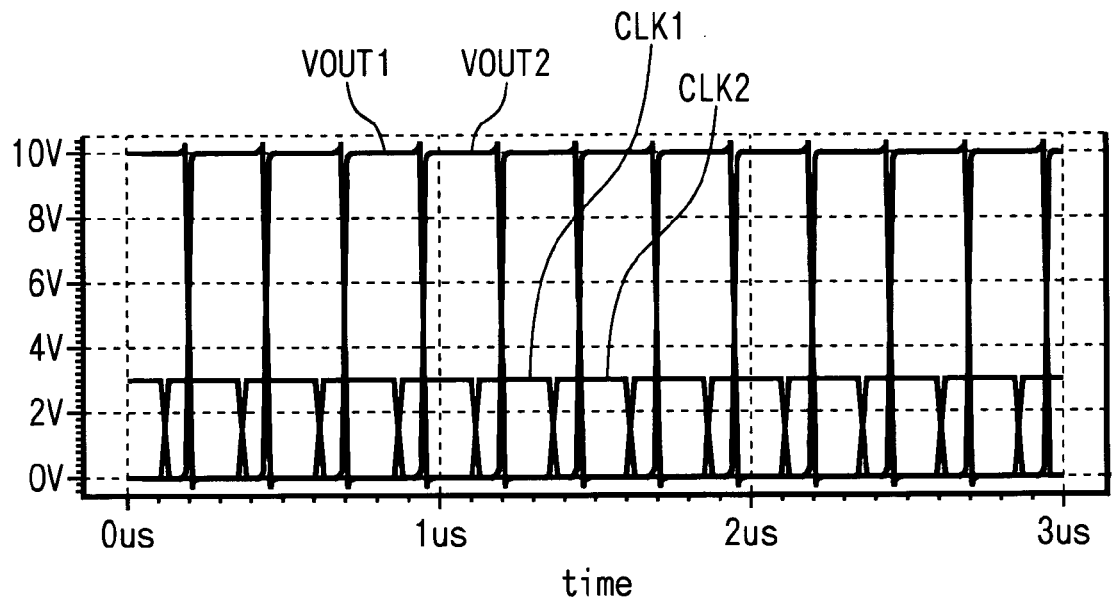
FIG. 15(a) is a waveform diagram of voltage showing the result of simulation which assumes that the threshold voltages of the p-channel MOSFETs and the n-channel MOSFETs are larger than the designed values in the embodiment 2.
Figure 15B:
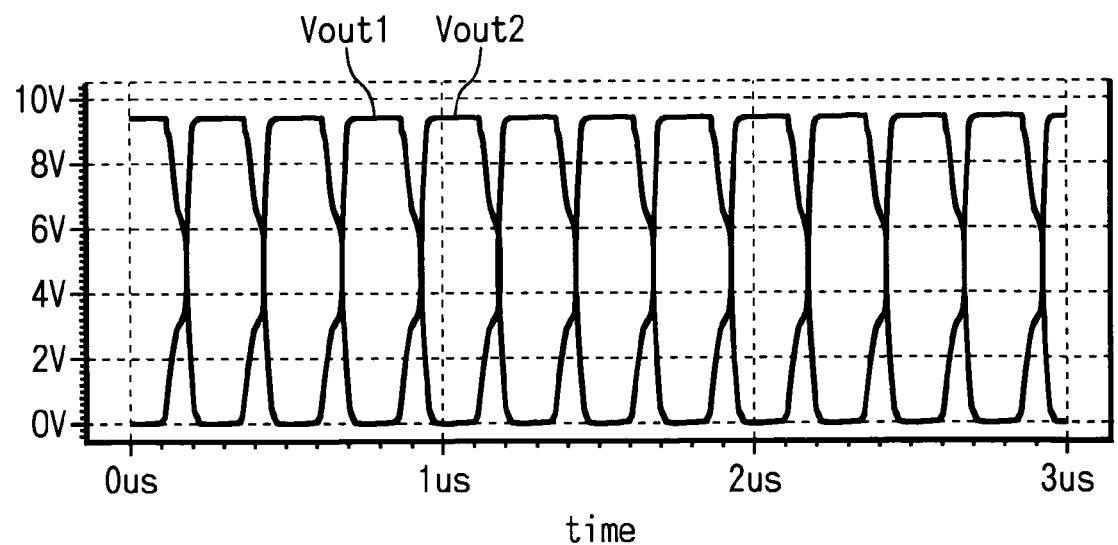
FIG. 15(b) is a waveform diagram of voltage showing the result of simulation which assumes that the threshold voltages of the p-channel MOSFETs and the n-channel MOSFETs are larger than the designed values in the embodiment 2.

FIGS. 15(a) and 15(b) show the result of simulation which assumes that the threshold voltages of the p-channel MOSFETs and the n-channel MOSFETs are higher than the designed values. The threshold parameter of the p-channel MOSFETs is set to −3.5V and the threshold parameter of the n-channel MOSFETs is set to 2.5V in the simulation of FIGS. 15(a) and 15(b).

It is confirmed from the result shown in the FIGS. 13(a), 13(b), 14(a), 14(b), 15(a) and 15(b) that the output voltages VOUT1 and VOUT2 can be obtained with the duty ratio of 50% in response to the input signals CLK1 and CLK2 even when the threshold voltages of the p-channel MOSFETs and n-channel MOSFETs have shifted widely from the designed values.

The p-channel MOSFETs 21 and 23 of the level conversion circuit 2 according to this embodiment can more infallibly be controlled to be ON or OFF because the gates of the p-channel MOSFETs 21 and 23 are respectively connected to the output nodes NO1 and NO2 of circuits in a crossing manner, one of which is structured by the p-channel MOSFET 21 and n-channel MOSFET 22 and the other is structured by the p-channel MOSFET 23 and the n-channel MOSFET 24, and therefore Vout1 and Vout2 which have difference larger than the difference of voltage between the high level and low level of the input signals CLK1 and CLK2 are inputted to the gates of the p-channel MOSFETs 21 and 23. The level conversion circuit 2 can operate accurately even when the voltage amplitude of the CLK1 and CLK2 is smaller than the threshold voltages of the p-channel MOSFETs 21 and 23 and the n-channel MOSFET 22 and 24.

The duty ratios of the output signals Vout1 and Vout2 can be controlled to match to each other even when they are different because the output signals Vout1 and Vout2 are complemented by each other. This is because the output signals Vout1 and Vout2 are respectively outputted from the circuits, one of which is structured by the p-channel MOSFET 21 and the n-channel MOSFET 22 and the other is structured by the p-channel MOSFET 23 and the n-channel MOSFET 24, and the output signal of one circuit is utilized as the input signal of the other circuit. The output voltages Vout1 and Vout2 can, moreover, be acquired in accordance with the change of level of the input signals CLK1 and CLK2 even in the case that the threshold voltages of the p-channel MOSFETs 21 and 23 and the n-channel MOSFETs 22 and 24 differ widely from the designed values. Thus the level conversion circuit can operate with high accuracy in the case that the threshold voltages of the p-channel MOSFETs 21 and 23 and the n-channel MOSFETs 22 and 24 have shifted from the designed values due to irregularity caused in manufacturing process.

The different supply voltages may be separately set to the p-channel MOSFETs 21 and 23 though the single supply voltage is set in the FIG. 11. In that case, the gates of the n-channel MOSFETs 22 and 24 are generally connected to the different supply terminals which respectively correspond to the p-channel MOSFETs 21 and 23. It is to be noted, however, that the gates are not necessarily connected to supply terminals in the above-described manner but the gates of the n-channel MOSFETs 22 and 24 may be connected respectively to the supply terminal corresponding to the p-channel MOSFETs 23 and 21 if the supply voltages are set to the moderate values so that the circuit might be able to operate. This manner of thinking regarding the supply voltage is effective in following embodiments.

Figure 16:
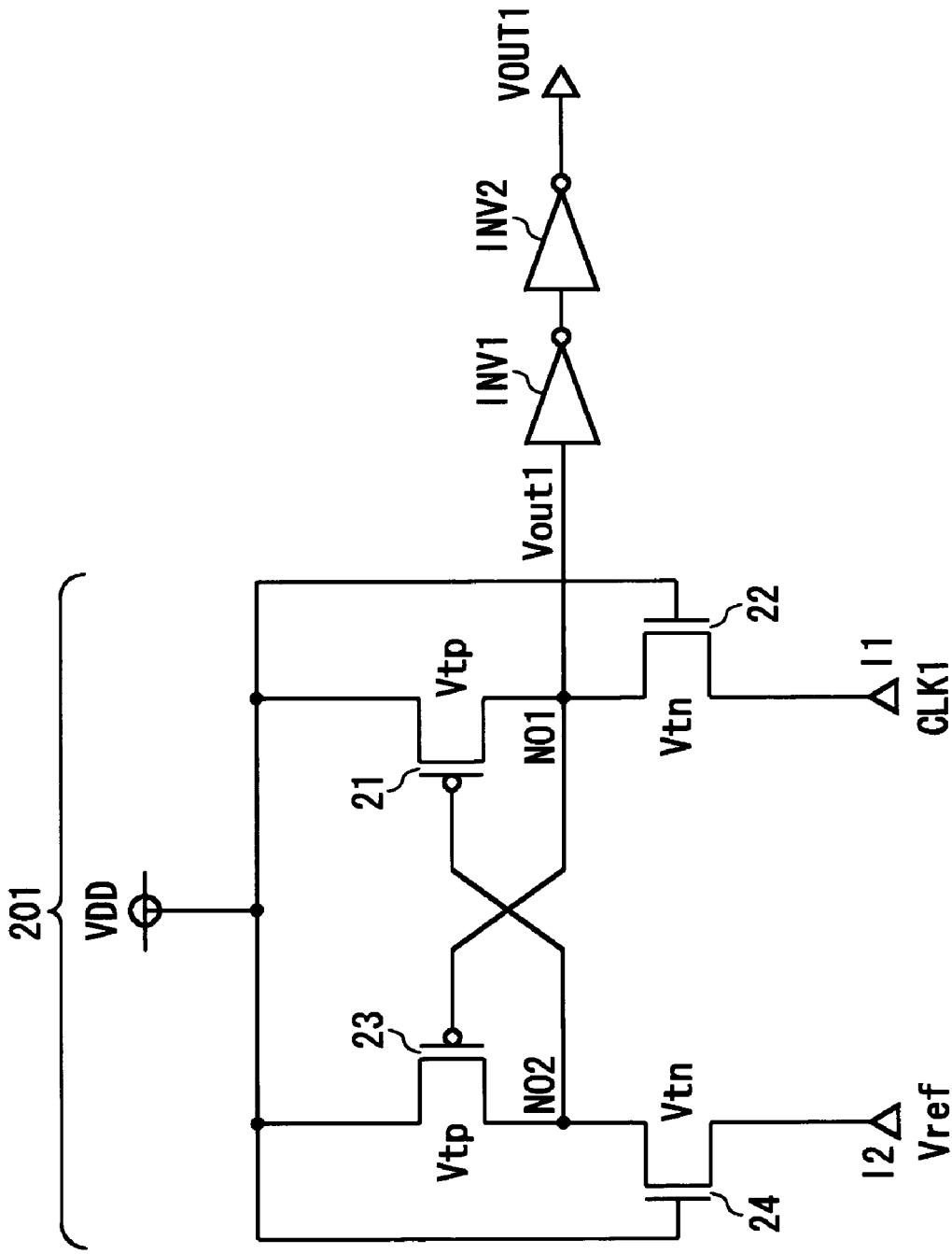
FIG. 16 is a circuit diagram showing another structure of the level conversion circuit shown in FIG. 11.

FIG. 16 shows another structure of the level conversion circuit shown in FIG. 11. Hereunder will be described only the difference of the structure from that of the level conversion circuit of FIG. 11. The inverters INV3 and INV4 are deleted in FIG. 16. A prescribed reference voltage signal Vref is inputted to the input node I2 instead of the input signal CLK2. The voltage of the Vref is lower than the supply voltage VDD and higher than the ground voltage. The voltage of the Vref is, for example, close to a mean value between the supply voltage VDD and the ground voltage.

The n-channel MOSFET 22 becomes strong ON status when the CLK1 is low and the voltage of the node NO1 becomes low. As a result, the p-channel MOSFET 23 becomes strong ON status and the voltage of the node NO2 is increased because the status of the n-channel MOSFET 24 is invariable. The p-channel MOSFET 21, therefore, becomes OFF and the output voltage Vout1 becomes low level.

On the other hand, the n-channel MOSFET 22 becomes OFF or weak ON status when the CLK1 is high and the voltage of the node NO1 becomes high. As a result, the p-channel MOSFET 23 becomes OFF or weak ON status and the voltage of the node NO2 is decreased because the status of the n-channel MOSFET 24 is invariable. The p-channel MOSFET 21, therefore, becomes ON and the output voltage Vout1 becomes high level. According to the structure described above, the level conversion circuit 2 of FIG. 16 can operate similarly as the level conversion circuit 2 shown in FIG. 11 in effect.

Hereunder will be mentioned concrete values. This level conversion circuit can operate at least within the range of Vref=(0 to 3) V, premising that the concrete values are: VDD=10V; CLK1=(0 to 3) V; VOUT=0 to VDD; Vtn=+1.5V; and Vtp=−2.0V.

It is preferable that relation between the operation capacity of each transistor is as follows when Vref=1.5V:
  (operation capacity of the p-channel MOSFET 21)<or= (operation capacity of the n-channel MOSFET 22); and
  (operation capacity of the p-channel MOSFET 23)<or= (operation capacity of the n-channel MOSFET 24).

It is preferable that the relation between the operation capacity of each transistor is as follows when Vref=0V:
  (operation capacity of the p-channel MOSFET 21)<or= (operation capacity of the n-channel MOSFET 22); and
  (operation capacity of the p-channel MOSFET 23)>or= (operation capacity of the n-channel MOSFET 24).

It is preferable that the relation between the operation capacity of each transistor is as follows when Vref=3V:
  (operation capacity of the p-channel MOSFET 21)>or= (operation capacity of the n-channel MOSFET 22); and
  (operation capacity of the p-channel MOSFET 23)<or= (operation capacity of the n-channel MOSFET 24).

The level conversion circuit can operate on the above-described condition if the Vref changes between 0V and 3V. This circuit can, moreover, operate when the VDD is changed to 5V or 12V. The circuit, however, might not accurately operate with Vref=3V when the VDD is low and similarly the circuit might not accurately operate with Vref=0V when the VDD is high. The circuit can operate, moreover, when the Vref is higher than 3V though it depends on condition. It is, however, desirable that the Vref is lower than the high level of the input signal and higher than the low level thereof, in considering wider range of operation and practicability. It is more preferable that the Vref is close to the center voltage of the input signal.

According to the structure described above, the number of input signals can be reduced by utilizing the reference voltage signal commonly, in performing level conversion to a plurality of input signals. Cost saving and improvement in yield factor can, therefore, be realized. The inverters INV3 and INV4 are deleted in FIG. 16, but these inverters naturally may remain.

Embodiment 3

Figure 17:
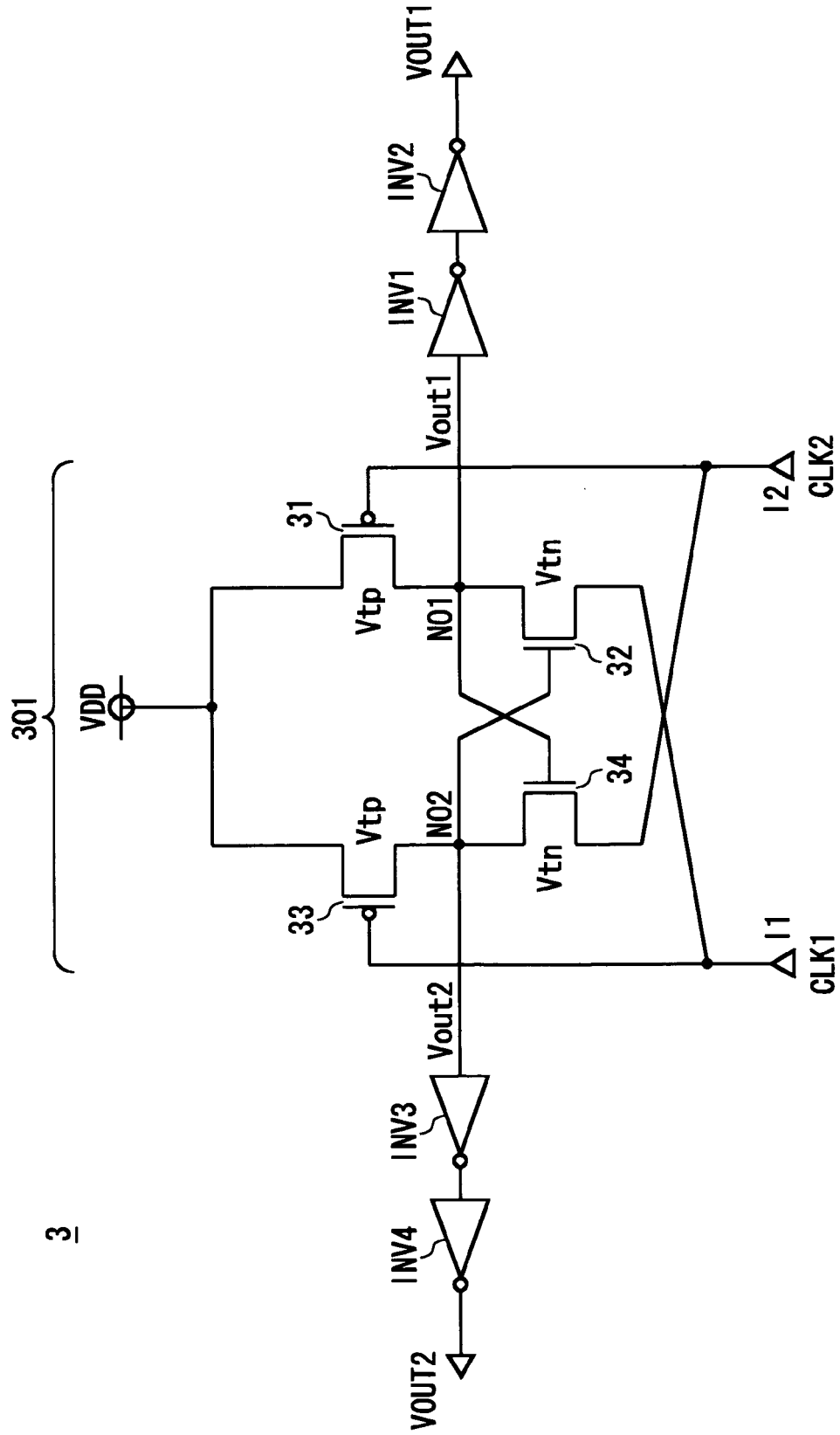
FIG. 17 is a circuit diagram showing the structure of a level conversion circuit according to an embodiment 3 of the present invention.

FIG. 17 is a circuit diagram showing the structure of a level conversion circuit according to a third embodiment of the present invention. In FIG. 17, a level conversion circuit 3 comprises a level conversion unit 301 and drive inverters INV1, INV2, INV3 and INV4. The level conversion unit 301 comprises p-channel MOSFETs 31, 33 and n-channel MOSFETs 32, 34. The drive inverters INV1, INV2, INV3 and INV4 are respectively structured by a CMOS circuit which is structured by a p-channel MOSFET and a n-channel MOSFET.

The sources of the p-channel MOSFETs 31 and 33 are connected to a supply terminal which receives supply voltage VDD, the drains are respectively connected to output nodes NO1 and NO2 and the gates are respectively connected to input nodes I2 and I1. The sources of the n-channel MOSFETs 32 and 34 are respectively connected to the input nodes I1 and I2, the drains are respectively connected to the output nodes NO1 and NO2 and the gates are respectively connected to the output nodes NO2 and NO1. It is characteristic of the level conversion circuit shown in the FIG. 17 that the output nodes NO1 and NO2 of each circuit are respectively connected to the gates of the n-channel MOSFETs 34 and 32 in a crossing manner. The voltage of input signals CLK1 and CLK2 and the supply voltage VDD and the relation therebetween are same as those of the first and second embodiments.

Hereunder describes the operation of the level conversion circuit shown in FIG. 17. The p-channel MOSFET 33 becomes strong ON status because the voltage of the gate is that of the CLK1 at the low level and the voltage of the source is the supply voltage when CLK1 is low and CLK2 is high. Voltage Vout2 of the output node NO2 becomes higher because it reflects the supply voltage which is the voltage of the source of the p-channel MOSFET 33. The n-channel MOSFET 32 comes to have the increased voltage Vout2 of the output node NO2 as the voltage of the gate and becomes sufficiently strong ON status due to the relation between the voltage of the gate and the low level of the CLK1 which is the voltage of the source. At this time, the p-channel MOSFET 31 becomes OFF or weak ON status according to whether the absolute value of the threshold voltage Vtp of the p-channel MOSFET 31 is smaller than the absolute value of the difference between the supply voltage, which is the voltage of the source, and the voltage of CLK2 at the high level, which is the voltage of the gate. The ON status resistance of the n-channel MOSFET 32, therefore, becomes sufficiently lower than that of the p-channel MOSFET 31 and then voltage Vout1 of the output node NO1 becomes lower because it reflects the voltage of the CLK1 at low level, which is the voltage of the source of the n-channel MOSFET 32. The n-channel MOSFET 34, therefore, becomes OFF status or sufficiently weak ON status according to whether the absolute value of the threshold voltage Vtn of the n-channel MOSFET 34 is smaller than the absolute value of the difference between the lowered voltage Vout1 of the output node NO1 and the voltage of CLK2 at high level, which is the voltage of the source.

The p-channel MOSFET 31 becomes strong ON status because the voltage of the source is the supply voltage and the voltage of the gate is that of CLK2 at the low level when the CLK1 is high and the CLK2 is low. The voltage Vout1 of the output node NO1 becomes higher because it reflects the supply voltage which is the voltage of the source of the p-channel MOSFET 31. The n-channel MOSFET 34 accordingly comes to have the increased voltage Vout1 of the output node NO1 as the voltage of the gate and becomes sufficiently strong ON status due to the relation between the voltage of the gate and the voltage of CLK1 at low level, which is the voltage of the source. At this time, the p-channel MOSFET 33 becomes OFF or weak ON status according to whether the absolute value of the threshold voltage Vtp of the p-channel MOSFET 33 is smaller than the absolute value of the difference between the supply voltage, which is the voltage of the source, and the voltage of CLK1 at the high level, which is the voltage of the gate. The ON status resistance of the n-channel MOSFET 34, therefore, becomes sufficiently lower than that of the p-channel MOSFET 33 and the voltage Vout2 of the output node NO2 becomes lower because it reflects the voltage of the CLK2 at the low level, which is the voltage of the source of the n-channel MOSFET 34. The n-channel MOSFET 32, therefore, becomes OFF status or sufficiently weak ON status according to whether the absolute value of the threshold voltage Vtn of the n-channel MOSFET 32 is smaller than the absolute value of the difference between the lowered voltage Vout2 of the output node NO2 and the voltage of the CLK1 at the high level, which is the voltage of the source.

The drive inverters INV1 and INV2 convert the output voltage Vout1 to output voltage VOUT1 which changes between the supply voltage VDD and the ground voltage and the drive inverters INV3 and INV4 convert the output voltage Vout2 to output voltage VOUT2 which changes between the supply voltage VDD and the ground voltage.

Hereunder describes the result of simulation on the characteristic of the level conversion circuit according to this embodiment, which assumes that the level conversion circuit is structured by thin film transistors made of polycrystalline silicon. The speediness of the operation of the level conversion circuit 3 shown in FIG. 17 was firstly examined.

Figure 18A:
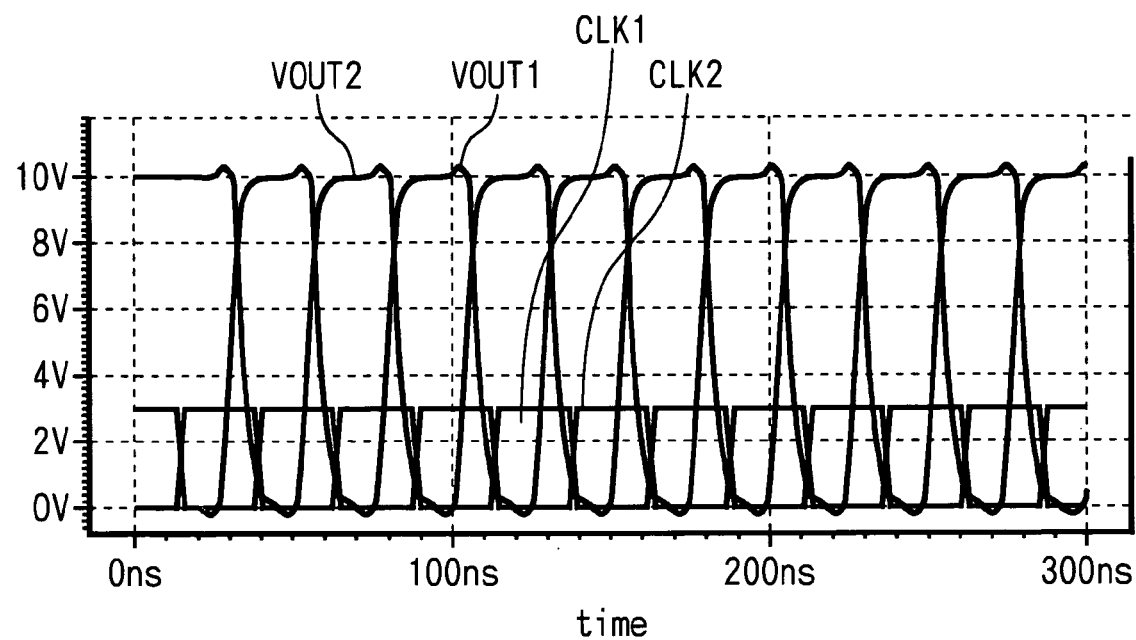
FIG. 18(a) is a waveform diagram of voltage showing the result of simulation which assumes that the thin film transistors made of the polycrystalline silicon are utilized in the embodiment 3.
Figure 18B:
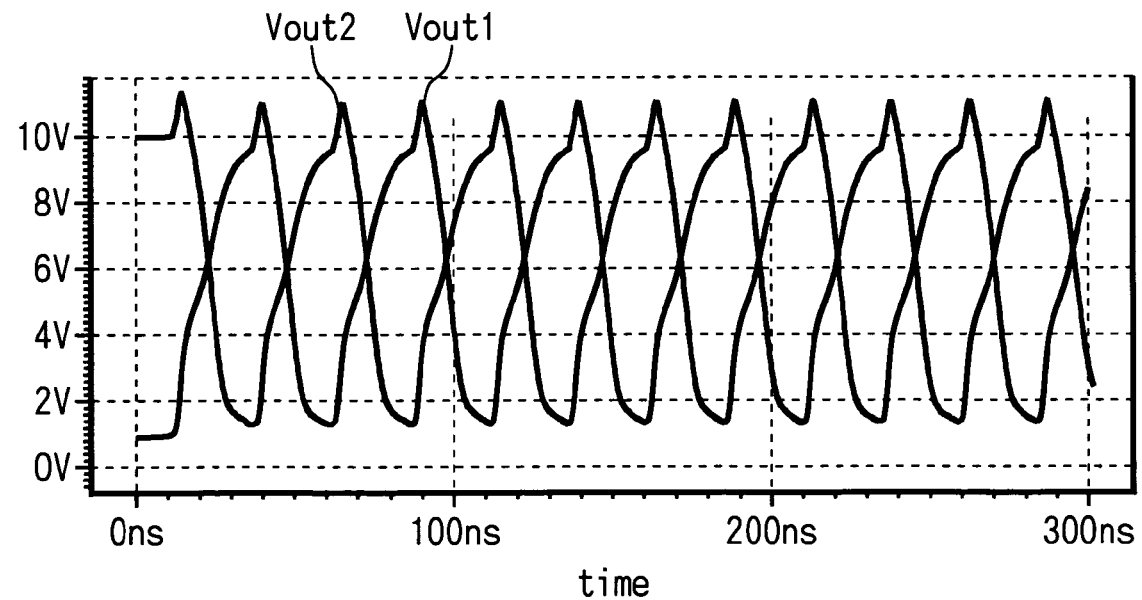
FIG. 18(b) is a waveform diagram of voltage showing the result of simulation which assumes that the thin film transistors made of the polycrystalline silicon are utilized in the embodiment 3.

FIGS. 18(a) and 18(b) show the result of the simulation. The frequency of the input signals CLK1 and CLK2 is set to 20 MHz, the amplitude of the input voltage is set to 3.0V and the supply voltage VDD is set to 10V. In the FIG. 18(a) are shown the waveforms of the input signals CLK1 and CLK2 and the output voltages VOUT1 and VOUT2, and in the FIG. 18(b) are shown the waveforms of the output voltages Vout1 and Vout2 of the output nodes NO1 and NO2.

It is confirmed from the result of the simulation shown in FIGS. 18(a) and 18(b) that the output voltages VOUT1 and VOUT2 can be obtained with the duty ratio of 50% in response to the input signals CLK1 and CLK2 even when the input signals-have such high frequency as 20 MHz. Thus the level conversion circuit 3 can operate at high speed when the circuit 3 is structured by thin film transistors made of polycrystalline silicon.

The simulation on the waveforms of the voltages is described next, which assumes that the threshold voltages of the p-channel MOSFETs and the n-channel MOSFETs of the level conversion circuit have shifted from designed values due to irregularity caused in manufacturing process. The frequency of the input signals CLK1 and CLK2 is set to 2 MHz in this simulation.

Figure 19A:
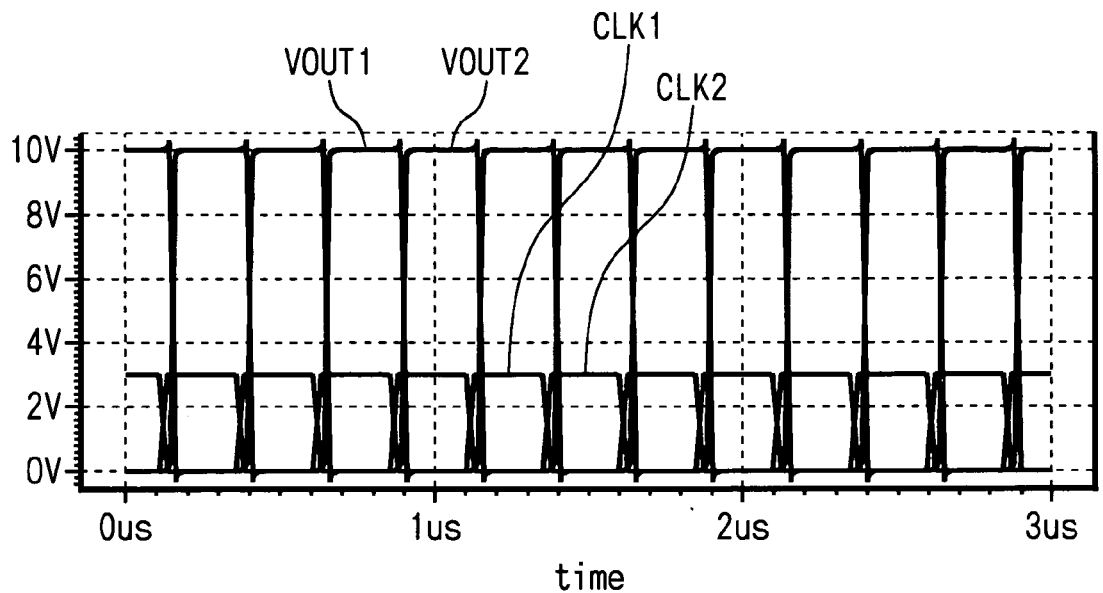
FIG. 19(a) is a waveform diagram of voltage showing the result of simulation which assumes that the threshold voltages of p-channel MOSFETs and n-channel MOSFETs are smaller than designed values in the embodiment 3.
Figure 19B:
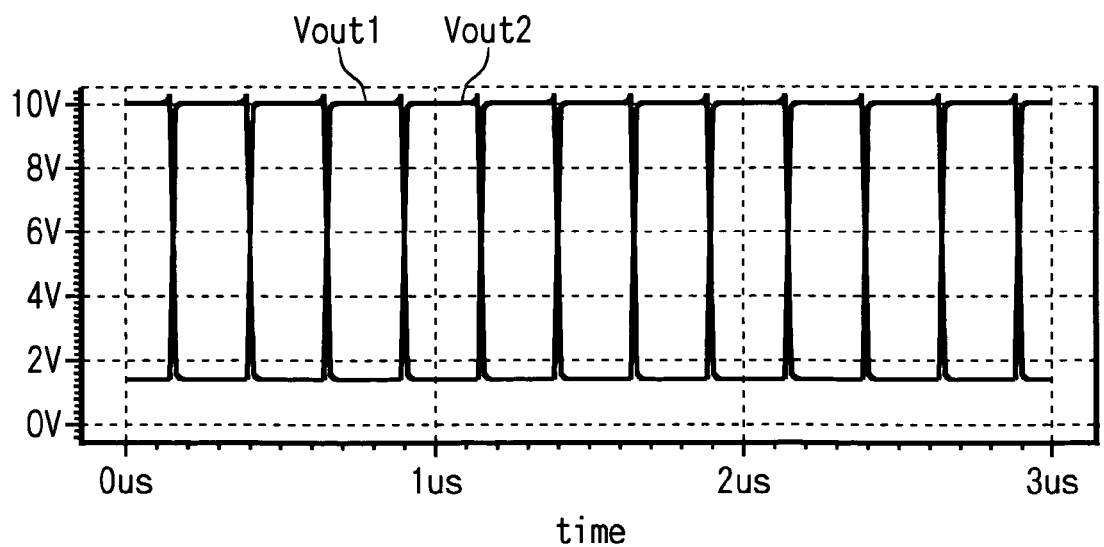
FIG. 19(b) is a waveform diagram of voltage showing the result of simulation which assumes that the threshold voltages of p-channel MOSFETs and n-channel MOSFETs are smaller than designed values in the embodiment 3.

FIG. 19(a) and 19(b) show the result of simulation which assumes that the threshold voltages of the p-channel MOSFETs and the n-channel MOSFETs are lower than the designed values. The threshold parameter (threshold voltage) of the p-channel MOSFETs is set to −0.5V and the threshold parameter (threshold voltage) of the n-channel MOSFETs is set to 0.5V in the simulation of FIGS. 19(a) and 19(b).

Figure 20A:
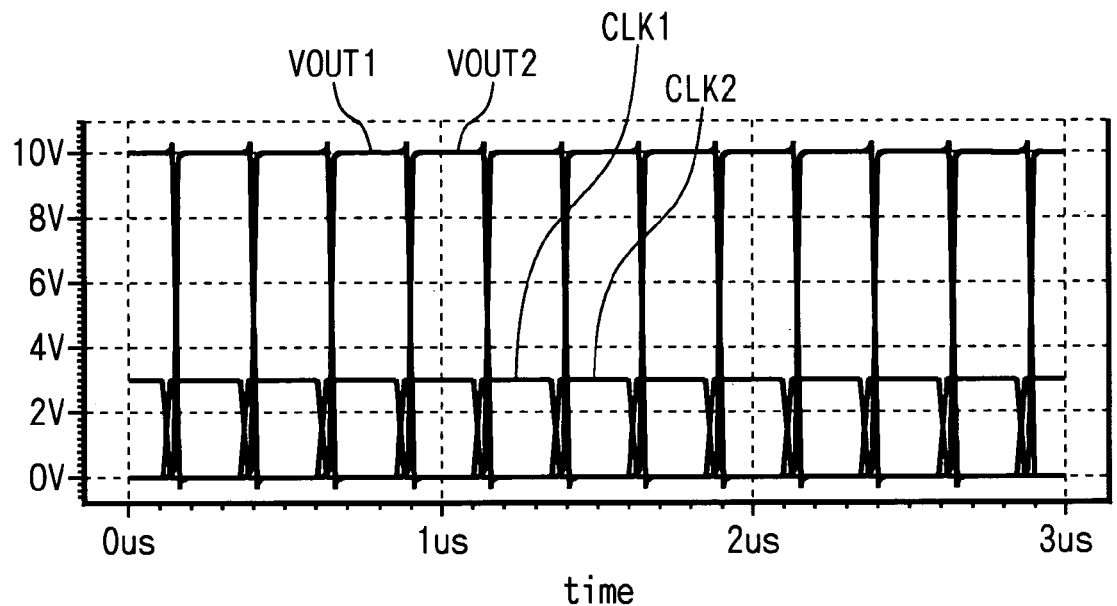
FIG. 20(a) is a waveform diagram of voltage showing the result of simulation which assumes that the threshold voltages of the p-channel MOSFETs and the n-channel MOSFETs are equal to the designed values in the embodiment 3.
Figure 20B:
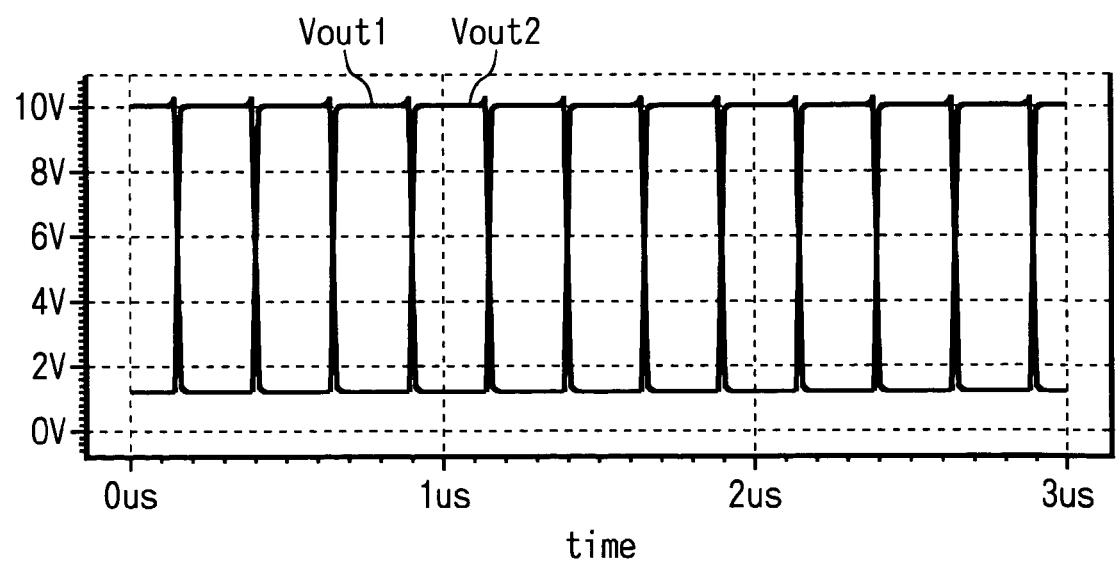
FIG. 20(b) is a waveform diagram of voltage showing the result of simulation which assumes that the threshold voltages of the p-channel MOSFETs and the n-channel MOSFET's are equal to the designed values in the embodiment 3.

FIGS. 20(a) and 20(b) show the result of simulation which assumes that the threshold voltages of the p-channel MOSFETs and the n-channel MOSFETs are equal to the designed values. The threshold parameter of the p-channel MOSFETs is set to −2V and the threshold parameter of the n-channel MOSFETs is set to 1.5V in the simulation of FIGS. 20(a) and 20(b).

Figure 21A:
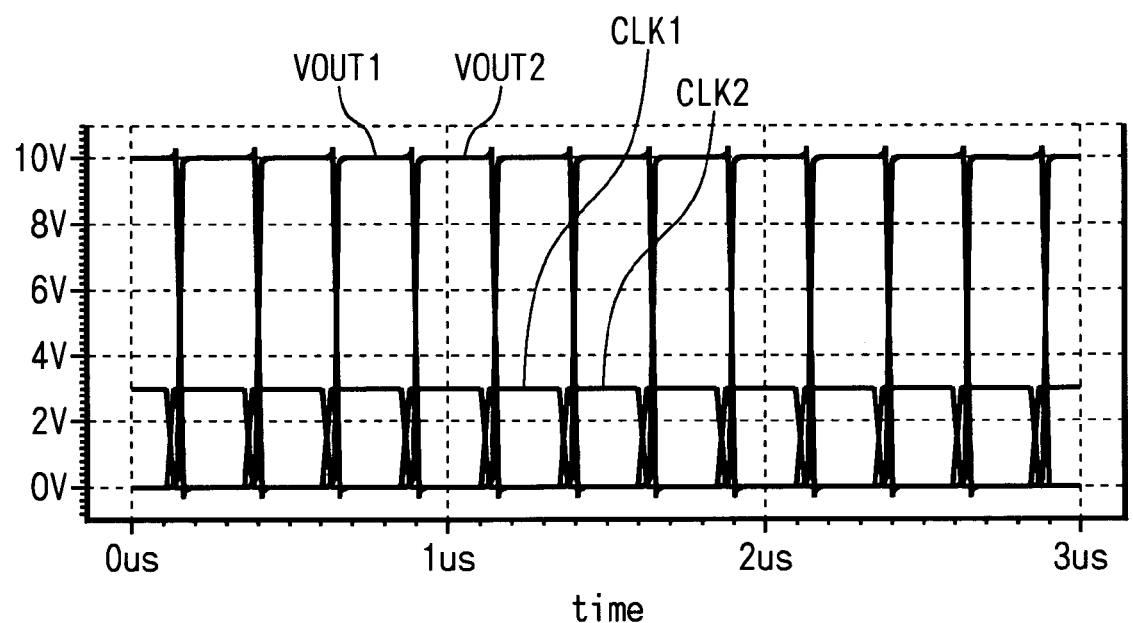
FIG. 21(a) is a waveform diagram of voltage showing the result of simulation which assumes that the threshold voltages of the p-channel MOSFETs and the n-channel MOSFETs are larger than the designed values in the embodiment 3.
Figure 21B:
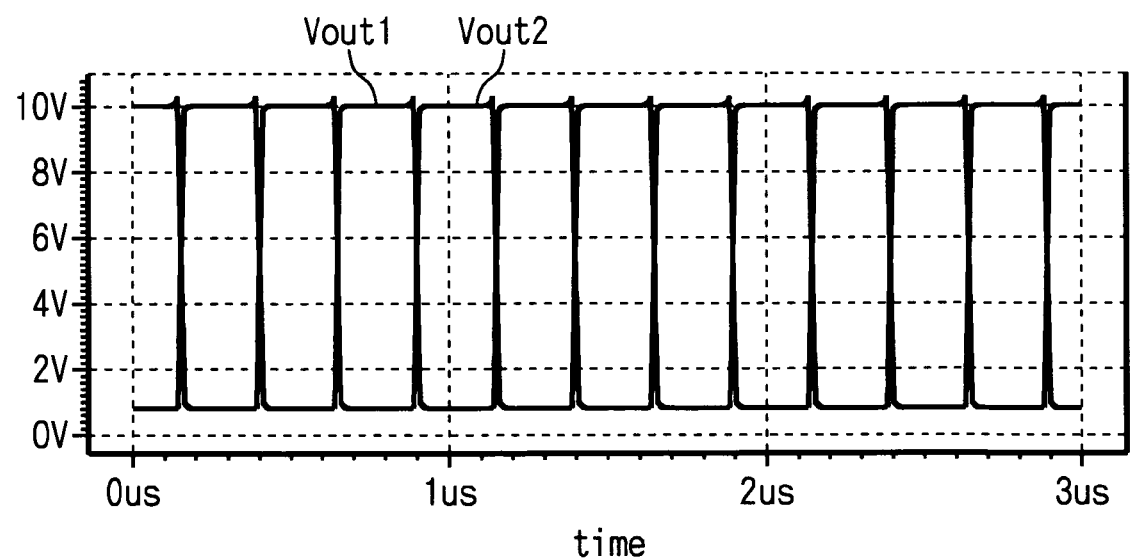
FIG. 21(b) is a waveform diagram of voltage showing the result of simulation which assumes that the threshold voltages of the p-channel MOSFETs and the n-channel MOSFETs are larger than the designed values in the embodiment 3.

FIGS. 21(a) and 21(b) show the result of simulation which assumes that the threshold voltages of the p-channel MOSFETs and the n-channel MOSFETs are higher than the designed values. The threshold parameter of the p-channel MOSFETs is set to −3.5V and the threshold parameter of the n-channel MOSFETs is set to 2.5V in the simulation of FIGS. 21(a) and 21(b).

It is confirmed from the result shown in the FIGS. 19(a), 19(b), 20(a), 20(b), 21(a) and 21(b) that the output voltages VOUT1 and VOUT2 can be obtained with the duty ratio of 50% in response to the input signals CLK1 and CLK2 even when the threshold voltages of the p-channel MOSFETs and n-channel MOSFETs shifted widely from the designed values.

The n-channel MOSFETs 32 and 34 of the level conversion circuit 3 according to this embodiment can more accurately be controlled to be ON or OFF because the gates of the n-channel MOSFETs 32 and 34 are respectively connected to the output nodes NO2 and NO1 of circuits in a crossing manner, one of which is structured by the p-channel MOSFET 31 and n-channel MOSFET 32 and the other is structured by the p-channel MOSFET 33 and the n-channel MOSFET 34, and therefore Vout1 and Vout2 which have difference lager than the difference of voltage between the high level and low level of the input signals CLK1 and CLK2 are inputted to the gates of the p-channel MOSFETs 32 and 34. The level conversion circuit 3, therefore, can operate accurately even when the voltage amplitude of the CLK1 and CLK2 is smaller than the threshold voltages of the p-channel MOSFETs 31 and 33 and the n-channel MOSFET 32 and 34.

The duty ratios of the output signals Vout1 and Vout2 can be controlled to match to each other even when they are different because the output signals Vout1 and Vout2 are complemented by each other. This is because the output signals Vout1 and Vout2 are respectively outputted from the circuits, one of which is structured by the p-channel MOSFET 31 and the n-channel MOSFET 32 and the other is structured by and structured by the p-channel. MOSFET 33 and the n-channel MOSFET 34, and the output signal of one circuit is utilized as the input signal of the other circuit. The output voltages Vout1 and Vout2 can, moreover, be acquired in accordance with the change of level of the input signals CLK1 and CLK2 even in the case that the threshold voltages of the p-channel MOSFETs 31 and 33 and the n-channel MOSFETs 32 and 34 differ widely from the designed values. Thus the level conversion circuit can operate with high accuracy in the case that the threshold voltages of the p-channel MOSFETs 31 and 33 and the n-channel MOSFETs 32 and 34 have shifted from the designed values due to irregularity caused in manufacturing process.

Figure 22:
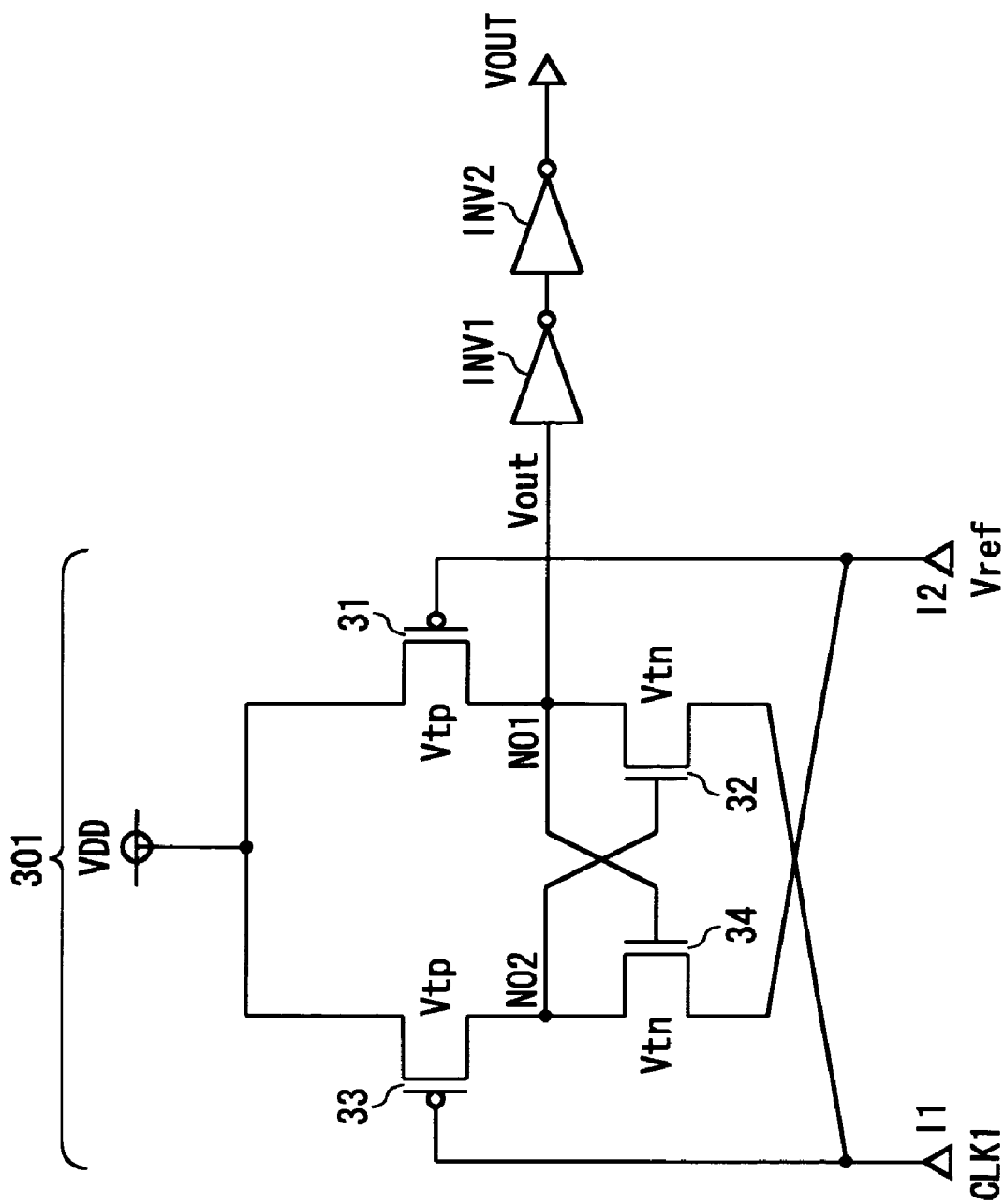
FIG. 22 is a circuit diagram showing another structure of the level conversion circuit shown in FIG. 17.

FIG. 22 shows another structure of the level conversion circuit shown in FIG. 17. Hereunder will be described only the difference of the structure from that of the level conversion circuit of FIG. 17. The inverters INV3 and INV4 are deleted in FIG. 22. However, the inverters INV3 and INV4 naturally may remain. A prescribed reference voltage signal Vref is inputted to the input node I2 instead of the input signal CLK2. The voltage of the Vref is lower than the supply voltage VDD and higher than the ground voltage. The voltage of the Vref is, for example, close to a mean value between the supply voltage VDD and the ground voltage.

The p-channel MOSFET 33 becomes strong ON status when the CLK1 is low and the output voltage Vout2, which is the voltage of the drain of the p-channel MOSFET 33, becomes sufficiently high. The n-channel MOSFET 32 accordingly becomes sufficient ON status. At this time, the p-channel MOSFET 31 is constantly ON because the Vref is impressed to the gate of the p-channel MOSFET 31 and the ON status resistance of the p-channel MOSFET 31 becomes higher than that of the n-channel MOSFET 32. As a result the output voltage Vout1 is decreased because it reflects the low level of the input signal CLK1. The n-channel MOSFET 34 becomes, therefore, OFF or sufficiently weak ON status.

The p-channel MOSFET 33 becomes OFF or weak ON status when the CLK1 is high. The n-channel MOSFET 32 becomes ON status which is weaker than when the CLK1 is low. The output voltage Vout1 is increased because the p-channel MOSFET 31 is constantly ON and the n-channel MOSFET 34 becomes ON status. The ON status resistance of the p-channel MOSFET 33 becomes higher than that of the n-channel MOSFET 34 because the p-channel MOSFET 33 is OFF or weak ON status and the output voltage Vout2 accordingly becomes equal to the Vref. The n-channel MOSFET 32, therefore, becomes OFF or sufficiently weak ON status. According to the structure described above, the level conversion circuit 3 of FIG. 22 can operate similarly as the level conversion circuit 3 shown in FIG. 17.

Hereunder will be mentioned concrete values. This level conversion circuit can operate at least within the range of Vref=(0 to 3) V, premising that the concrete values are: VDD=10V; CLK1=(0 to 3) V; VOUT=0 to VDD; Vtn=+1.5V; and Vtp=−2.0V.

It is preferable that relation between the operation capacity of each transistor is as follows when Vref=1.5V:
(operation capacity of the p-channel MOSFET 31)<or= (operation capacity of the n-channel MOSFET 32); and
(operation capacity of the p-channel MOSFET 33)<or= (operation capacity of the n-channel MOSFET 34).

It is preferable that the relation between the operation capacity of each transistor is as follows when Vref=0V:
(operation capacity of the p-channel MOSFET 31)<or= (operation capacity of the n-channel MOSFET 32); and
(operation capacity of the p-channel MOSFET 33)>or= (operation capacity of the n-channel MOSFET 34).

It is preferable that the relation between the operation capacity of each transistor is as follows when Vref=3V:
(operation capacity of the p-channel MOSFET 31)>or= (operation capacity of the n-channel MOSFET 32); and
(operation capacity of the p-channel MOSFET 33)<or= (operation capacity of the n-channel MOSFET 34).

The manner of thinking regarding the operation is similar as that of the case shown in FIG. 16 and it is preferable that the Vref is higher than the low level of the input signal and lower than the high level thereof. It is more preferable that the Vref is close to the center voltage of the input signal. Effect according to the structure described above is also similar to that shown in FIG. 16.

Embodiment 4

Figure 23:
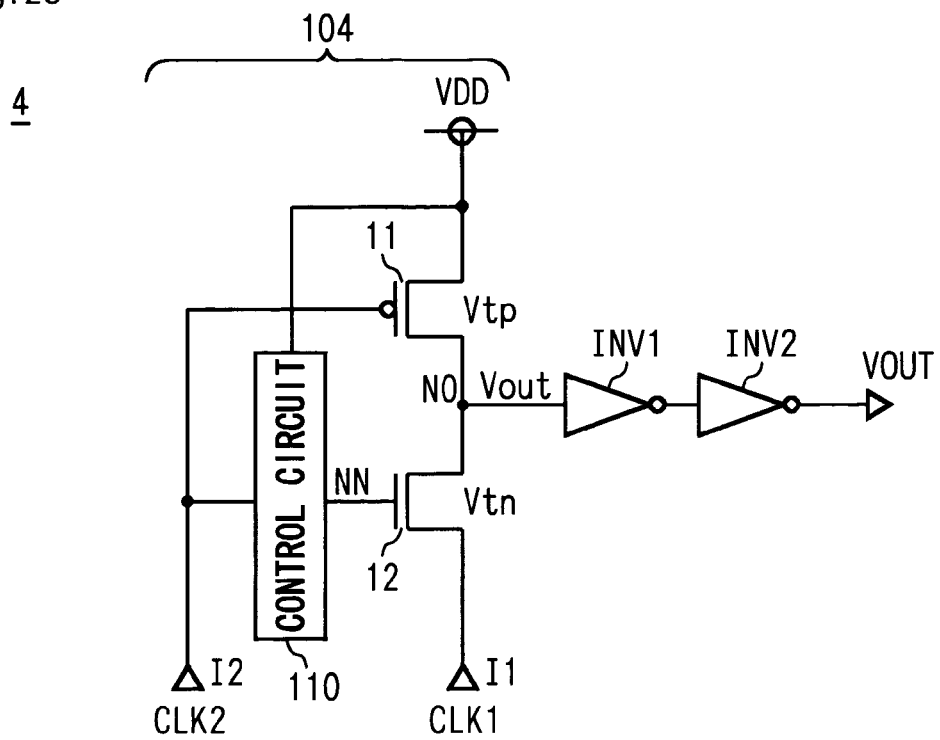
FIG. 23 is a circuit diagram showing the structure of a level conversion circuit according to an embodiment 4 of the present invention.

FIG. 23 is a circuit diagram showing the structure of a level conversion circuit according to a fourth embodiment of the present invention. In FIG. 23, a level conversion circuit 4 comprises a level conversion unit 104 and drive inverters INV1 and INV2. The level conversion unit 104 comprises a p-channel MOSFET 11, a n-channel MOSFET 12 and a control circuit 110. The drive inverters INV1 and INV2 are respectively structured by a CMOS circuit which is structured by a p-channel MOSFET and a n-channel MOSFET. The control circuit 110 receives supply voltage VDD and then outputs the voltage VDD after adjusting the voltage.

The source of the p-channel MOSFET 11 is connected to a supply terminal which receives the supply voltage VDD, the drain is connected to an output node NO and the gate is connected to an input node I2. The source of the n-channel MOSFET 12 is connected to an input node I1, the drain is connected to the output node NO and the gate is connected to the supply terminal which receives the supply voltage VDD via the control circuit 110.

Input signals CLK1 and CLK2 are inputted to the input nodes I1 and I2, which complementarily change between high level and low level. The difference of voltage between the high level and the low level of the input signals CLK1 and CLK2 is smaller than the difference between the supply voltage VDD and ground voltage. According to this embodiment, the low level of the input signals CLK1 and CLK2 is the ground voltage and the high level is lower than the supply voltage VDD and higher than the ground voltage.

The operation of the level conversion circuit 4 shown in FIG. 23 is basically same as that of the level conversion circuit 1 shown in FIG. 5. The level conversion circuit 4, however, differs from the level conversion circuit 1 in the point that it operates by receiving the voltage adjusted by the control circuit 110 as the voltage of the gate of the n-channel MOSFET 12.

The control circuit 110 receives the supply voltage VDD and then outputs voltage which is lower than the supply voltage VDD and higher than the voltage of the input signal CLK1 at the high level. The degree of the ON status of the n-channel MOSFET 12 is controlled according to the difference between the absolute value of the threshold voltage Vtn of the n-channel MOSFET 12 and the absolute value of the difference between the output voltage of the control circuit 110 and the voltage of the input signal CLK1, and then voltage Vout can be obtained from the output node NO.

The drive inverters INV1 and INV2 convert the output voltage Vout1 to output voltage VOUT which changes between the supply voltage VDD and the ground voltage. In this embodiment, the level conversion circuit can accurately operate even when there is large difference between the supply voltage VDD and the voltage of the input signals CLK1 and CLK2 at the high level.

Figure 24:
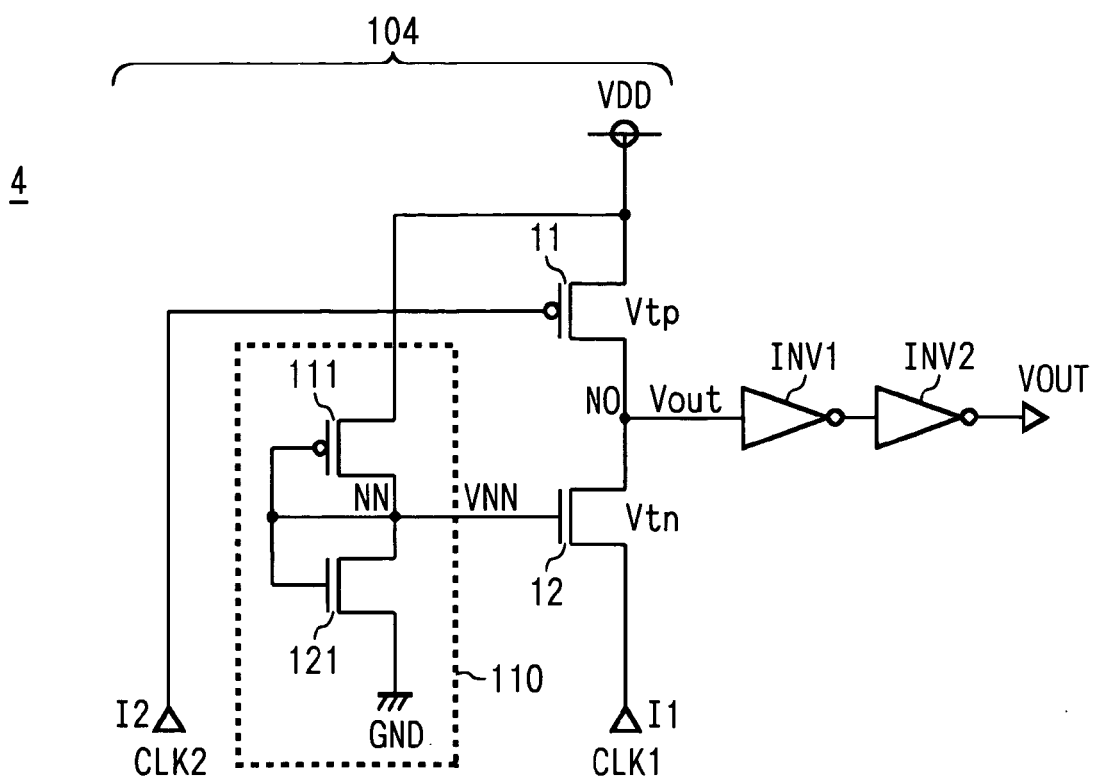
FIG. 24 is a circuit diagram showing the first example of the structure of the level conversion circuit shown in FIG. 23.

FIG. 24 is a circuit diagram showing the first example of the structure of the level conversion circuit 4 shown in FIG. 23. The control circuit 110 comprises a p-channel MOSFET 111 and a n-channel MOSFET 121. The source of the p-channel MOSFET 111 is connected to the supply terminal which receives the supply voltage VDD. The drain and gate of the p-channel MOSFET 111 are connected to a node NN. The source of the n-channel MOSFET 121 is connected to a supply terminal which receives the ground voltage. The drain and gate of the n-channel MOSFET 121 are connected to the node NN.

The voltage of the node NN becomes lower than the supply voltage VDD and the difference of the voltage therebetween is the threshold voltage Vtp of the p-channel MOSFET 111 and more. The voltage of the node NN becomes higher than the ground voltage and the difference of the voltage therebetween is the threshold voltage Vtn of the n-channel MOSFET 121 and more. Then the voltage of the node NN is finally determined according to the ON status resistance of the p-channel MOSFET 111 and the n-channel MOSFET 121.

Figure 25:
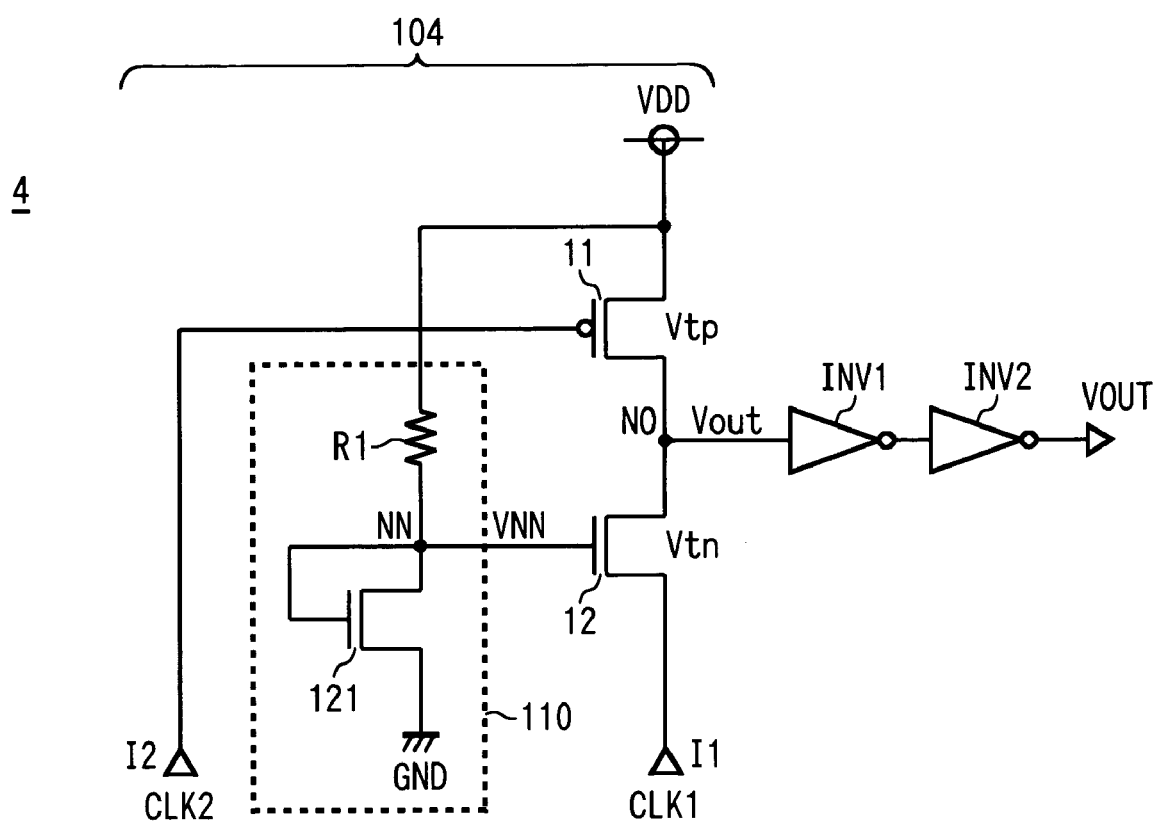
FIG. 25 is a circuit diagram showing the second example of the structure of the level conversion circuit shown in FIG. 23.
Figure 26:
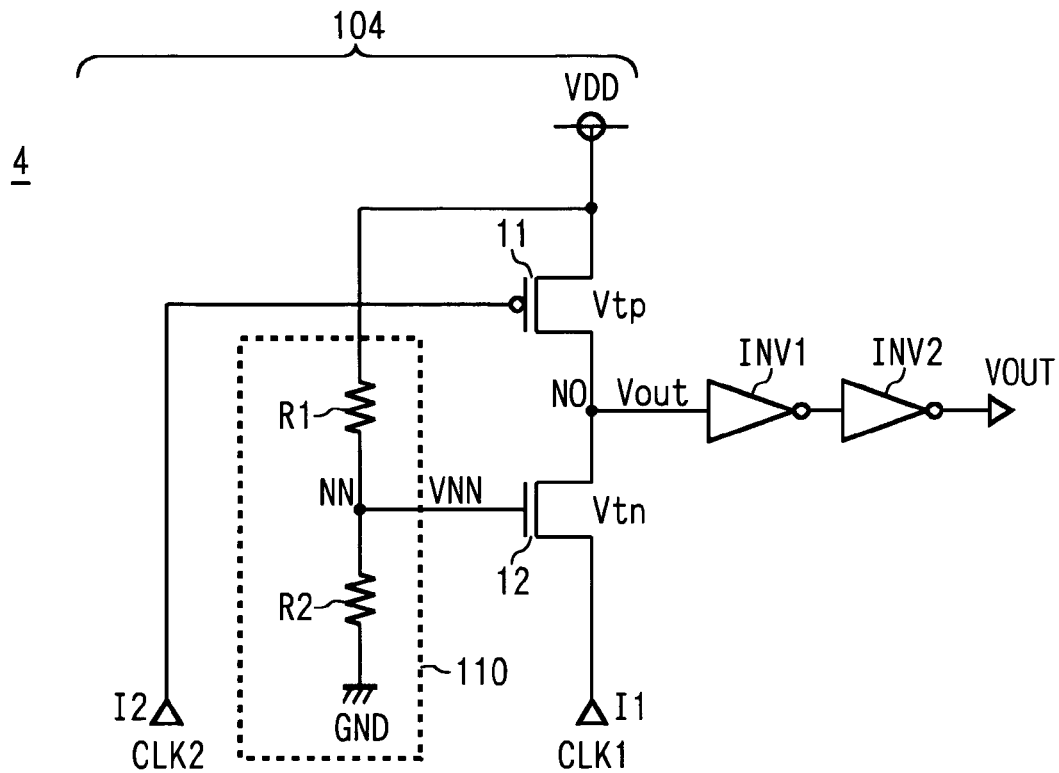
FIG. 26 is a circuit diagram showing the third example of the structure of the level conversion circuit shown in FIG. 23.

FIG. 25 and FIG. 26 respectively show the second and third examples of the structure of the level conversion circuit 4 shown in FIG. 23. The level conversion circuit 4 shown in the FIG. 25 differs from the level conversion circuit 4 shown in FIG. 24 in the point that the control circuit 110 comprises a resistor element R1 instead of the p-channel MOSFET 111. In this case, the voltage VNN of the node NN is determined according to the resistance of the resistor element R1 and the ON status resistance of the n-channel MOSFET 121.

The level conversion circuit 4 shown in the FIG. 26 differs from the level conversion circuit 4 shown in FIG. 25 in the point that the control circuit 110 comprises a resistor element R2 instead of the n-channel MOSFET 121. In this case, the voltage VNN of the node NN is determined according to the resistance of the resistor elements R1 and R2.

Embodiment 5

Figure 27:
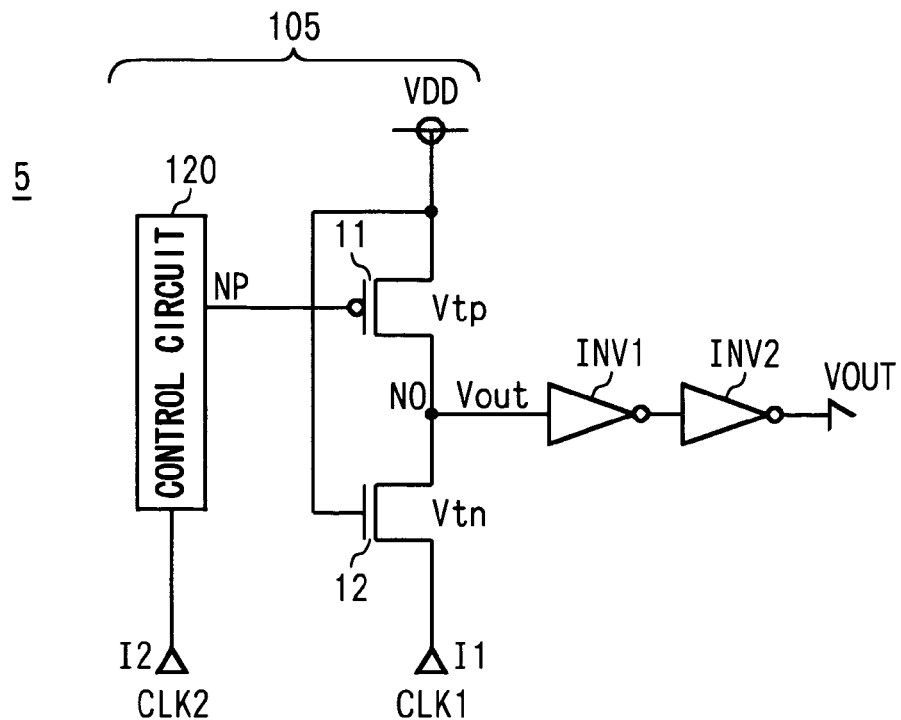
FIG. 27 is a circuit diagram showing the structure of a level conversion circuit according to an embodiment 5 of the present invention.

FIG. 27 is a circuit diagram showing the structure of a level conversion circuit according to a fifth embodiment of the present invention. In FIG. 27, a level conversion circuit 5 comprises a level conversion unit 105 and drive inverters INV1 and INV2. The level conversion unit 105 comprises a p-channel MOSFET 11, a n-channel MOSFET 12 and a control circuit 120. The drive inverters INV1 and INV2 are respectively structured by a CMOS circuit which is structured by a p-channel MOSFET and a n-channel MOSFET. The control circuit 120 receives an input signal CLK2 and then outputs the signal CLK2 after adjusting the voltage of the signal CLK2.

The source of the p-channel MOSFET 11 is connected to a supply terminal which receives supply voltage VDD, the drain is connected to an output node NO and the gate is connected to an input node I2 via the control circuit 120. The source of the n-channel MOSFET 12 is connected to an input node I1, the drain is connected to the output node NO and the gate is connected to the supply terminal which receives the supply voltage VDD.

An input signal CLK1 and the input signal CLK2 are inputted to the input nodes I1 and I2, which complementarily change between high level and low level. The difference of voltage between the high level and low level of the input signals CLK1 and CLK2 is smaller than the difference between the supply voltage VDD and ground voltage. According to this embodiment, the low level of the input signals CLK1 and CLK2 is the ground voltage and the high level is lower than the supply voltage VDD and higher than the ground voltage.

Figure 1:
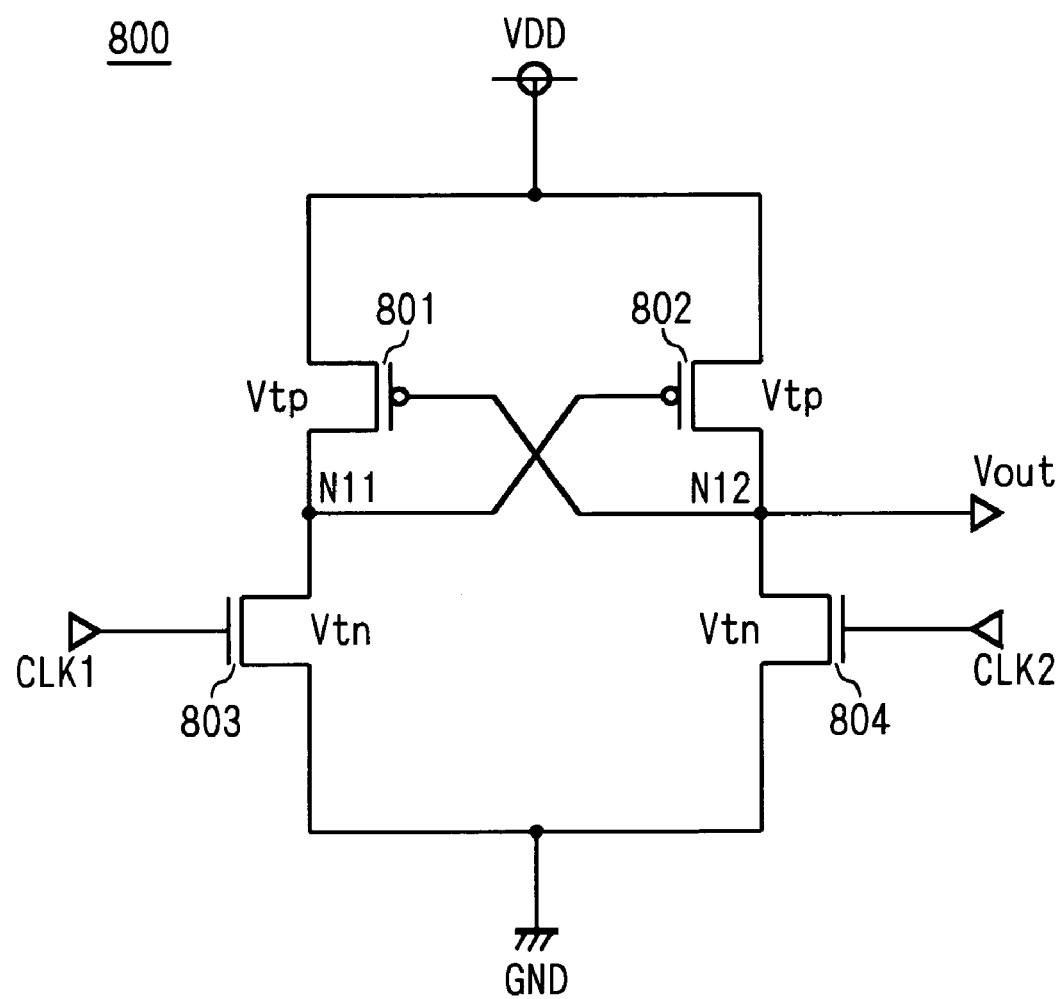
FIG. 1 is a circuit diagram showing the first example of a known level conversion circuit.
Figure 2:
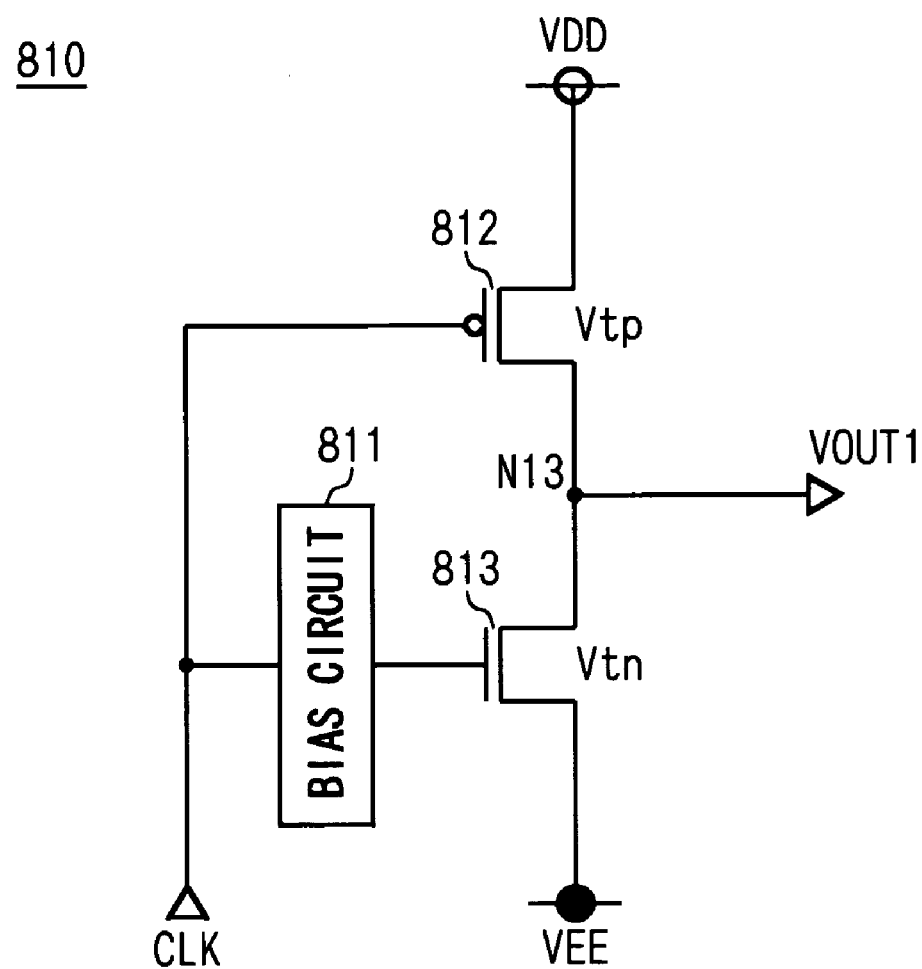
FIG. 2 is a circuit diagram showing the second example of a known level conversion circuit.
Figure 3:
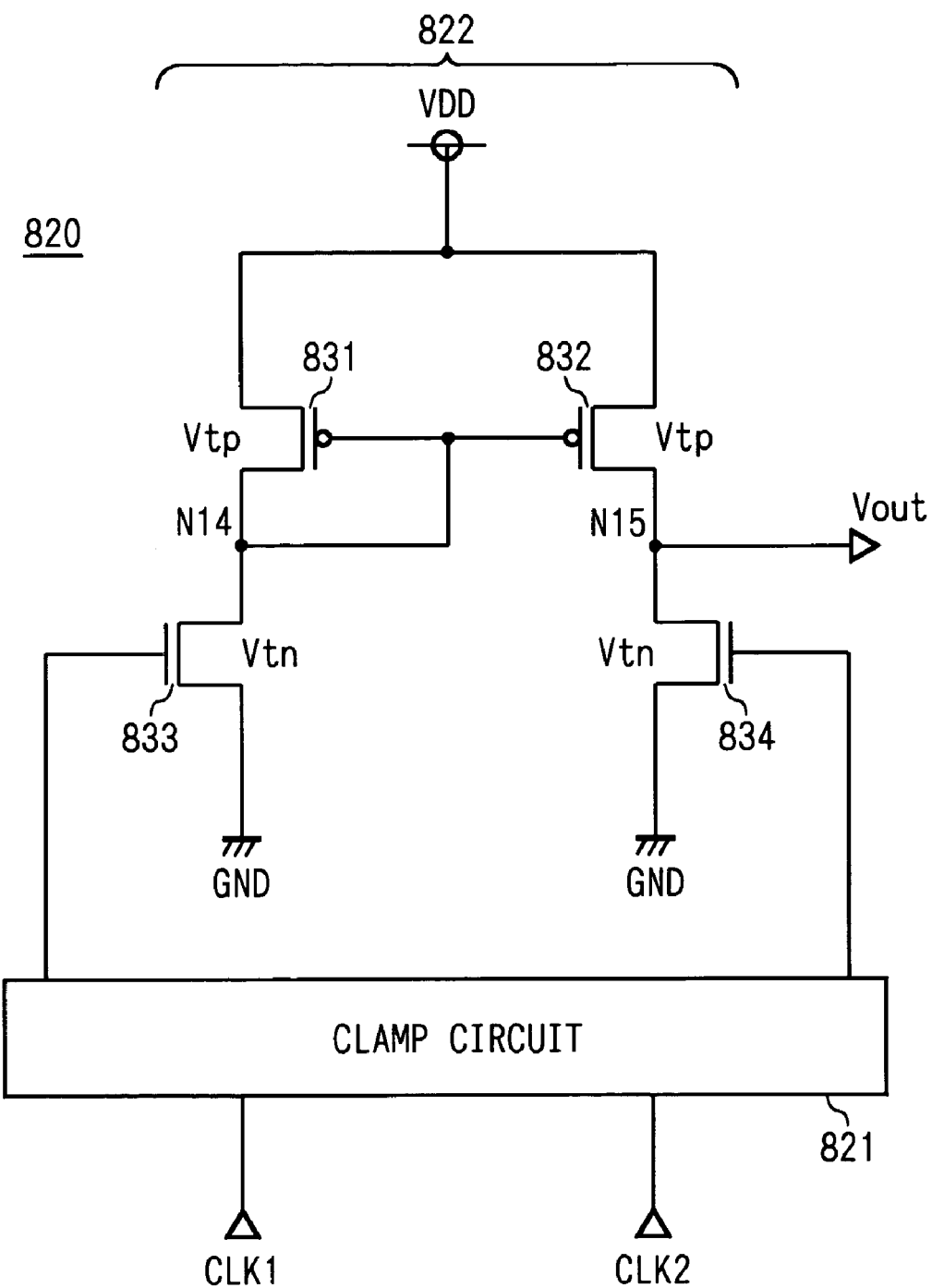
FIG. 3 is a circuit diagram showing the third example of a known level conversion circuit.
Figure 4:
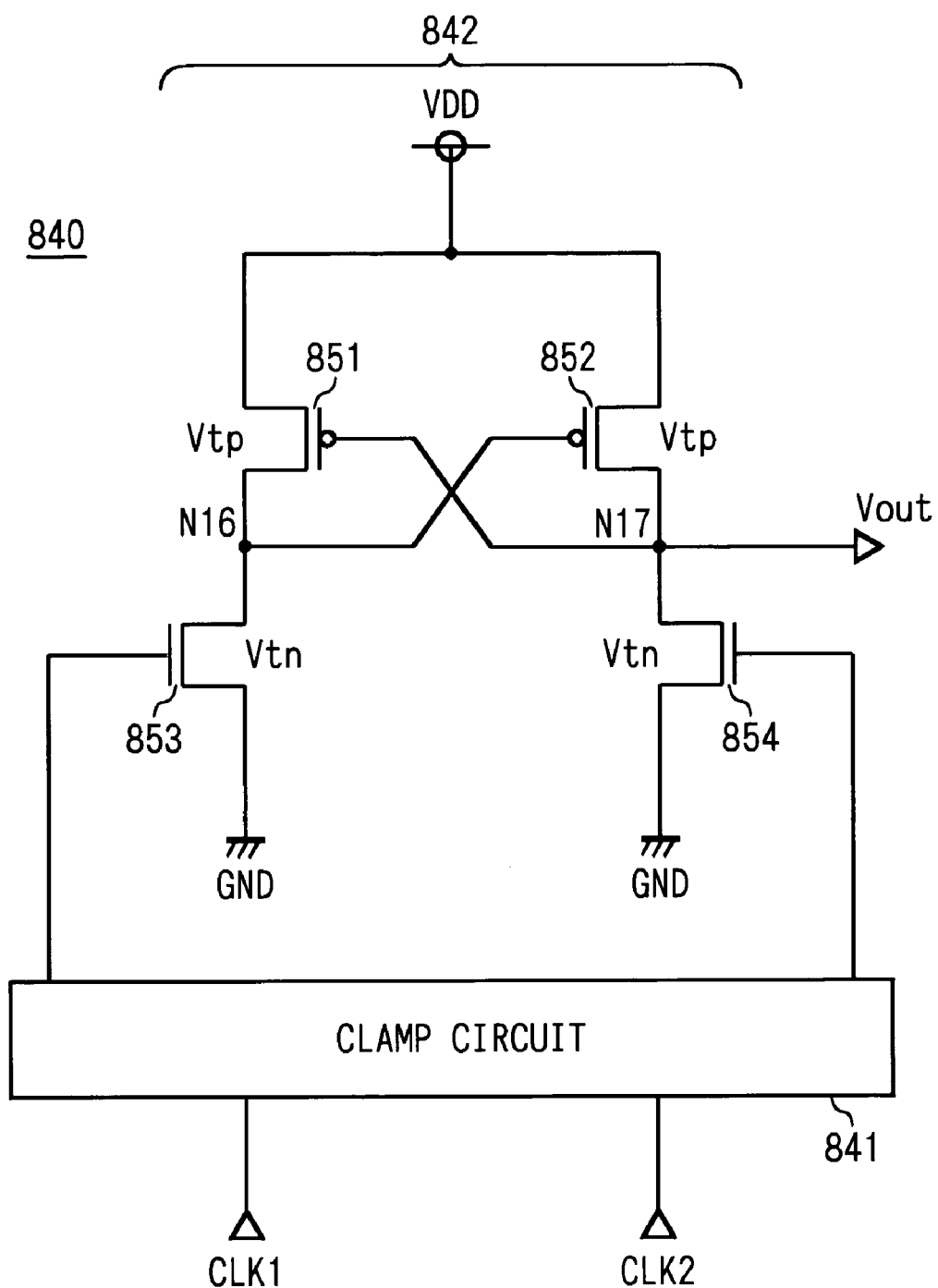
FIG. 4 is a circuit diagram showing the fourth example of a known level conversion circuit.

The operation of the level conversion circuit 5 shown in FIG. 27 is basically same as that of the level conversion circuit 1 shown in FIG. 1. The level conversion circuit 5, however, differs from the level conversion circuit 1 in the point that it operates by receiving the input signal CLK2 adjusted by the control circuit 120 as the voltage of the gate of the p-channel MOSFET 11.

The control circuit 120 receives the voltage of the input signal CLK2 at the high level and then outputs voltage which is lower than the supply voltage VDD and higher than the voltage of CLK2 at high level. The degree of the ON status of the p-channel MOSFET 11 is controlled according to the difference between the absolute value of the threshold voltage Vtp of the p-channel MOSFET 11 and the absolute value of the difference between the output voltage of the control circuit 120 and the voltage of the supply voltage VDD, and then voltage Vout can be obtained from the output node NO. In this embodiment, the level conversion circuit can accurately operate even when there is large difference between the supply voltage VDD and the voltage of the input signals CLK1 and CLK2 at the high level.

Figure 28:
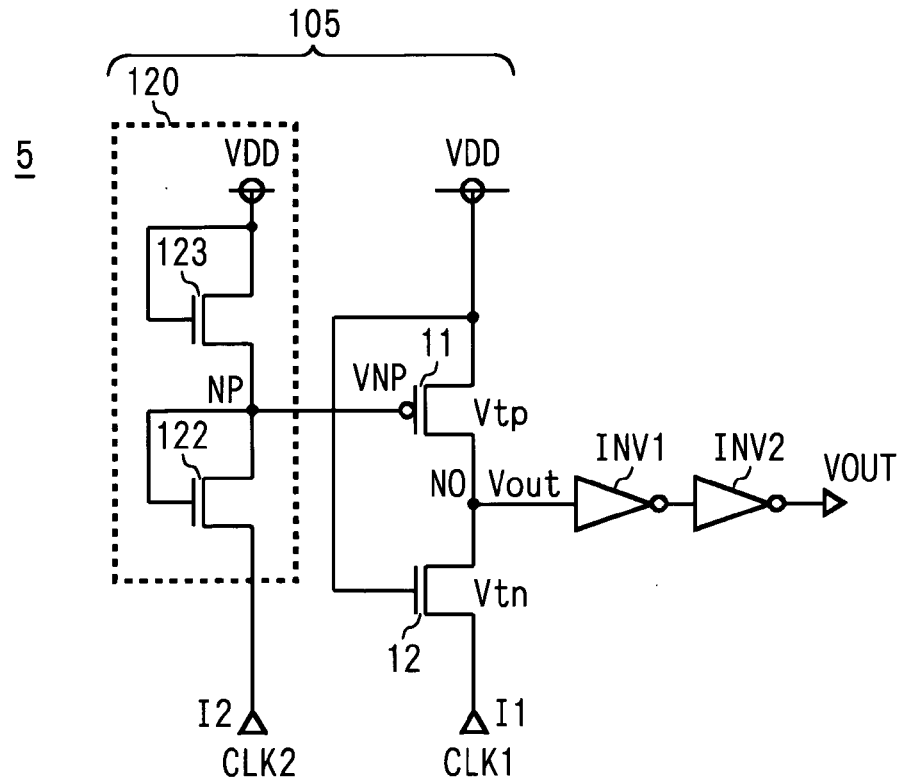
FIG. 28 is a circuit diagram showing the first example of the structure of the level conversion circuit shown in FIG. 27.

FIG. 28 is a circuit diagram showing the first example of the structure of the level conversion circuit 5 shown in FIG. 27. The control circuit 120 comprises a n-channel MOSFET 122 and a n-channel MOSFET 123. The source of the n-channel MOSFET 123 is connected to a node NP. The drain and gate of the n-channel MOSFET 123 are connected to a supply terminal which receives the supply voltage VDD. The source of the n-channel MOSFET 122 is connected to the input node I2. The drain and gate of the n-channel MOSFET 121 are connected to the node NP.

The n-channel MOSFET 123 serves as a load resistor because it is constantly ON. Voltage VNP of the node NP is controlled to be high or low according to the level of the input signal CLK2. The voltage VNP of the node NP at the high level is lower than the supply voltage VDD and higher than the voltage of the input signal CLK2 at high level. The difference of the voltage between the voltage VNP at high level and the supply voltage VDD is the threshold voltage Vtn of the n-channel MOSFET 123 and more.

Figure 29:
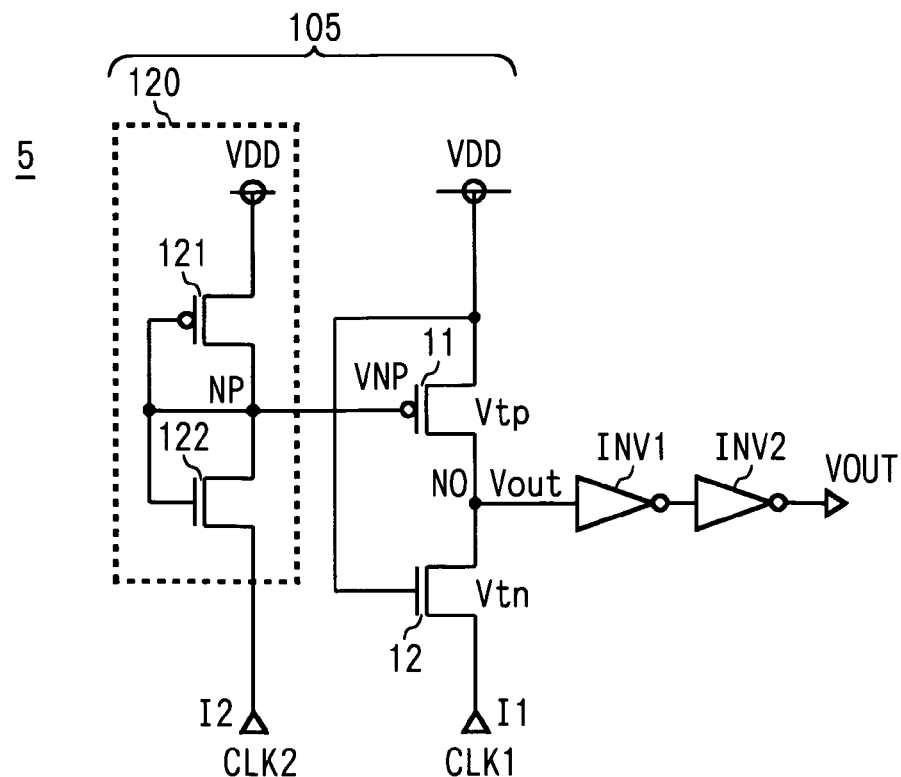
FIG. 29 is a circuit diagram showing the second example of the structure of the level conversion circuit shown in FIG. 27.

FIG. 29 is a circuit diagram showing the second example of the structure of the level conversion circuit 5 shown in FIG. 27. The level conversion circuit 5 shown in FIG. 29 differs from the level conversion circuit 5 shown in FIG. 28 in the point that the control circuit 120 comprises a p-channel MOSFET 121 instead of the n-channel MOSFET 123. In this case, the source of the p-channel MOSFET 121 is connected to the supply terminal which receives the supply voltage VDD. The drain and the gate are connected to the node NP.

The voltage VNP of the node NP is set to lower level than the supply voltage VDD by the p-channel MOSFET 121 and the difference therebetween is the absolute value of the threshold voltage Vtp and more. The voltage VNP of the node NP is controlled to be high or low by the n-channel MOSFET 122 according to the level of the input signal CLK2. The voltage VNP of the node NP at the high level is lower than the supply voltage VDD and higher than the voltage of the input signal CLK2 at high level. The difference of the voltage between the voltage VNP at high level and the supply voltage VDD is the threshold voltage Vtp of the p-channel MOSFET 121 and more.

Figure 30:
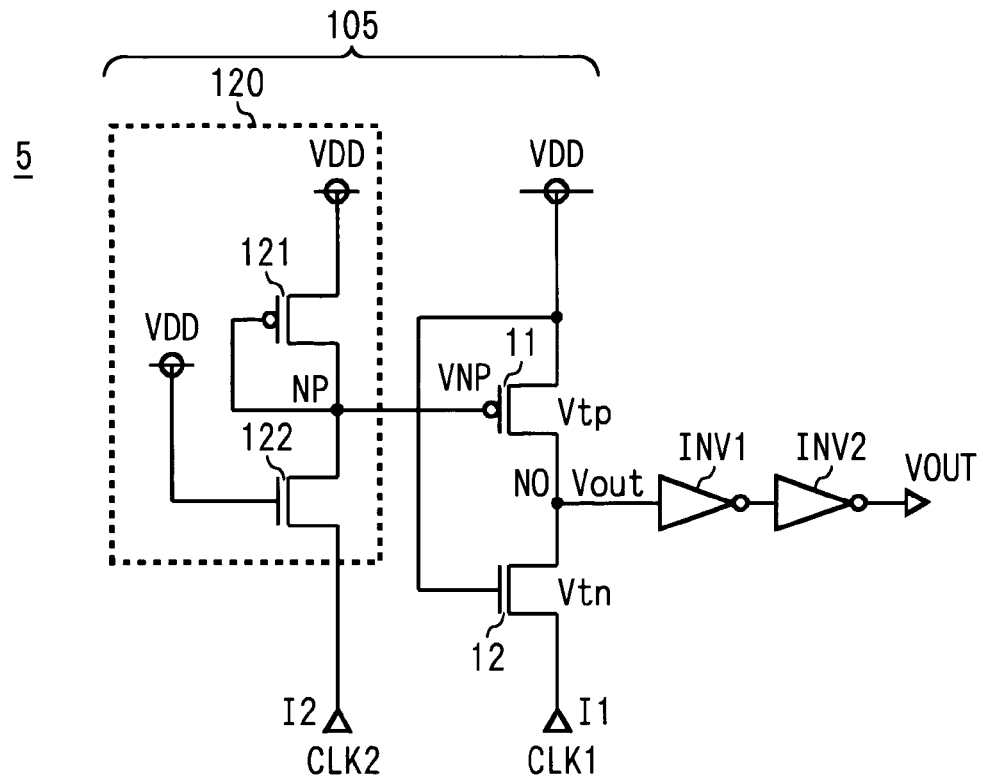
FIG. 30 is a circuit diagram showing the third example of the structure of the level conversion circuit shown in FIG. 27.

FIG. 30 is a circuit diagram showing the third example of the structure of the level conversion circuit 5 shown in FIG. 27. The level conversion circuit 5 shown in FIG. 30 differs from the level conversion circuit 5 shown in FIG. 29 in the point that the gate of the n-channel MOSFET 122 in the control circuit 120 is connected to the supply terminal which receives the supply voltage VDD. In this case, the n-channel MOSFET 122 is constantly ON and serves as the load resistor. Accordingly, the Voltage VNP of the node NP is controlled to be high or low by the n-channel MOSFET 122 in accordance with the level of the input signal CLK2. The voltage VNP of the node NP at the high level is lower than the supply voltage VDD and higher than the voltage of the input signal CLK2 at high level. The difference of the voltage between the voltage VNP at the high level and the supply voltage VDD is the threshold voltage Vtp of the p-channel MOSFET 121 and more.

Figure 31:
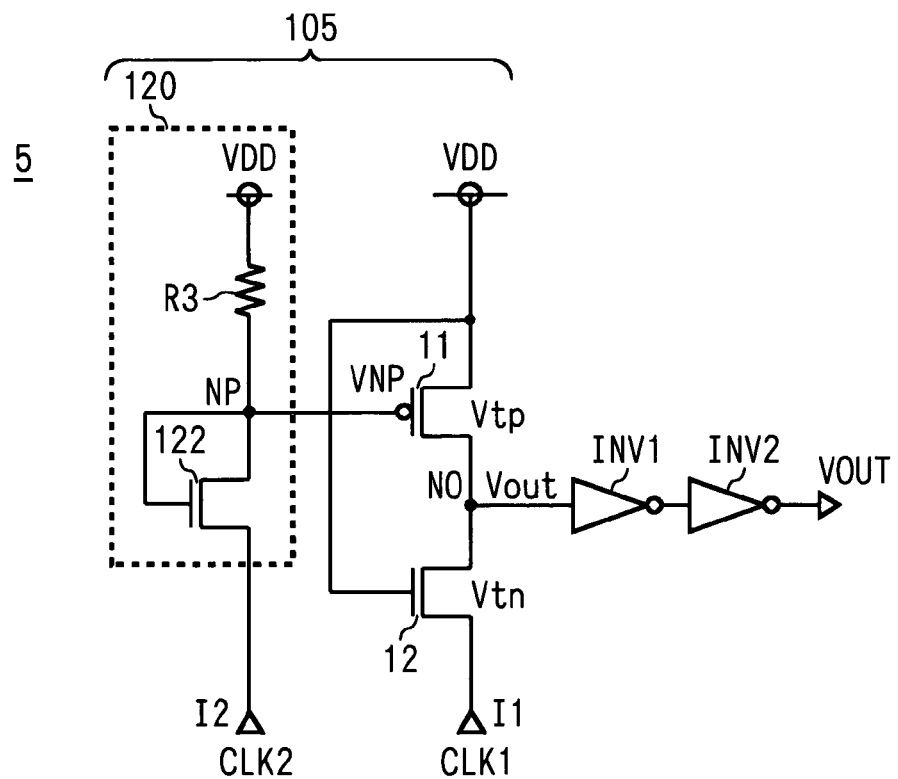
FIG. 31 is a circuit diagram showing the fourth example of the structure of the level conversion circuit shown in FIG. 27.

FIG. 31 is a circuit diagram showing the fourth example of the structure of the level conversion circuit 5 shown in FIG. 27. The level conversion circuit 5 shown in FIG. 31 differs from the level conversion circuit 5 shown in FIG. 29 in the point that the control circuit 120 comprises a resistor element R3 instead of the p-channel MOSFET 121. In this case, the ON status resistance of the n-channel MOSFET 122 changes according to the level of the input signal CLK2. The voltage VNP of the node NP is controlled to be high or low according to the ratio of the resistance values of the resistor element R3 and the ON status resistance of the p-channel MOSFET 121.

Figure 32:
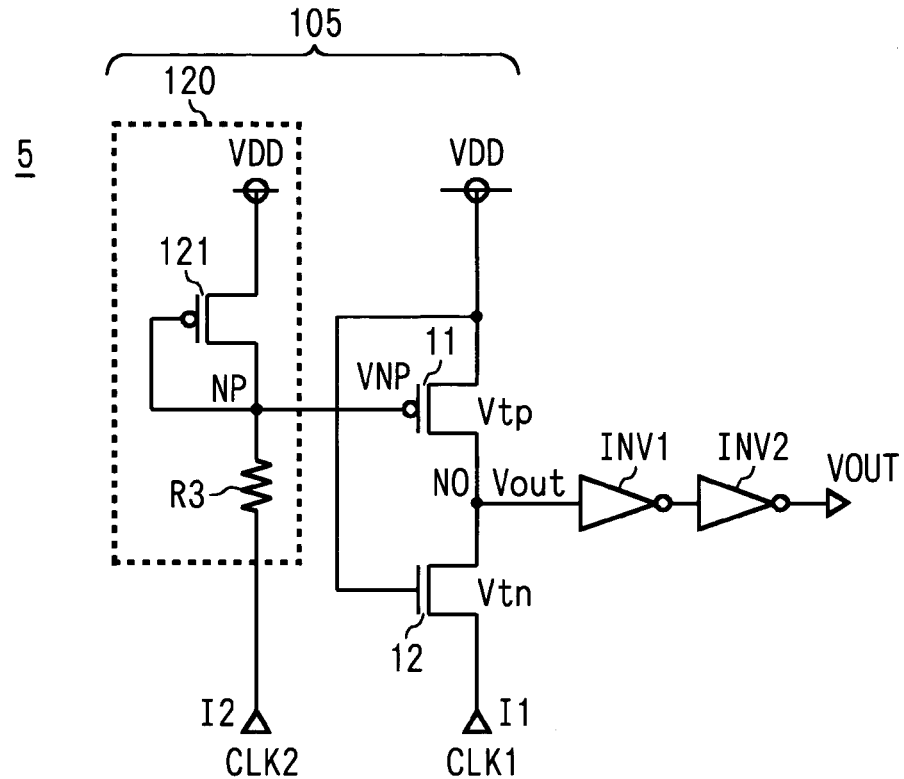
FIG. 32 is a circuit diagram showing the fifth example of the structure of the level conversion circuit shown in FIG. 27.

FIG. 32 is a circuit diagram showing the fifth example of the structure of the level conversion circuit 5 shown in FIG. 27. The level conversion circuit 5 shown in FIG. 32 differs from the level conversion circuit 5 shown in FIG. 29 in the point that the control circuit 120 comprises the resistor element R3 instead of the n-channel MOSFET 122. In this case, the ON status resistance of the p-channel MOSFET 121 changes according to the level of the input signal CLK2. The voltage VNP of the node NP is controlled to be high or low according to the ratio of the resistance values of the resistor element R3 and the on status resistance of the p-channel MOSFET 121.

Figure 33:
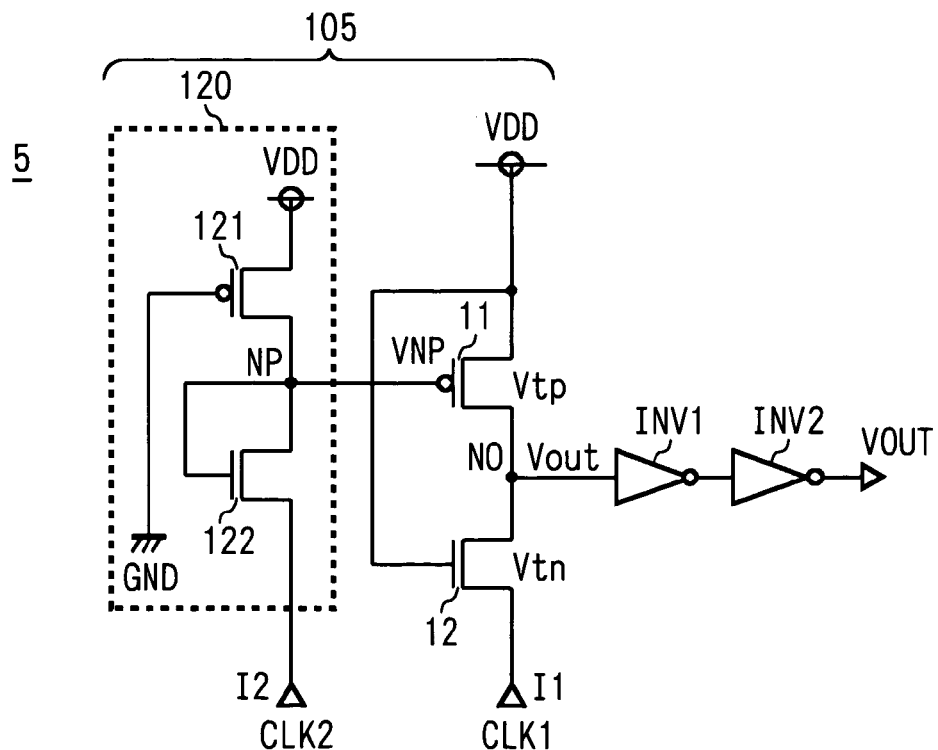
FIG. 33 is a circuit diagram showing the sixth example of the structure of the level conversion circuit shown in FIG. 27.

FIG. 33 is a circuit diagram showing the sixth example of the structure of the level conversion circuit 5 shown in FIG. 27. The level conversion circuit 5 shown in FIG. 33 differs from the level conversion circuit 5 shown in FIG. 29 in the point that the gate of the p-channel MOSFET 121 in the control circuit 120 is earthed being separated from other signals. The On status resistance of the n-channel MOSFET 122 changes according to the voltage level of the input signal CLK2 also by this structure, and accordingly the voltage VNP of the node NP is controlled to be high or low.

Figure 34:
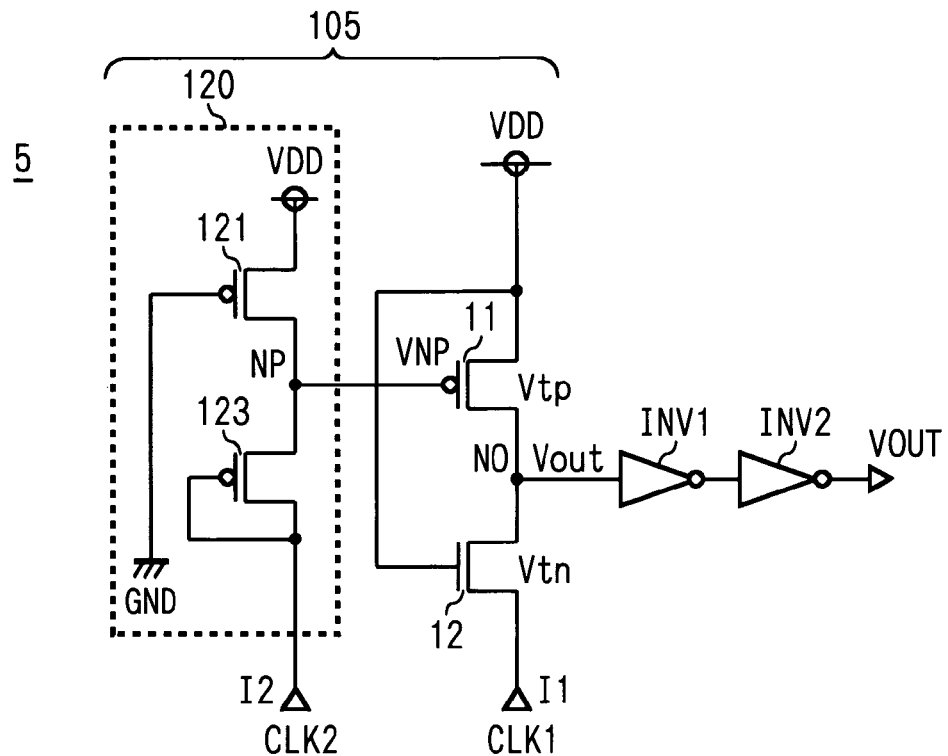
FIG. 34 is a circuit diagram showing the seventh example of the structure of the level conversion circuit shown in FIG. 27.

FIG. 34 is a circuit diagram showing the seventh example of the structure of the level conversion circuit 5 shown in FIG. 27. The level conversion circuit 5 shown in FIG. 34 differs from the level conversion circuit 5 shown in FIG. 33 in the point that the control circuit 120 comprises a p-channel MOSFET 123 instead of the n-channel MOSFET 122. In this case, the ON status resistance of the p-channel MOSFET 123 also changes according to the level of the input signal CLK2 and the voltage VNP of the node NP is controlled to be high or low.

Embodiment 6

Figure 35:
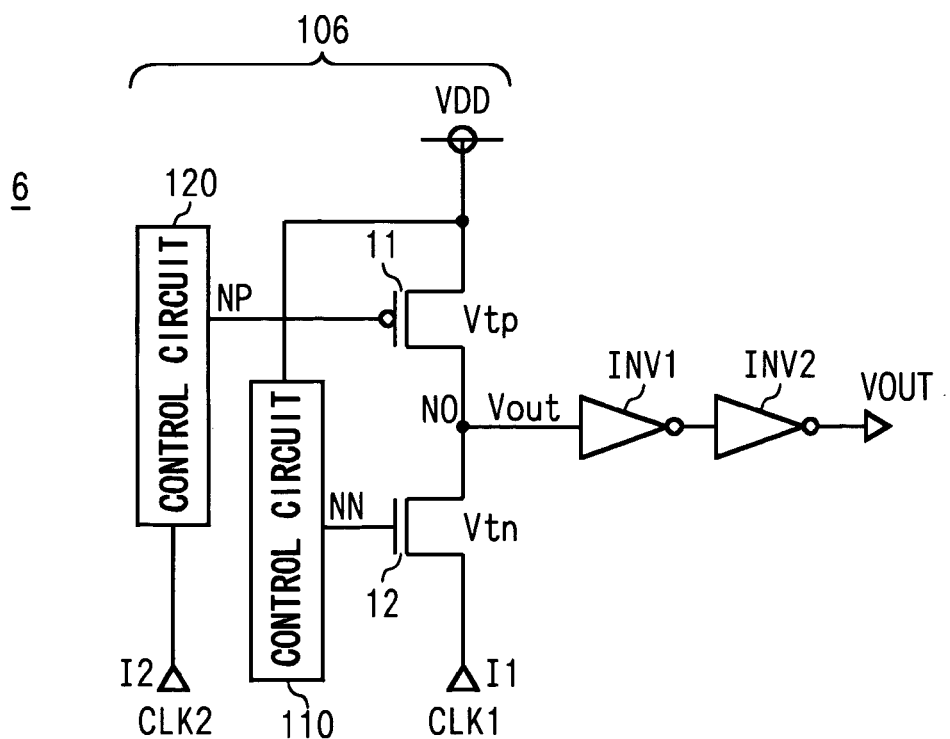
FIG. 35 is a circuit diagram showing the structure of a level conversion circuit according to an embodiment 6 of the present invention.

FIG. 35 is a circuit diagram showing the structure of a level conversion circuit according to a sixth embodiment of the present invention. A level conversion circuit 6 comprises a level conversion unit 106 and drive inverters INV1 and INV2. The level conversion unit 106 comprises a p-channel MOSFET 11, a n-channel MOSFET 12 and control circuits 110 and 120. The drive inverters INV1 and INV2 are structured by a CMOS circuit which is structured by a p-channel MOSFET and a n-channel MOSFET. The control circuit 110 receives supply voltage VDD and then outputs the voltage VDD after adjusting the voltage. The control circuit 120 receives an input signal CLK2 and then outputs the signal CLK2 after adjusting the voltage of the signal CLK2.

The source of the p-channel MOSFET 11 is connected to a supply terminal which receives the supply voltage VDD, the drain is connected to an output node NO and the gate is connected to an input node I2 via the control circuit 120. The source of the n-channel MOSFET 12 is connected to an input node I1, the drain is connected to the output node NO and the gate is connected to the supply terminal which receives the supply voltage VDD via the control circuit 110.

Input signals CLK1 and CLK2 are inputted to the input nodes I1 and I2, which complementarily change between high level and low level. The difference of voltage between the high level and low level of the input signals CLK1 and CLK2 is smaller than the difference of voltage between the supply voltage VDD and ground voltage. According to this embodiment, the low level of the input signals CLK1 and CLK2 is the ground voltage and the high level is lower than the supply voltage VDD and higher than the ground voltage.

The operation of the level conversion circuit 6 shown in FIG. 35 is basically same as that of the level conversion circuit 1 shown in FIG. 5. The level conversion circuit 6, however, differs from the level conversion circuit 1 in the point that it operates by receiving the CLK2 adjusted by the control circuit 120 as the voltage of the gate of the p-channel MOSFET 11 and by receiving the voltage adjusted by the control circuit 110 as the voltage of the gate of the n-channel MOSFET 12.

The control circuit 110 is same as the control circuit 110 of the level conversion circuit 4 shown in FIG. 23 and the control circuit 120 is same as the control circuit 120 of the level conversion circuit 5 shown in the FIG. 27.

The degree of the ON status of the p-channel MOSFET 11 is controlled according to the difference between the absolute value of threshold voltage Vtp of the p-channel MOSFET 11 and the absolute value of the difference between the output voltage of the control circuit 120 and the voltage of the input signal CLK2. The degree of the ON status of the n-channel MOSFET 12 is controlled according to the difference between the absolute value of the threshold voltage Vtn of the n-channel MOSFET 12 and the absolute value of the difference between the output voltage of the control circuit 110 and the voltage of input signal CLK1. Accordingly, the high level and low level of voltage Vout of the output node NO is controlled.

According to this embodiment, the level conversion circuit 6 can accurately operate even when there is large difference between the supply voltage VDD and the voltage of the input signals CLK1 and CLK2 at high level. The circuits shown in FIG. 24, FIG. 25 and FIG. 26 can be considered as examples of the control circuit 110 and the circuits shown in FIG. 28, FIG. 29, FIG. 30, FIG. 31, FIG. 32, FIG. 33 and FIG. 34 can be considered as examples of the control circuit 120.

Embodiment 7

Figure 36:
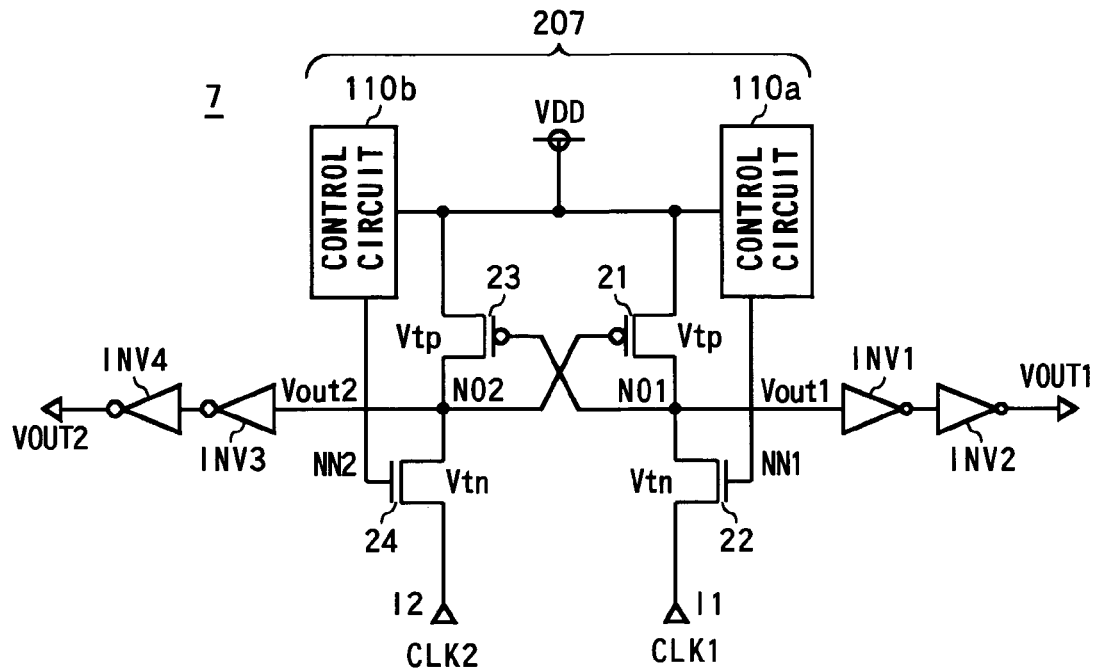
FIG. 36 is a circuit diagram showing the structure of a level conversion circuit according to an embodiment 7 of the present invention.

FIG. 36 is a circuit diagram showing the structure of a level conversion circuit according to a seventh embodiment of the present invention. A level conversion circuit 7 comprises a level conversion unit 207 and drive inverters INV1, INV2, INV3 and INV4. The level conversion unit 207 comprises p-channel MOSFETs 21 and 23, n-channel MOSFETs 22 and 24 and control circuits 110*a* and 110*b*. The drive inverters INV1, INV2, INV3 and INV4 are respectively structured by a CMOS circuit which is structured by a p-channel MOSFET and a n-channel MOSFET. The control circuits 110*a* and 110*b* are same as the control circuit 110 of the level conversion circuit 4 shown in FIG. 23.

The sources of the p-channel MOSFETs 21 and 23 are connected to a supply terminal which receives supply voltage VDD, the drains are respectively connected to output nodes NO1 and NO2 and the gates are respectively connected to the output nodes NO2 and NO1. The sources of the n-channel MOSFETs 22 and 24 are respectively connected to input nodes I1 and I2, the drains are respectively connected to the output nodes NO1 and NO2 and the gates are connected to the supply terminal which receives the supply voltage VDD respectively via the control circuits 110*a* and 110*b*. The voltage of input signals CLK1 and CLK2 and the supply voltage VDD and the relation therebetween are same as those of the second embodiment.

The operation of the level conversion circuit 7 shown in FIG. 36 is basically same as that of the level conversion circuit 2 shown in FIG. 11. The level conversion circuit 7, however, differs from the level conversion circuit 2 in the point that it operates by receiving the voltage adjusted by the control circuits 110*a* and 110*b* as the voltage of the gate of the p-channel MOSFETs 22 and 24.

The control circuits 110*a* and 110*b* receive the supply voltage VDD and then output voltage which is lower than the supply voltage VDD and higher than the voltage of CLK1 at high level. The degree of the ON status of the n-channel MOSFETs 22 and 24 is controlled according to the difference between the absolute value of the threshold voltage Vtn of the n-channel MOSFET 22 and 24 and the absolute value of the difference between the output voltage of the control circuits 110*a* and 110*b* and the voltage of the input signal CLK1, and then voltages Vout1 and Vout2 can be obtained from the output nodes NO1 and NO2.

The drive inverters INV1 and INV2 convert the output voltage Vout1 to output voltage VOUT1 which changes between the supply voltage VDD and the ground voltage, and the drive inverters INV3 and INV4 convert the output voltage Vout2 to output voltage VOUT2 which changes between the supply voltage VDD and the ground voltage.

In this embodiment, the level conversion circuit can accurately operate even when there is large difference between the supply voltage VDD and the voltage of the input signals CLK1 and CLK2 at the high level. The circuits shown in FIG. 24, FIG. 25 and FIG. 26 can be considered as examples of the control circuits 110*a* and 110*b*.

Embodiment 8

Figure 37:
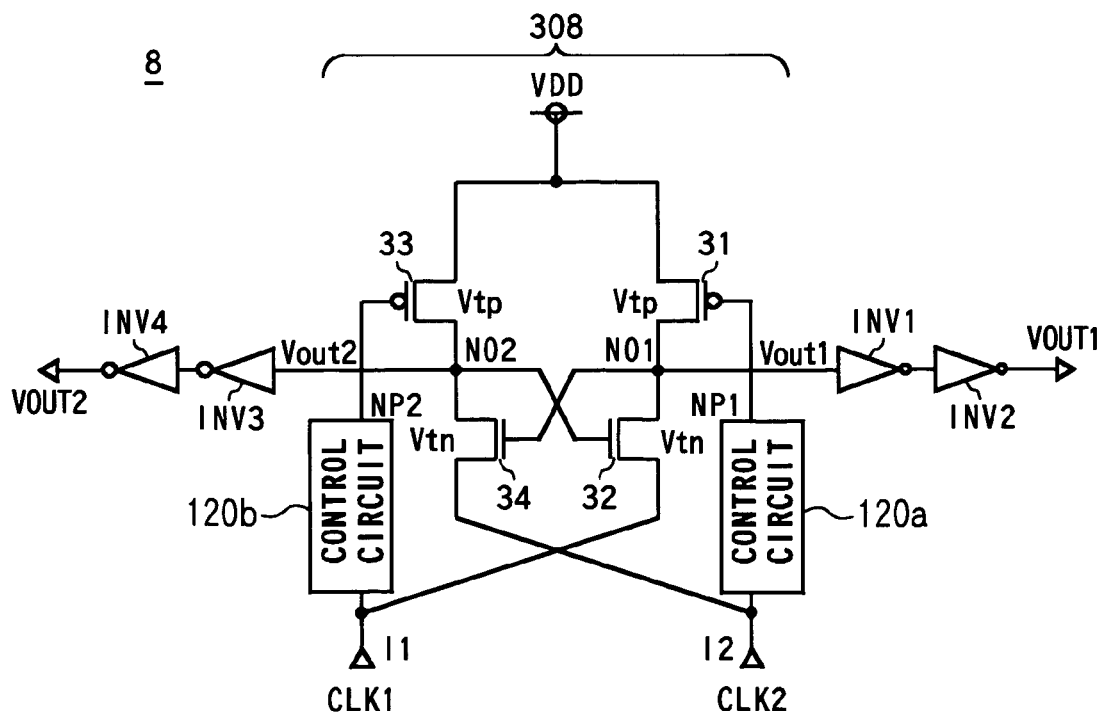
FIG. 37 is a circuit diagram showing the structure of a level conversion circuit according to an embodiment 8 of the present invention.

FIG. 37 is a circuit diagram showing the structure of a level conversion circuit according to an eighth embodiment of the present invention. A level conversion circuit 8 comprises a level conversion unit 308 and drive inverters INV1, INV2, INV3 and INV4. The level conversion unit 308 comprises p-channel MOSFETs 31 and 33, n-channel MOSFETs 32 and 34 and control circuits 120*a* and 120*b*. The drive inverters INV1, INV2, INV3 and INV4 are respectively structured by a CMOS circuit which is structured by a p-channel MOSFET and a n-channel MOSFET. The control circuits 120*a* and 120*b* are same as the control circuit 120 of the level conversion circuit 5 shown in FIG. 27.

The sources of the p-channel MOSFETs 31 and 33 are connected to a supply terminal which receives supply voltage VDD, the drains are respectively connected to output nodes NO1 and NO2 and the gates are connected to input nodes I2 and I1 respectively via the control circuits 120*a* and 120*b*. The sources of the n-channel MOSFETs 32 and 34 are respectively connected to the input nodes I1 and I2, the drains are respectively connected to the output nodes NO1 and NO2, and the gates are respectively connected to the output nodes NO2 and NO1 in a crossing manner. The voltage of input signals CLK1 and CLK2 and the supply voltage VDD and the relation therebetween are same as those of the third embodiment.

The operation of the level conversion circuit 8 shown in FIG. 37 is basically same as that of the level conversion circuit 3 shown in FIG. 17. The level conversion circuit 8, however, differs from the level conversion circuit 3 in the point that it operates by receiving the voltage adjusted by the control circuits 120*a* and 120*b* as the voltage of the gate of the p-channel MOSFETs 32 and 34.

The control circuits 120*a* and 120*b* respectively receive input signals CLK2 and CLK1 and then output the input signals CLK2 and CLK1 after adjusting them to have voltage which is lower than the supply voltage VDD and higher than the voltage of CLK1 and CLK2 at high level.

The degree of the ON status of the n-channel MOSFETs 32 and 34 is controlled according to the difference between the absolute values of the threshold voltage Vtn of the n-channel MOSFETs 32 and 34 and the absolute values of the difference between the output voltage of the control circuits 120*a* and 120*b* and the voltage of the input signals CLK2 and CLK1, and then voltages Vout can be obtained from the output nodes NO.

The drive inverters INV1 and INV2 convert the output voltage Vout1 to output voltage VOUT1 which changes between the supply voltage VDD and the ground voltage. The drive inverters INV3 and INV4 convert the output voltage Vout2 to output voltage VOUT2 which changes between the supply voltage VDD and the ground voltage.

In this embodiment, the level conversion circuit can accurately operate even when there is large difference between the supply voltage VDD and the voltage of the input signals CLK1 and CLK2 at the high level. The circuits shown in FIG. 28, FIG. 29, FIG. 30, FIG. 31, FIG. 32, FIG. 33 and FIG. 34 can be considered as examples of the control circuits 120a and 120b.

Embodiment 9

Figure 38:
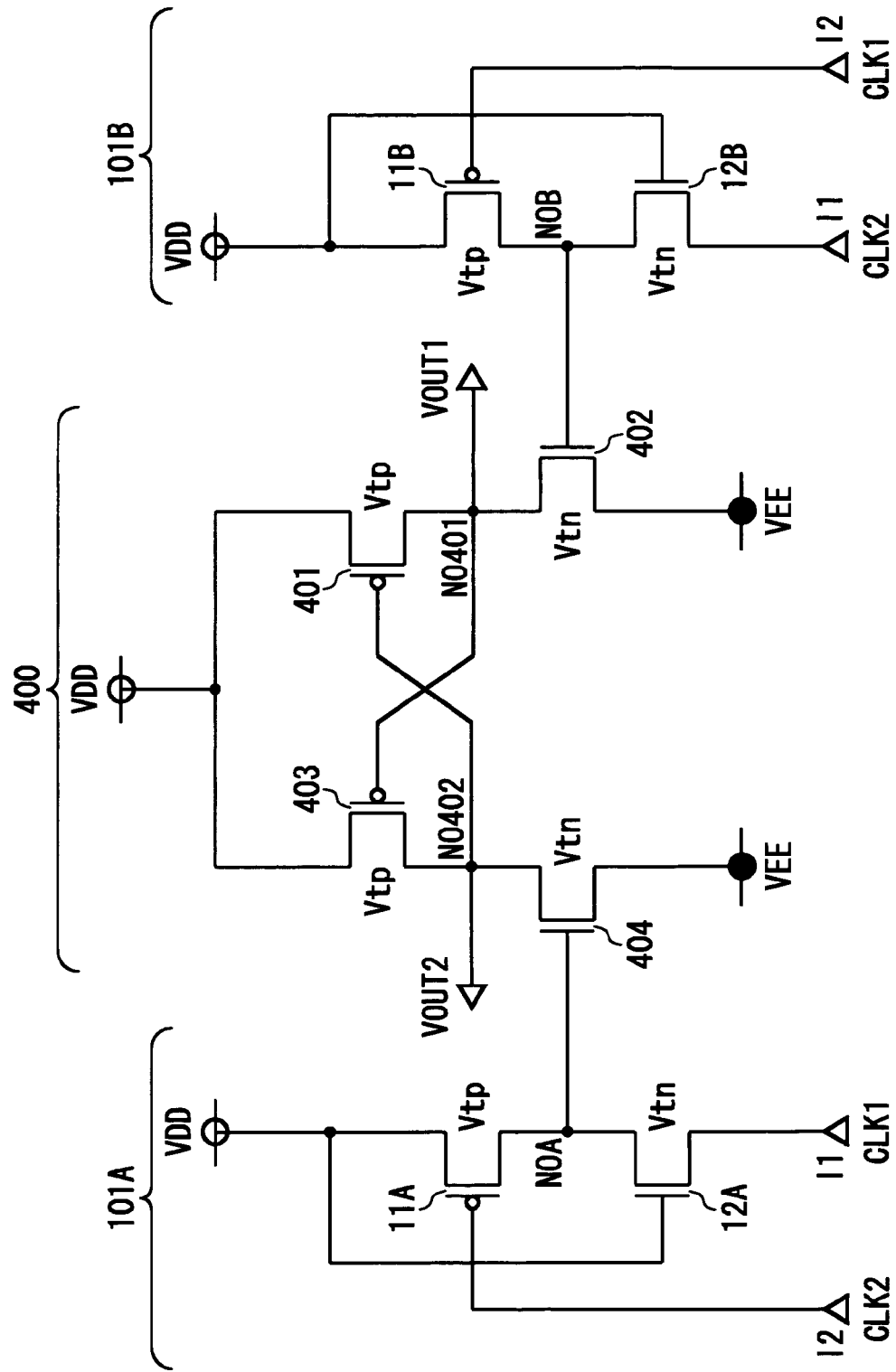
FIG. 38 is a circuit diagram showing the structure of a level conversion circuit according to an embodiment 9 of the present invention.

FIG. 38 is a circuit diagram showing the structure of a level conversion circuit according to a ninth embodiment of the present invention. A level conversion circuit 9 comprises level conversion units 101A and 101B and a differential amplifying circuit 400 of a PMOS cross couple type.

The structure of the level conversion units 101A and 101B is similar to that of the level conversion unit 101 according to the first embodiment. However, input signals CLK1 and CLK2 are inputted respectively to input nodes I1 and I2 of the level conversion unit 101A and the input signals CLK2 and CLK1 are respectively inputted to input nodes I1 and I2 of the level conversion unit 101B.

The differential amplifying circuit 400 comprises p-channel MOSFETs 401 and 403 and n-channel MOSFETs 402 and 404. The sources of the p-channel MOSFETs 401 and 403 are connected to a supply terminal which receives supply voltage VDD, the drains are respectively connected to output nodes NO401 and NO402, and the gates are connected to the output nodes NO402 and NO401 in a crossing manner. Prescribed voltage VEE is given to the sources of the n-channel MOSFETs 402 and 404, the drains are respectively connected to the output nodes NO401 and NO402, and the gates are respectively connected to the output nodes NOB and NOA of the level conversion unit 101B and 101A. The prescribed voltage VEE may be positive voltage which is lower than the supply voltage VDD, may be ground voltage or may be negative voltage. The clock signal CLK1 may be inputted to the right one of the VEEs shown in FIG. 38 and the clock signal CLK2 may be inputted to the left one of the VEEs shown in FIG. 38.

Output voltage VOUT1 and output voltage VOUT2 which change complementarily are outputted from the output nodes NO401 and NO402 of the differential amplifying circuit 400 in the level conversion circuit 9 according to this embodiment. The output voltage VOUT1 and the output voltage VOUT2 change between the supply voltage VDD and the prescribed voltage VEE.

Embodiment 10

Figure 39:
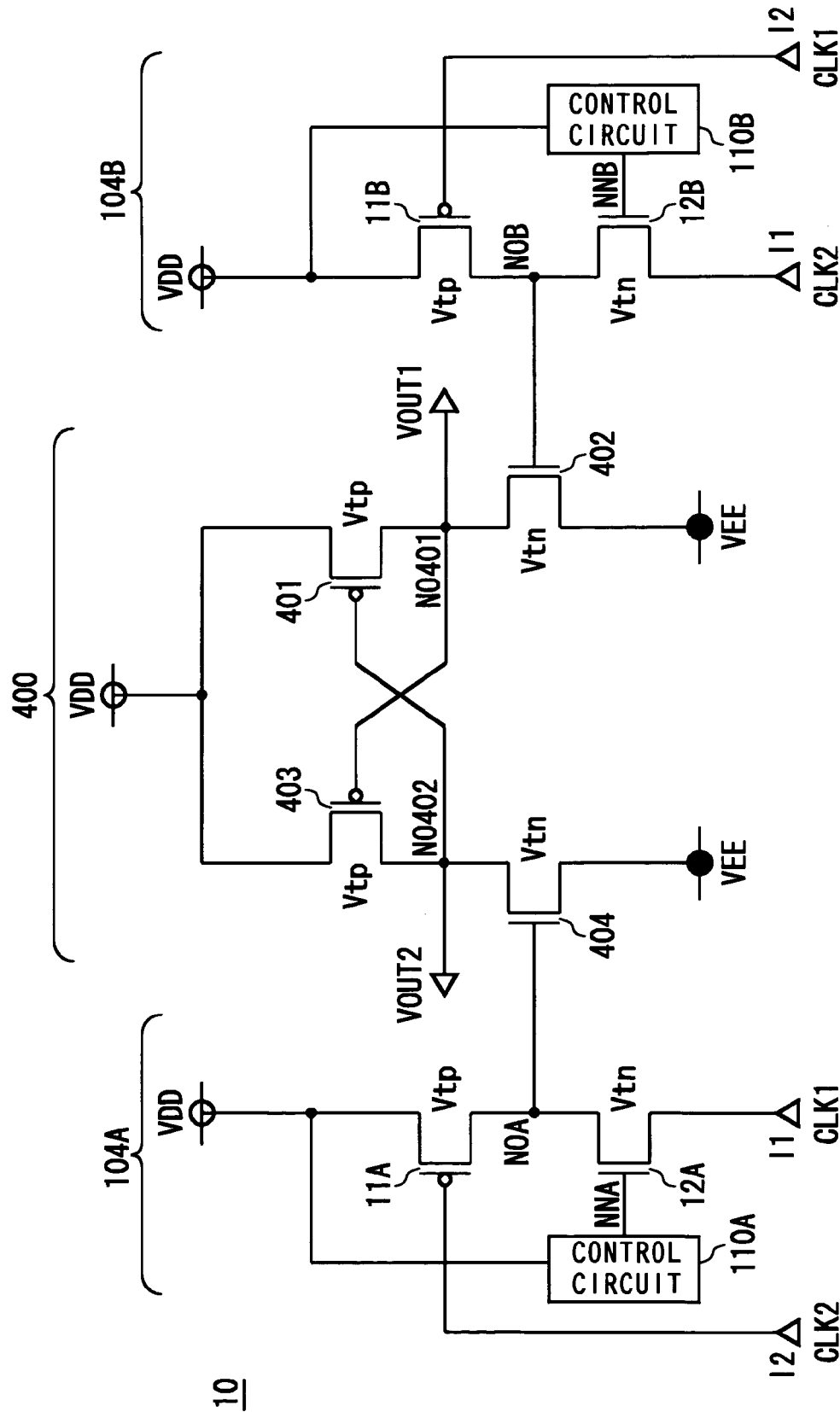
FIG. 39 is a circuit diagram showing the structure of a level conversion circuit according to an embodiment 10 of the present invention.

FIG. 39 is a circuit diagram showing the structure of a level conversion circuit according to a tenth embodiment of the present invention. A level conversion circuit 10 differs from the level conversion circuit 9 shown in FIG. 38 in the point that it comprises a level conversion unit 104A which is provided with a control circuit 100A and a level conversion unit 104B which is provided with a control circuit 100B instead of the level conversion units 101A and 101B.

The structure of the level conversion units 104A and 104B is similar to that of the level conversion unit 104 according to the fourth embodiment. However, input signals CLK1 and CLK2 are inputted respectively to input nodes I1 and I2 of the level conversion unit 104A and the input signals CLK2 and CLK1 are respectively inputted to input nodes I1 and I2 of the level conversion unit 104B.

Output voltage VOUT1 and output voltage VOUT2 which change complementarily are outputted from the output nodes NO401 and NO402 of a differential amplifying circuit 400 in the level conversion circuit 10 according to this embodiment. The output voltage VOUT1 and the output voltage VOUT2 change between supply voltage VDD and prescribed voltage VEE. The circuits shown in FIG. 24, FIG. 25 and FIG. 26 can be considered as examples of the control circuits 110A and 110B of this embodiment.

In the ninth and tenth embodiments, the level conversion units 101 and 104 are utilized as the level conversion units, however the level conversion unit 105 according to the fifth embodiment or the level conversion unit 106 according to the sixth embodiment may also be utilized. The level conversion unit 207 according to the seventh embodiment or the level conversion unit 308 according to the eighth embodiment may also be utilized. In this case, it is sufficient if the output nodes NO1 and NO2 of the level conversion units are connected to the gates of the n-channel MOSFET 402 and 404 of the differential amplifying circuits.

Embodiment 11

Figure 40:
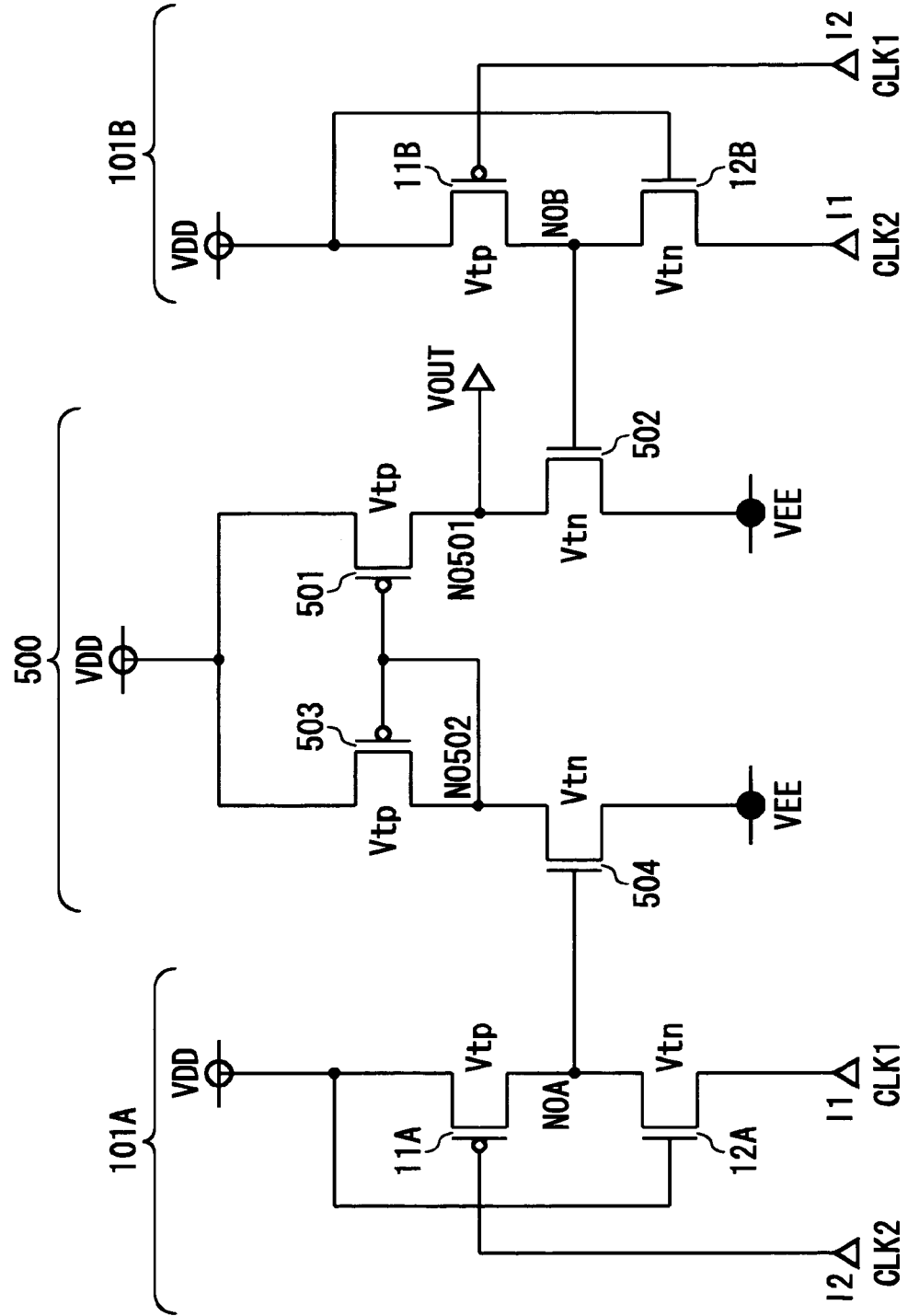
FIG. 40 is a circuit diagram showing the structure of a level conversion circuit according to an embodiment 11 of the present invention.

FIG. 40 is a circuit diagram showing the structure of a level conversion circuit according to an eleventh embodiment of the present invention. A level conversion circuit 11 differs from the level conversion circuit 9 in the point that it comprises an amplifying circuit 500 of a current mirror type instead of the differential amplifying circuit 400 of the PMOS cross couple type.

The amplifying circuit 500 of the current mirror type comprises p-channel MOSFETs 501 and 503 and n-channel MOSFETs 502 and 504. The sources of the p-channel MOSFETs 501 and 503 are connected to a supply terminal which receives supply voltage VDD, the drains are respectively connected to output nodes NO501 and NO502, and the gates are connected to the output node NO502. Prescribed voltage VEE is given to the sources of the n-channel MOSFETs 502 and 504, the drains are respectively connected to the output nodes NO501 and NO502 and the gates are respectively connected to the output nodes NOB and NOA of the level conversion units 101B and 101A. The prescribed voltage VEE may be positive voltage which is lower than the supply voltage VDD, may be ground voltage or may be negative voltage. The clock signal CLK1 may be inputted to the right one of the VEEs shown in FIG. 40 and the clock signal CLK2 may be inputted to the left one of the VEEs shown in FIG. 40.

Output voltage VOUT is outputted from the output node NO501 of the amplifying circuit 500 of the current mirror type in the level conversion circuit 11 according to this embodiment. The output voltage VOUT changes between the supply voltage VDD and the prescribed voltage VEE.

Embodiment 12

Figure 41:
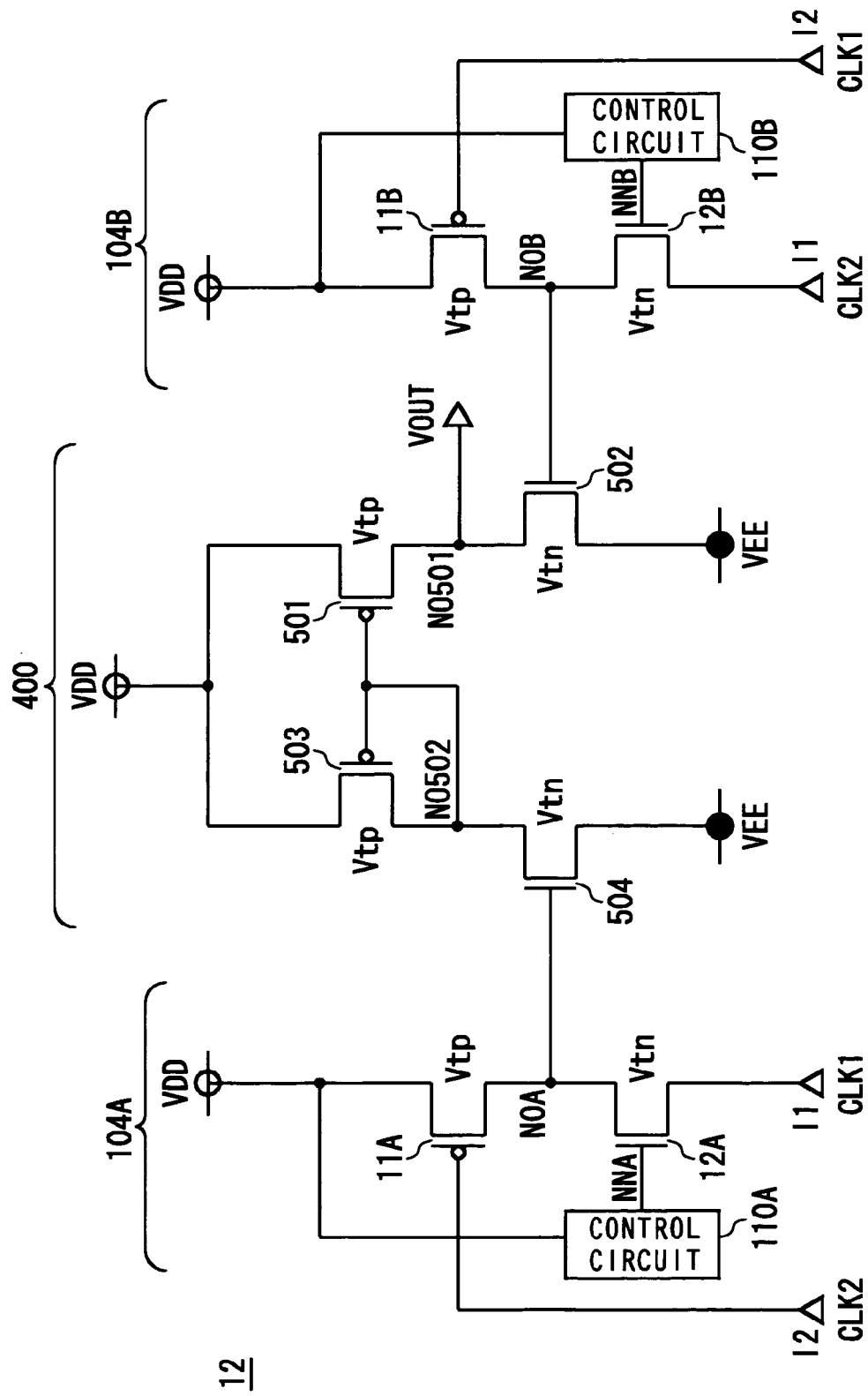
FIG. 41 is a circuit diagram showing the structure of a level conversion circuit according to an embodiment 12 of the present invention.

FIG. 41 is a circuit diagram showing the structure of a level conversion circuit according to a twelfth embodiment of the present invention. A level conversion circuit 12 differs from the level conversion circuit 11 shown in FIG. 40 in the point that it comprises a level conversion unit 104A which is provided with a control circuit 110A and a level conversion unit 104B which is provided with a control circuit 110B instead of the level conversion units 104A and 104B.

The structure of the level conversion units 104A and 104B is similar to that of the level conversion unit 104 according to the fourth embodiment. However, input signals CLK1 and CLK2 are respectively inputted to the input nodes I1 and I2 of the level conversion unit 104A and the input signals CLK2 and CLK1 are respectively inputted to the input nodes I1 and I2 of the level conversion unit 104B.

Output voltage VOUT is outputted from the output node NO501 of the amplifying circuit 500 of the current mirror type in the level conversion circuit 12 according to this embodiment. The output voltage VOUT changes between supply voltage VDD and prescribed voltage VEE. The circuits shown in FIG. 24, FIG. 25 and FIG. 26 can be considered as examples of the control circuits 110 of this embodiment.

It is to be noted that the level conversion unit 105 according to the fifth embodiment or the level conversion unit 106 according to the sixth embodiment may also be utilized instead of the level conversion units 101 and 104 according to the ninth and tenth embodiments. The level conversion unit 207 according to the seventh embodiment or the level conversion unit 308 according to the eighth embodiment may also be utilized, in this case it is sufficient if the output nodes NO1 and NO2 of the level conversion circuits are connected to the gates of the n-channel MOSFET 502 and 504 of the amplifying circuits.

Embodiment 13

Figure 42:
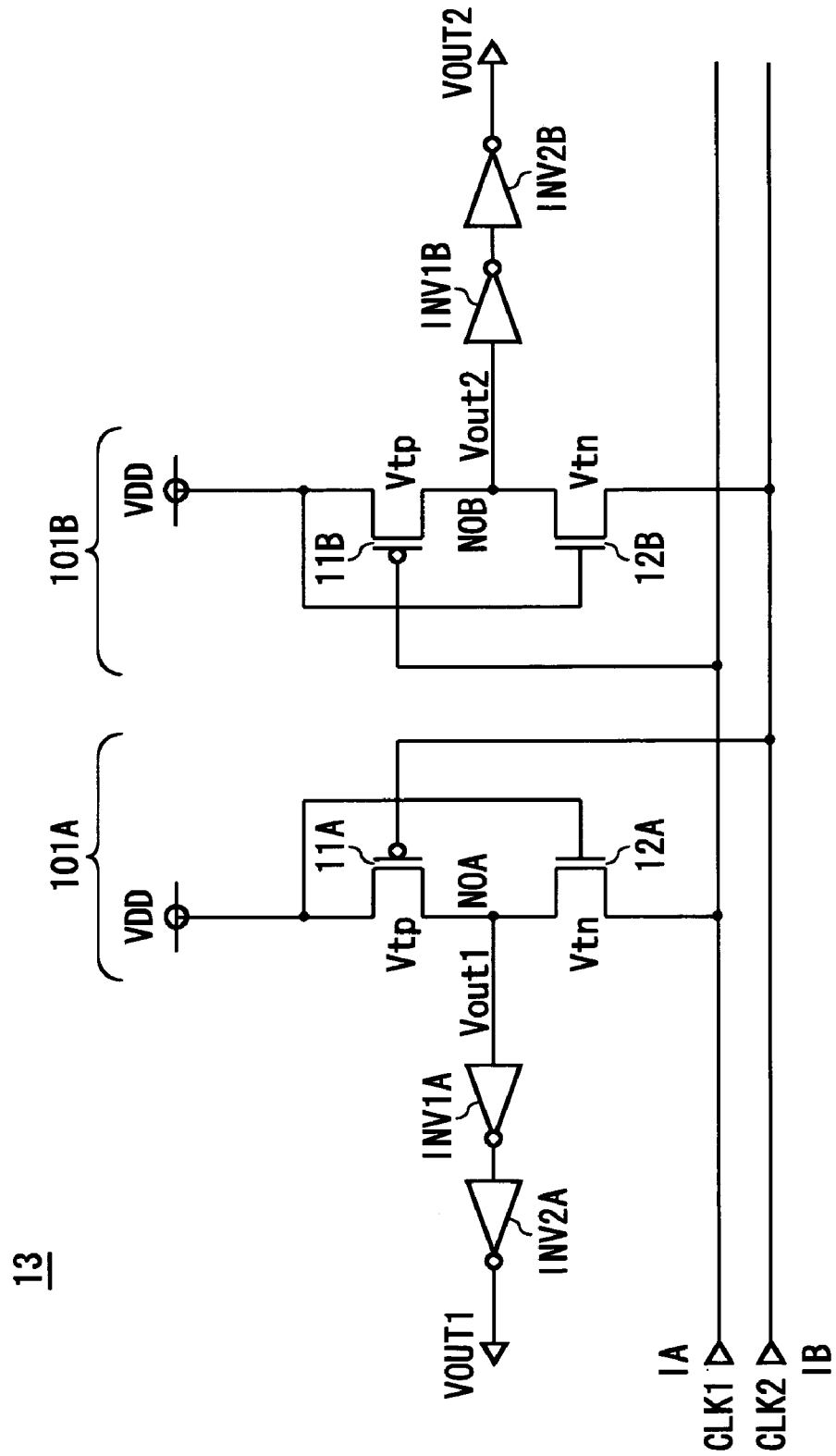
FIG. 42 is a circuit diagram showing the structure of a level conversion circuit according to an embodiment 13 of the present invention.

FIG. 42 is a circuit diagram showing the structure of a level conversion circuit according to a thirteenth embodiment of the present invention. A level conversion circuit 13 is a pair type level conversion circuit and it comprises level conversion units 101A and 101B and four inverters INV1A, INV2A, INV1B and INV2B The structure of the level conversion units 101A and 101B is similar to that of the level conversion unit 101 shown in FIG. 5. To an input node IA which receives an input signal CLK1 are connected the source of a n-channel MOSFET 12 of the level conversion unit 101A and the gate of a p-channel MOSFET 11 of the level conversion unit 101B. To an input node IB which receives an input signal CLK2 are connected the gate of a p-channel MOSFET 11 of the level conversion unit 101A and the source of a n-channel MOSFET 12 of the level conversion unit 101B.

Output signals VOUT1 and VOUT2 are outputted from the level conversion circuit 13 of this embodiment, which are converted from the input signals CLK1 and CLK2. The output voltage VOUT1 and the output voltage VOUT2 change between supply voltage VDD and ground voltage.

As the level conversion unit 101 of this embodiment may be utilized the level conversion unit 104 in the fourth embodiment, the level conversion unit 105 in the fifth embodiment and the level conversion unit 106 in the sixth embodiment.

Embodiment 14

Figure 43:
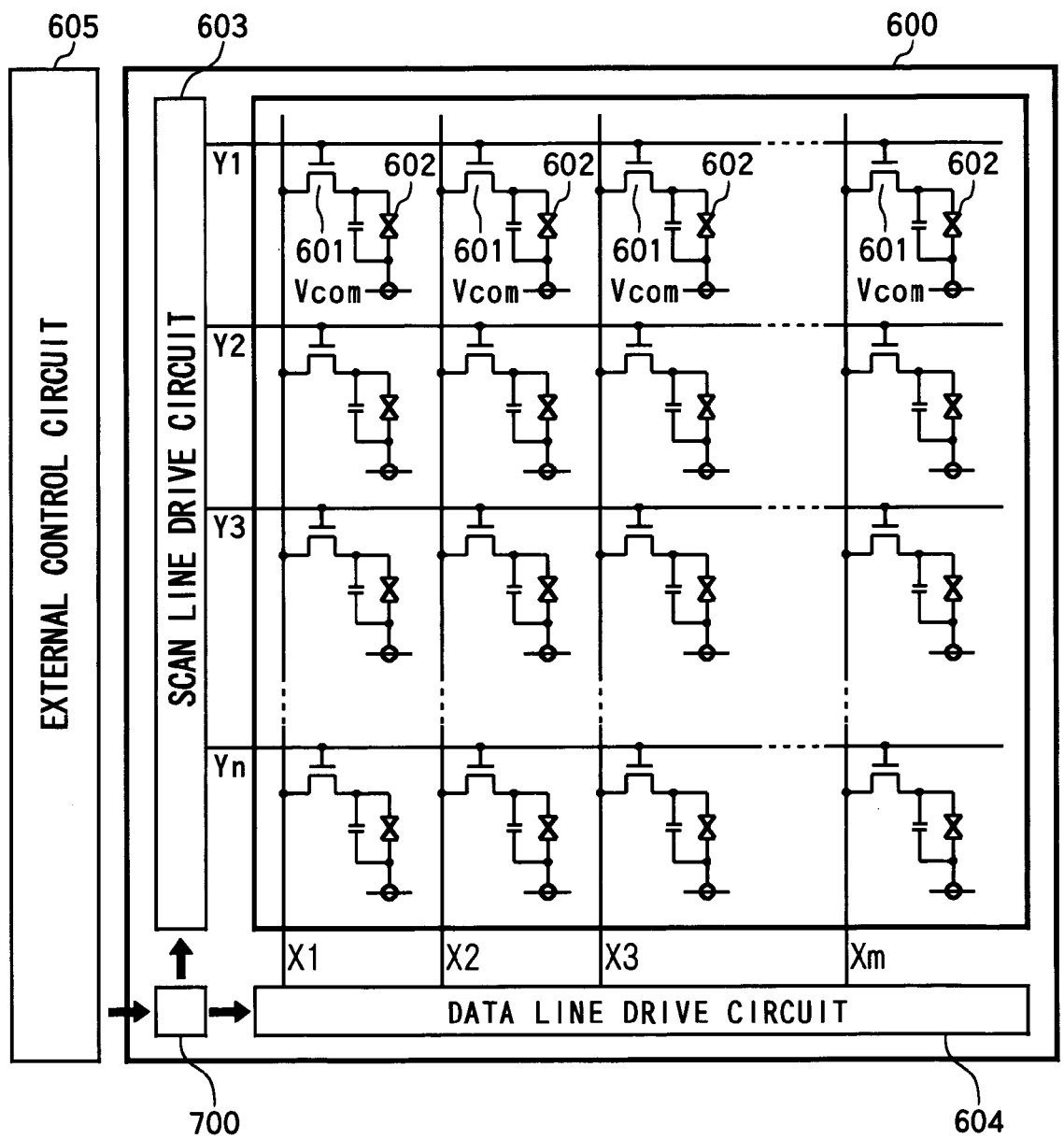
FIG. 43 is a block diagram showing an example of a liquid crystal display device utilizing the level conversion circuits according to the embodiments of the present invention.

FIG. 43 is a block diagram showing an example of a liquid crystal display device utilizing the level conversion circuits according to this invention. In this device, scan electrodes Y1, Y2 . . . Yn and data electrodes X1, X2 . . . Xm are provided on a glass substrate 600 in a manner that they will be crossing each other. The "n" and "m" utilized above are arbitrary integral numbers. A substrate made of plastic or the like may be utilized instead of the glass substrate 600. A liquid crystal element 602 is provided via a thin film transistor 601 at each part where the scan electrodes Y1 to Yn and the data electrodes X1 to Xm cross each other. The thin film transistor 601 is, for example, made of polycrystalline silicon which is acquired by crystallizing non-crystalline silicon with a laser annealing method or the like.

On the glass substrate 600 are provided a scan line drive circuit 603, a data line drive circuit 604 and a voltage conversion circuit 700. The scan electrodes Y1 to Yn are connected to the scan line drive circuit 603 and the data electrodes X1 to Xm are connected to the data line drive circuit 604. The voltage conversion circuit 700 converts two complementary basic clock signals with small amplitude, which are given from an external control circuit 605, to clock signals that have different voltage level from the basic clock signals. The converted signals are given to the scan line drive circuit 603 and the data line drive circuit 604.

Figure 44:
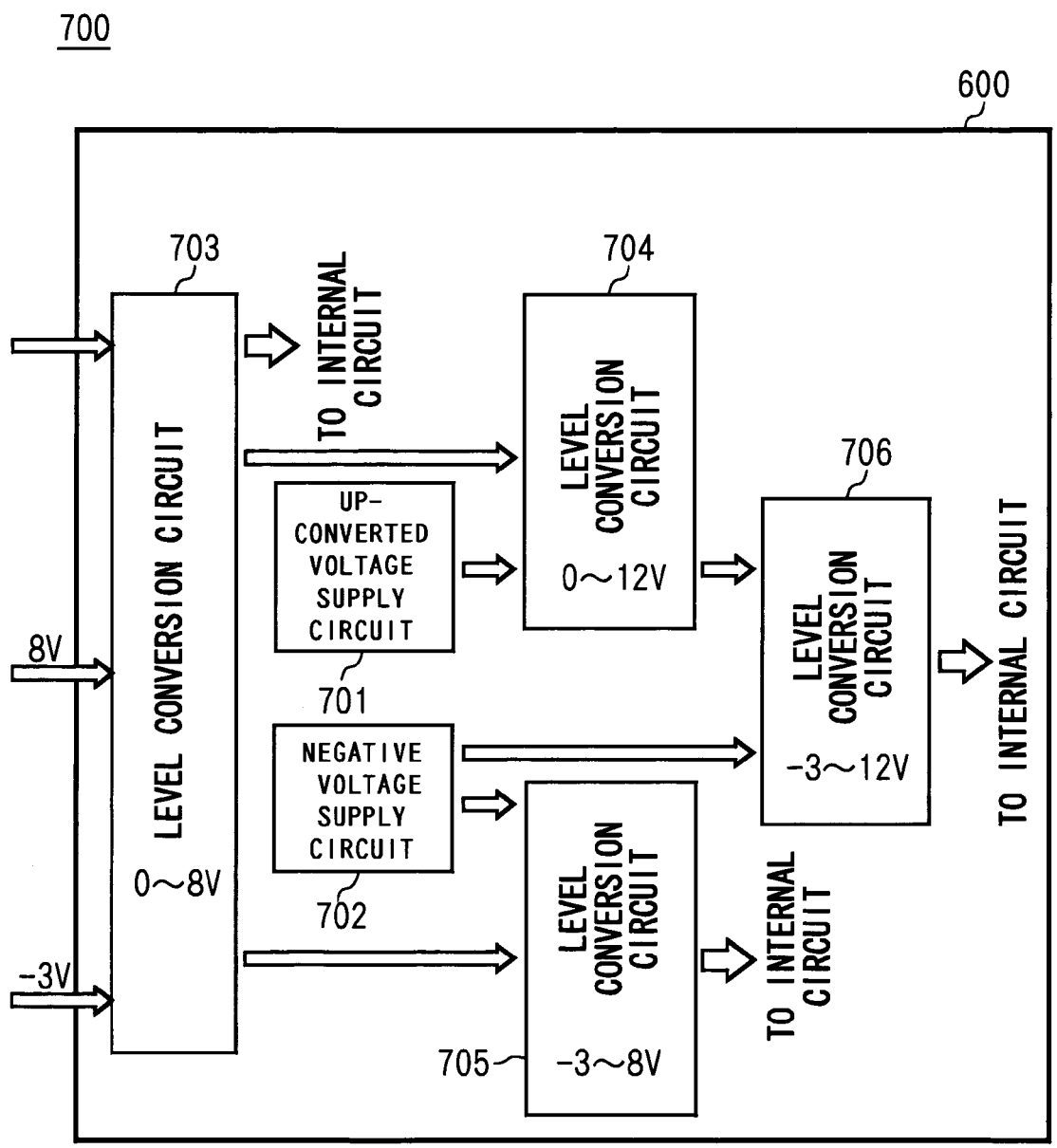
FIG. 44 is a block diagram showing the structure of a level conversion device utilized in the liquid crystal display device shown in FIG. 43.

FIG. 44 is a block diagram showing the structure of the voltage conversion circuit 700 which is utilized in the liquid crystal display device shown in FIG. 43. The voltage conversion circuit 700 is provided with an up-converted voltage supply circuit 701, a negative voltage supply circuit 702 and from first to fourth level conversion circuits 703, 704, 705 and 706 on the glass substrate 600. External supply voltages at 8V and 3V are given to the first level conversion circuit 703. Internal circuits are the scan line drive circuit 603 and the data line drive circuit 604 in FIG. 43 and it is assumed that signals are inputted to the internal circuits at the voltage ranges of 0 to 8V, 0 to 12V, −3 to 8V or −3 to 12V.

The first level conversion circuit 703 converts the basic clock signals inputted by the external control circuit 605 shown in FIG. 43 to signals which change within the range of 0 to 8V and then inputs the converted signals to the internal circuits and to the level conversion circuits 704, 705 and 706. The second level conversion circuit 704 converts the signals inputted by the first level conversion circuit 703 to signals which change within the range of 0 to 12V utilizing the supply voltage from the up-converted voltage supply circuit 701 and then inputs the converted signals to the internal circuits and the fourth level conversion circuit 706. The third level conversion circuit 705 converts the signals inputted by the first level conversion circuit 703 to signals which change within the range of −3 to 8V based on the negative supply voltage from the negative voltage supply circuit 702 and then inputs the converted signals to the internal circuits. The fourth level conversion circuit 706 converts the signals inputted by the second level conversion circuit 704 to signals which change within the range of −3 to 12V based on the negative supply voltage from the negative voltage supply circuit 702 and then inputs the converted signals to the internal circuits.

The circuits utilized as the from first to fourth level conversion circuits 703, 704, 705 and 706 are chosen from the level conversion circuits 1 to 13 according to the embodiments 1 to 13. The liquid crystal display device shown in FIG. 43 can, therefore, accurately operate even when the threshold voltages of the p-channel MOSFETs and n-channel MOSFETs have shifted from designed values due to irregularity caused in manufacturing process. Due to the level conversion circuits 1 to 13, the display device can also operate at a high speed with high-definition consuming less electric power and also the area occupied by the device can be diminished.

Embodiment 15

Figure 45:
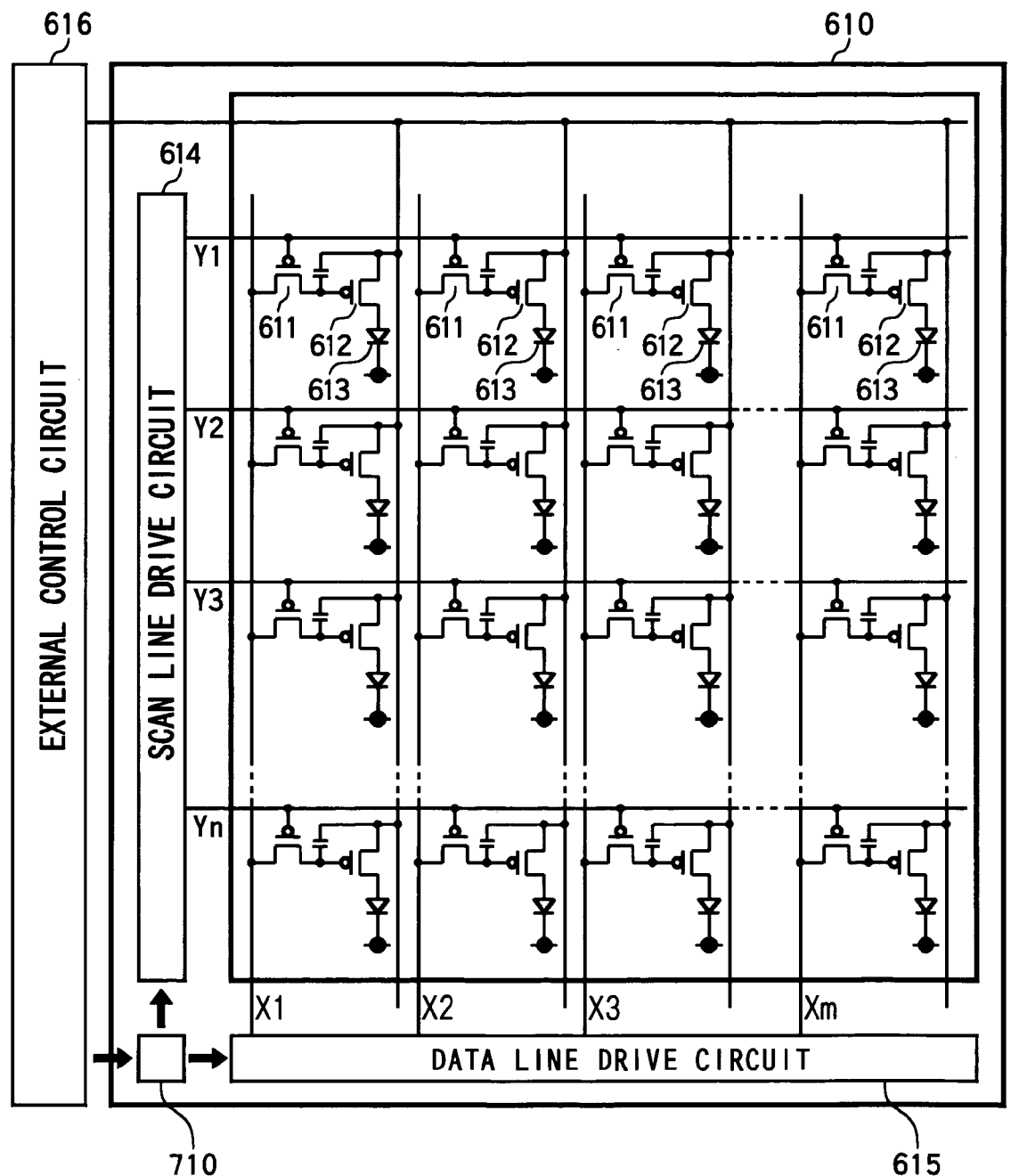
FIG. 45 is a block diagram showing an example of an organic electro luminescence device utilizing the level conversion circuits according to the embodiments of the present invention.

FIG. 45 is a block diagram showing an example of an organic electro luminescence device utilizing the level conversion circuits according to this invention. In this device, scan electrodes Y1, Y2 . . . Yn and data electrodes X1, X2 . . . Xm are provided on a glass substrate 610 in a manner that they will be crossing each other. A substrate made of plastic or the like may be utilized instead of the glass substrate 610.

An organic electro luminescence element 613 is provided via thin film transistors 611 and 612 at each part where the scan electrodes Y1 to Yn and data electrodes X1 to Xm cross each other. The thin film transistors 611 and 612 are, for example, made of polycrystalline silicon which is acquired by crystallizing non-crystalline silicon with a laser annealing method or the like.

On the glass substrate 610 are provided a scan line drive circuit 614, a data line drive circuit 615 and a voltage conversion circuit 710. The scan electrodes Y1 to Yn are connected to the scan line drive circuit 614 and the data electrodes X1 to Xm are connected to the data line drive circuit 615. The voltage conversion circuit 710 converts two complementary basic clock signals with small amplitude, which are given from an external control circuit 616, to clock signals that have different voltage level from the basic clock signals. The converted signals are given to the scan line drive circuit 614 and the data line drive circuit 615. The structure of the voltage conversion circuit 710 is similar to that of the voltage conversion circuit 700 shown in FIG. 44.

The circuits utilized in the voltage conversion circuit 710 are chosen from the level conversion circuits 1 to 13 according to the embodiments 1 to 13. The organic electro luminescence device shown in FIG. 45 can, therefore, accurately operate even when the threshold voltages of the p-channel MOSFETs and n-channel MOSFETs have shifted from designed values due to irregularity caused in manufacturing process. Due to the level conversion circuits 1 to 13, the device can also operate at a high speed with high-definition consuming less electric power and also the area occupied by the device can be diminished.

Embodiment 16

Figure 46:
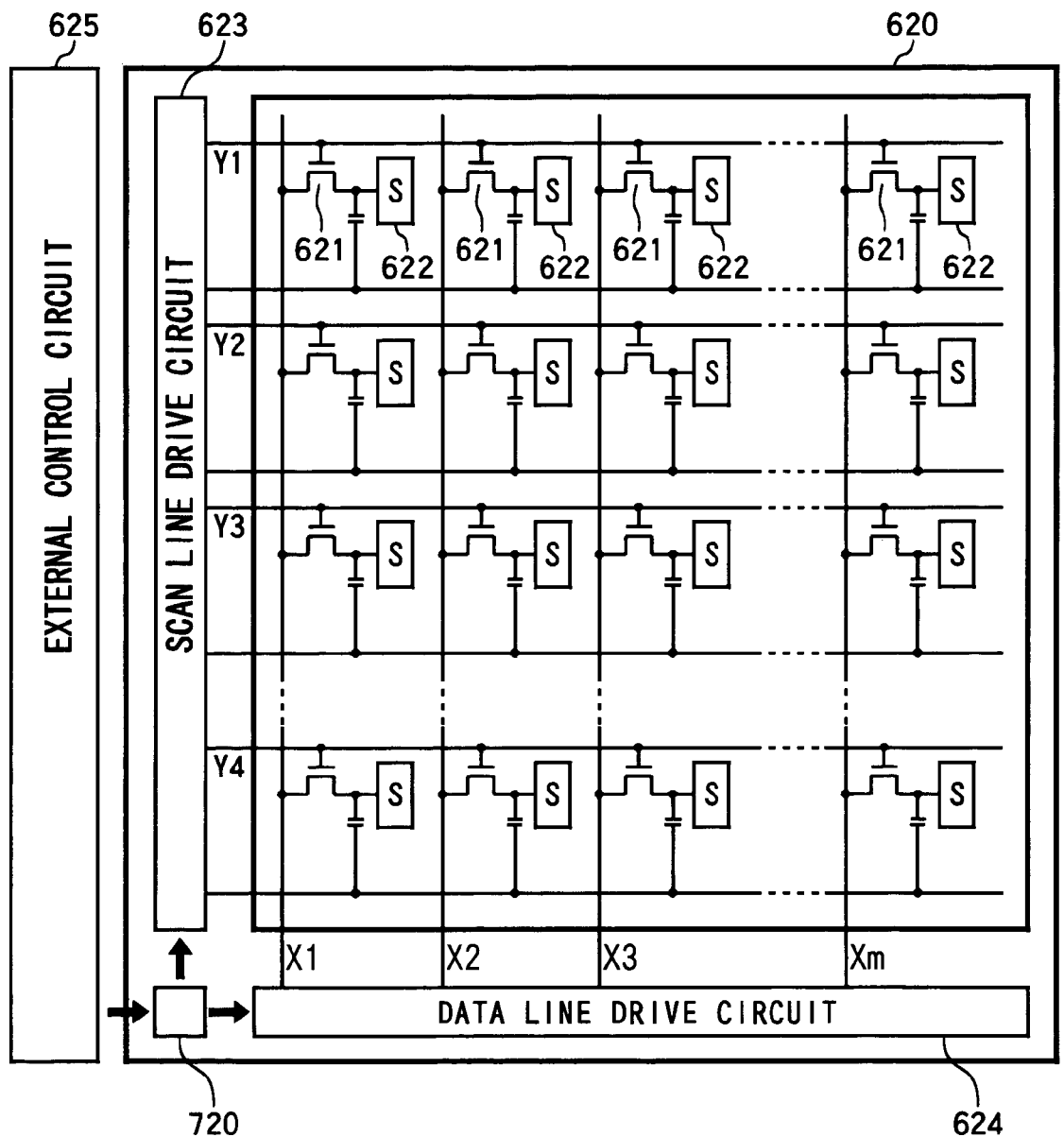
FIG. 46 is a block diagram showing an example of a sensor device utilizing the level conversion circuits according to the embodiments of the present invention.

FIG. 46 is block diagram showing an example of a sensor device utilizing the level conversion circuits according to this invention. In this device, scan electrodes Y1, Y2 . . . Yn and data electrodes X1, X2 . . . Xm are provided on a glass substrate 620 in a manner that they will be crossing each other. A substrate made of plastic or the like may be utilized instead of the glass substrate 620. A sensor 622 is provided via a thin film transistor 621 at each part where the scan electrodes Y1 to Yn and data electrodes X1 to Xm cross each other. The thin film transistor 621 is, for example, made of polycrystalline silicon which is acquired by crystallizing non-crystalline silicon with a laser annealing method or the like. A photodetector element can be utilized, for example, as the sensor 622. In this case, an image sensor is structured. A pressure sensor may also be utilized as the sensor 622, which detects the difference of pressure from resistance or capacitance. In this case, a surface roughness sensor or a pattern detecting sensor can be structured. The former can detect the surface roughness of objects and the latter can detect patterns such as fingerprints or the like.

On the glass substrate 620 are provided a scan line drive circuit 623, a data line drive circuit 624 and a voltage conversion circuit 720. The scan electrodes Y1 to Yn are connected to the scan line drive circuit 623 and the data electrodes X1 to Xm are connected to the data line drive circuit 624. The voltage conversion circuit 720 converts two complementary basic clock signals with small amplitude, which are given from an external control circuit 625, to clock signals that have different voltage level from the basic clock signals. The converted signals are given to the scan line drive circuit 623 and the data line drive circuit 624. The structure of the voltage conversion circuit 720 is similar to that of the voltage conversion circuit 700 shown in FIG. 44.

The circuits utilized in the voltage conversion circuit 720 are chosen from the level conversion circuits 1 to 13 according to the embodiments 1 to 13. The sensor device shown in FIG. 46 can, therefore, accurately operate even when the threshold voltages of the p-channel MOSFETs and n-channel MOSFETs have shifted from designed values due to irregularity caused in manufacturing process. Due to the level conversion circuits 1 to 13, the sensor device can also operate at a high speed with high-definition consuming less electric power and also the area occupied by the sensor device can be diminished.

The present invention has been described based on preferred embodiments. It should be understood by those skilled in the art that these embodiments are only exemplary and various modifications to each component, process and combination thereof are possible and that those modifications are effective as embodiments and are encompassed by the scope of the present invention.

What is claimed is:

1. A level conversion circuit comprising:
   a first transistor of a first conductive type which is connected between a supply node to which supply voltage is impressed and an output node; and
   a second transistor of a second conductive type which is connected between an input node to which an input signal is inputted and the output node;
   wherein a control electrode of the second transistor is connected to the supply node and a control electrode of the first transistor is connected to an output of a prescribed circuit to which the input signal is inputted,
   wherein an output signal is obtained from the output node,
   wherein the single supply voltage is set for the first and second transistors or the different supply voltages are separately set for the first and second transistors,
   wherein the supply voltage which corresponds to the first transistor is set to a value higher than high level of the input signal and the supply voltage which corresponds to the second transistor is set to a higher value than high level of the input signal,
   wherein degree of ON status of the first and second transistors is controlled according to difference between the supply voltages and voltage of the input signal, and
   wherein the input signal is converted to the output signal corresponding to the supply voltage.

2. A level conversion circuit according to claim 1, wherein the supply voltage is set to the higher value than the high level of the input signal,
   wherein the degree of the ON status of the first transistor is controlled according to the difference between the supply voltage and the voltage of the input signal, and
   wherein the input signal is converted to the output signal corresponding to the supply voltage.

3. A level conversion circuit according to claim 1 wherein the supply voltage is set to the higher value than the high level of the input signal,
   wherein the degree of the ON status of the second transistor is controlled according to the difference between the supply voltage and the voltage of the second input signal, and
   wherein the input signal is converted to the output signal corresponding to the supply voltage which acts on the first transistor.

4. A level conversion circuit according to claim 1 wherein the prescribed circuit is an inverter circuit.

5. A level conversion circuit according to claim 1 wherein the output signal is adjusted to have target voltage Vm=(VG+VDD)/2 as center of amplitude thereof when the ground voltage and the supply voltage are respectively described as VG and VDD.

6. A level conversion circuit according to claim 5 characterized in that it further comprises a buffer circuit which has the target voltage Vm as a central point of operation, and amplitude of output of which covers from voltage close to the ground voltage to voltage close to the supply voltage, wherein a modified output signal is obtained by passing the output signal through the buffer circuit.

7. A level conversion circuit according to claim 1 wherein the transistors are made of polycrystalline silicon.

* * * * *